(12) United States Patent
Park et al.

(10) Patent No.: US 7,709,304 B2
(45) Date of Patent: May 4, 2010

(54) THIN FILM TRANSISTOR ARRAY PANEL, MANUFACTURING METHOD THEREOF, AND MASK THEREFOR

(75) Inventors: Woon-Yong Park, Suwon (KR); Won-Hee Lee, Seoul (KR); Il-Gon Kim, Suwon (KR); Seung-Taek Lim, Seoul (KR); You-Lee Song, Yongin (KR); Sahng-Ik Jun, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/824,879

(22) Filed: Jul. 2, 2007

(65) Prior Publication Data

US 2007/0259289 A1 Nov. 8, 2007

Related U.S. Application Data

(62) Division of application No. 10/771,278, filed on Feb. 2, 2004, now abandoned.

(30) Foreign Application Priority Data

Feb. 3, 2003 (KR) .......................... 2003-0006588
Feb. 6, 2003 (KR) .......................... 2003-0007411

(51) Int. Cl.
  *H01L 21/00* (2006.01)
(52) U.S. Cl. .................. 438/149; 438/128; 438/151; 257/72
(58) Field of Classification Search ................. 438/149, 438/151, 128; 257/72
See application file for complete search history.

(56) References Cited

U.S. PATENT DOCUMENTS

| 5,116,461 | A | 5/1992 | Lebby et al. |
| 5,976,741 | A | 11/1999 | Ziger et al. |
| 6,087,678 | A | 7/2000 | Kim |
| 6,580,474 | B1 * | 6/2003 | Ahn et al. .................... 349/43 |

FOREIGN PATENT DOCUMENTS

| JP | 2000-267257 | 9/2000 |
| KR | 10-2001-0009267 | 2/2001 |
| KR | 10-2001-0045360 | 6/2001 |
| KR | 10-2002-0080559 | 10/2002 |
| KR | 10-2002-0089625 | 11/2002 |

* cited by examiner

*Primary Examiner*—Leonardo Andújar
(74) *Attorney, Agent, or Firm*—Innovation Counsel LLP

(57) ABSTRACT

A passivation layer is deposited and a photoresist is formed. The photoresist includes first to third portions with decreased thickness, the second portions located on portions of drain electrodes and data lines and the third portions located on portions of gate lines. A mask for forming the photoresist has rectilinear slits with width and distance of about 0.8-2.0 microns on an area corresponding to the second portions. The passivation layer and an underlying semiconductor layer as well as the photoresist are etched to expose portions of the gate insulating layer under the third portions of the photoresist as well as portions of the passivation layer under the second portions of the photoresist. The exposed portions of the passivation layer and the gate insulating layer are removed to expose the drain electrodes, the gate lines and the data lines as well as portions of the semiconductor layer, which are subsequently removed.

17 Claims, 54 Drawing Sheets

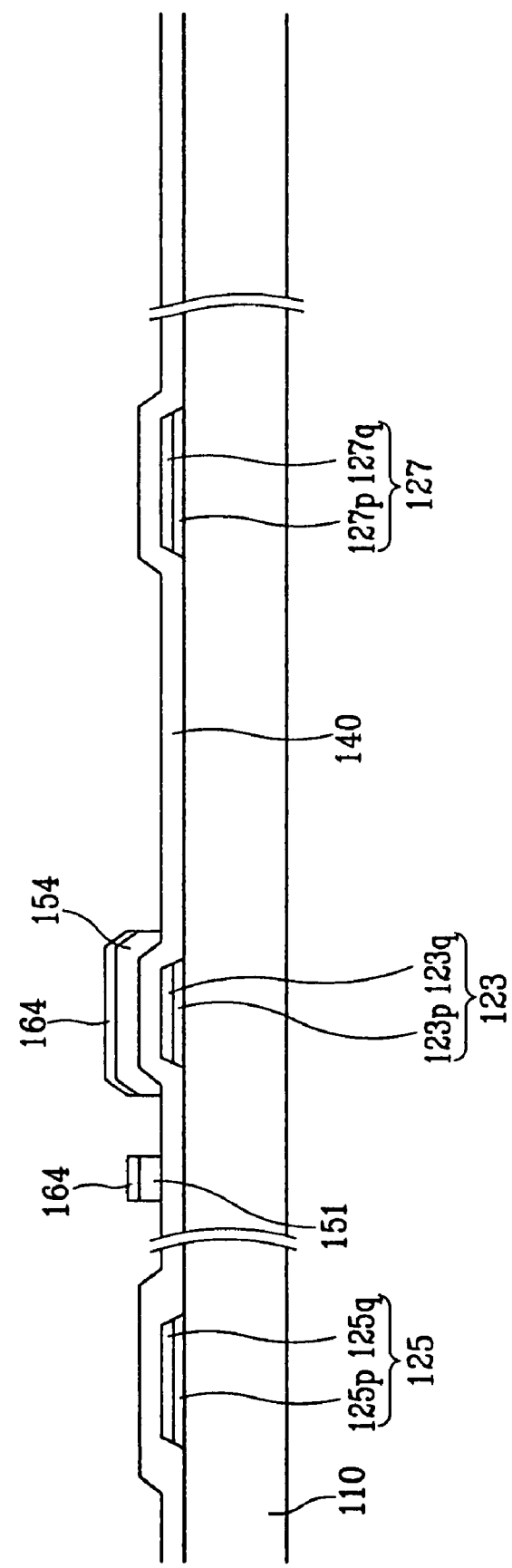

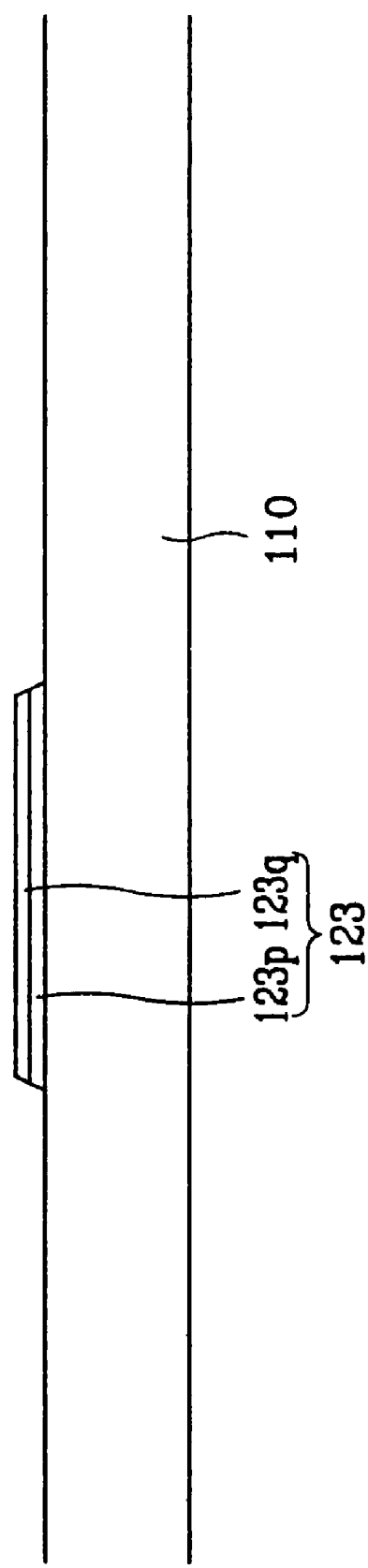

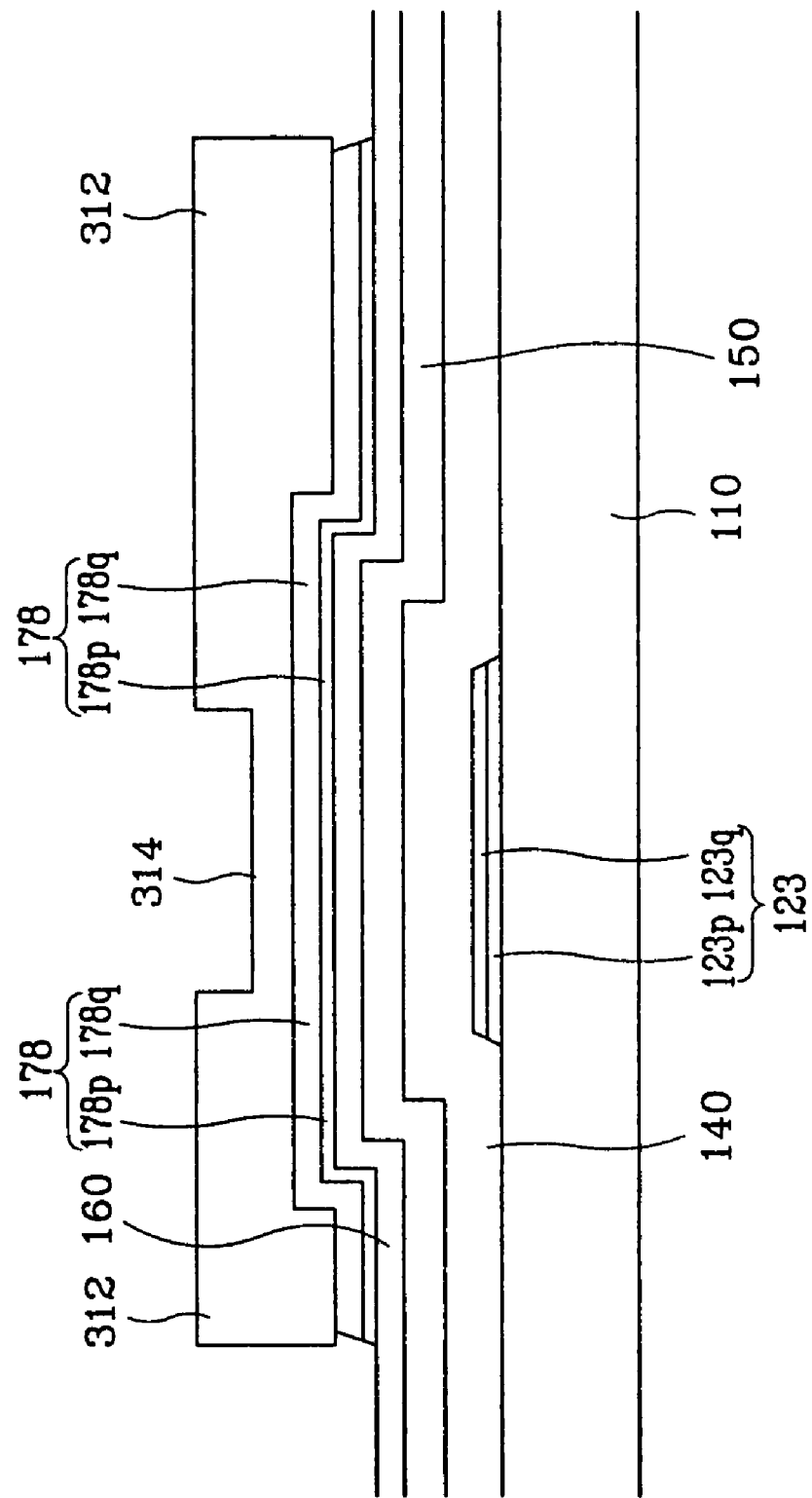

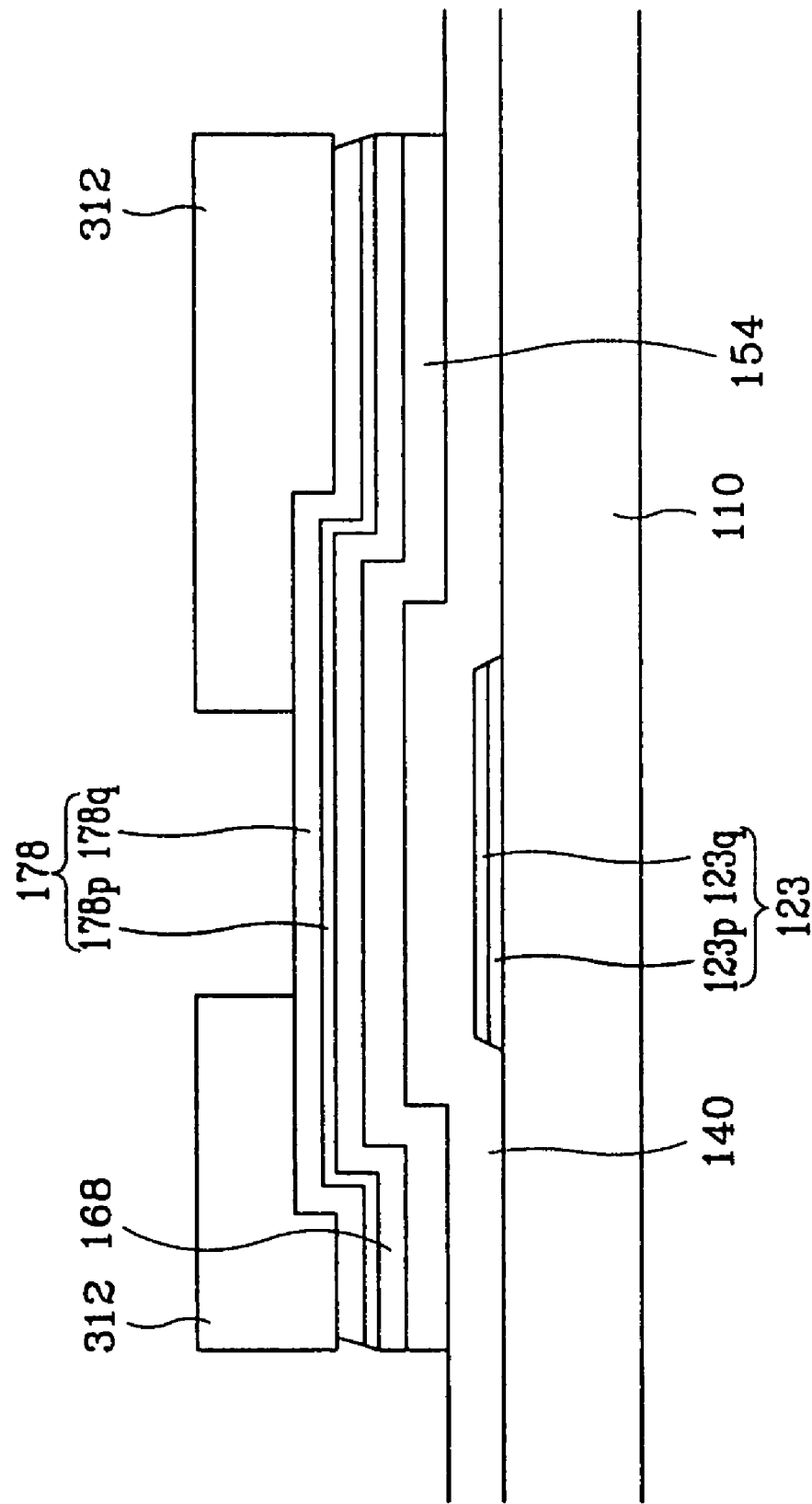

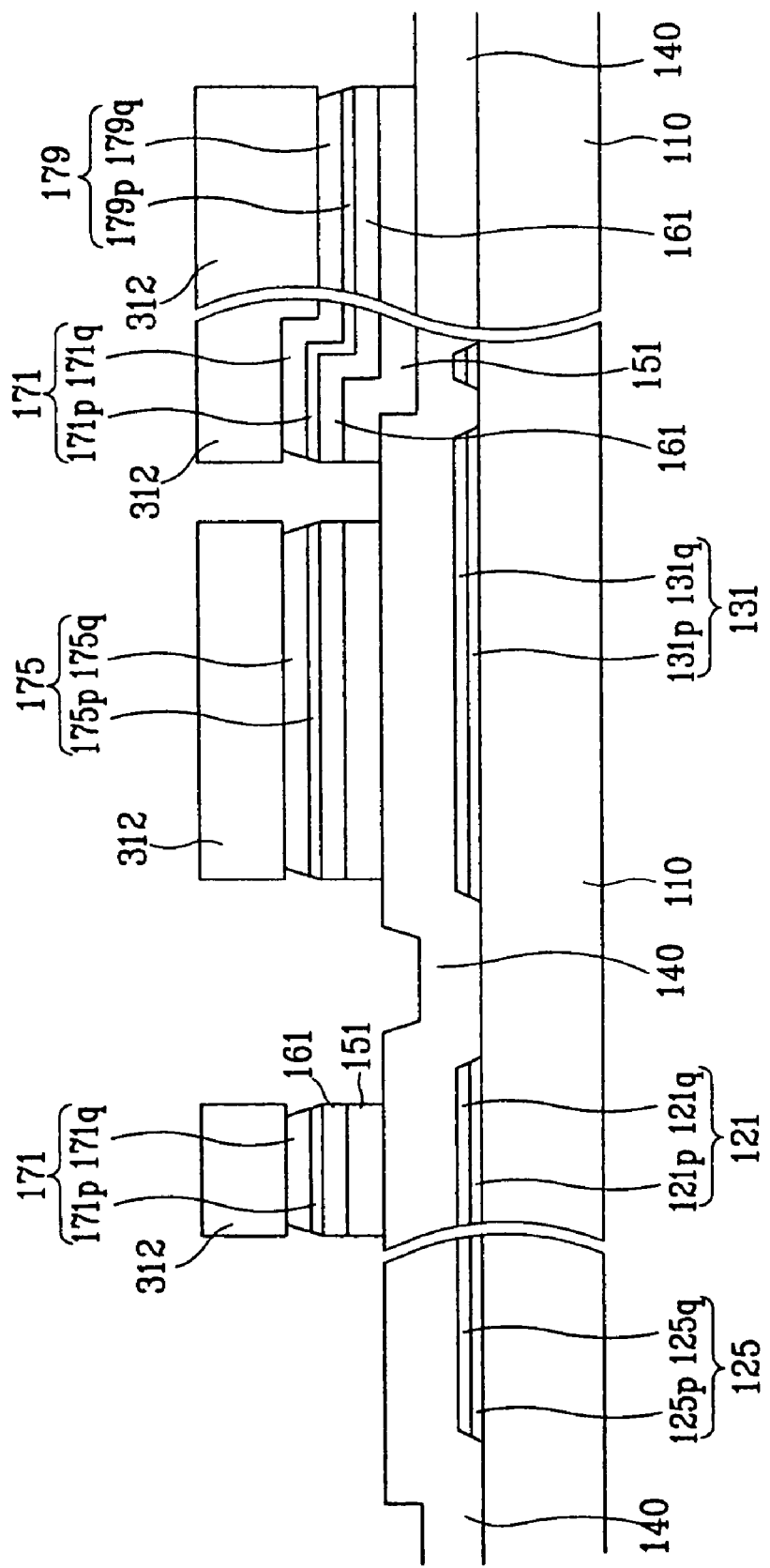

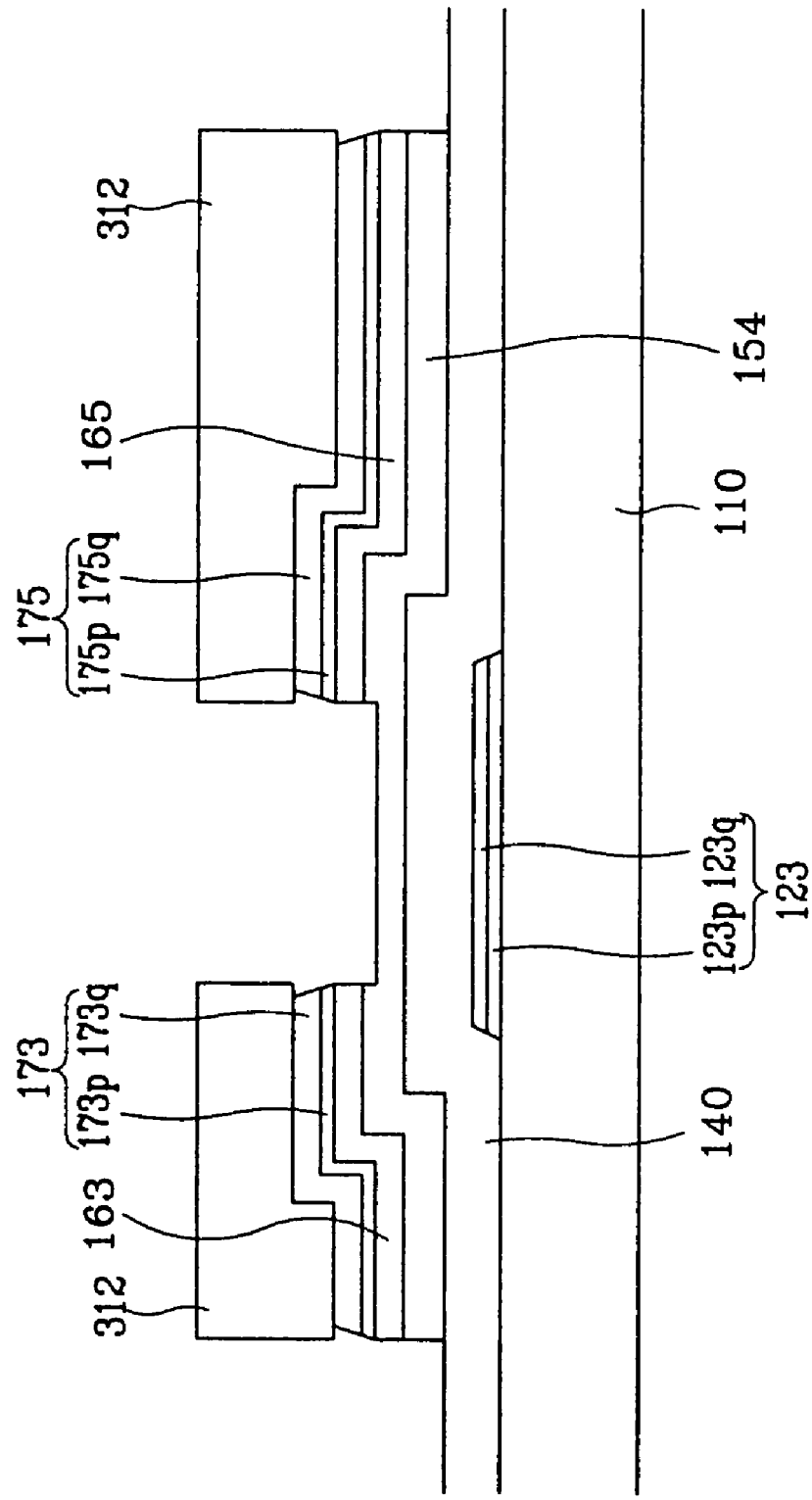

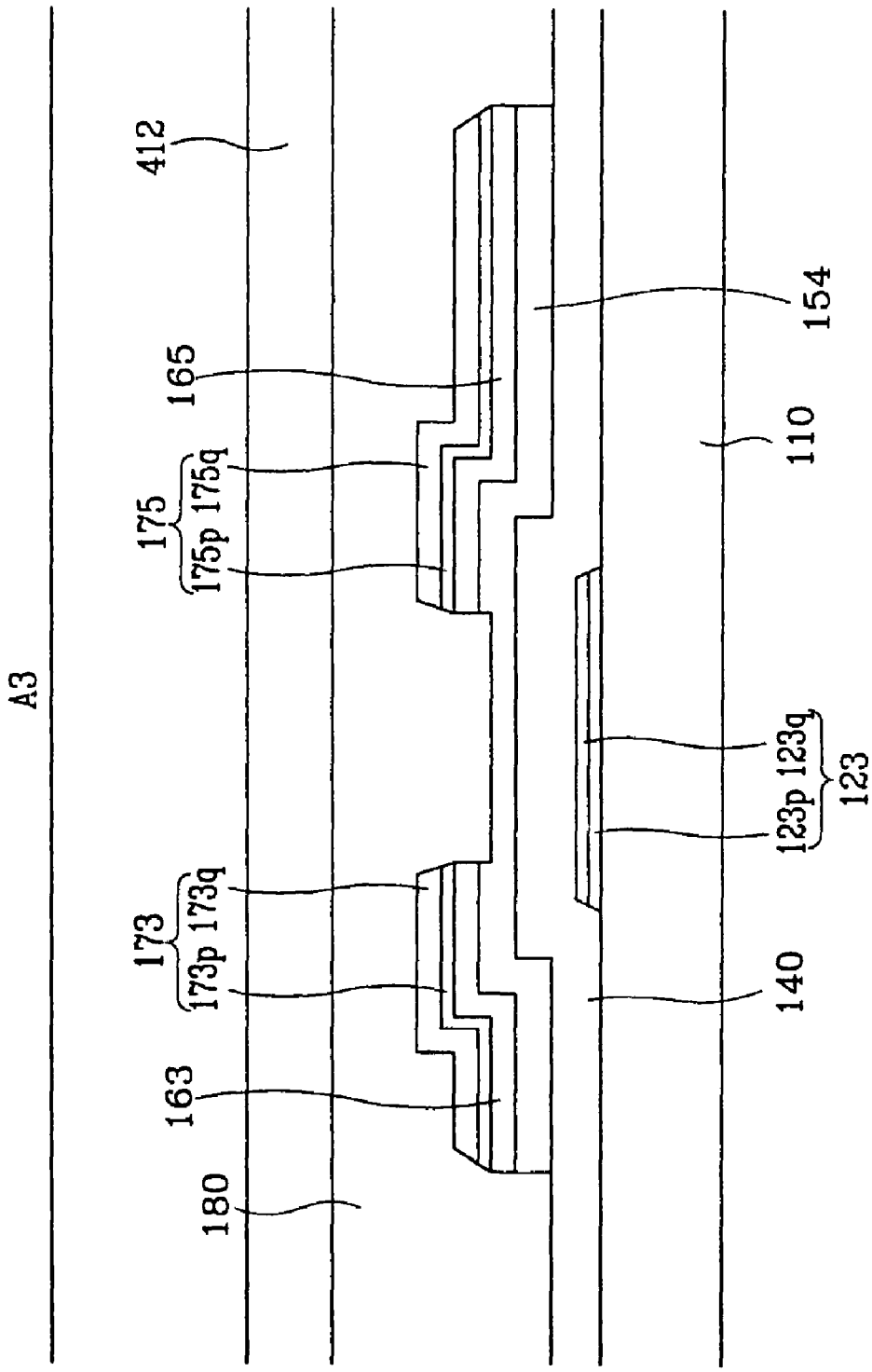

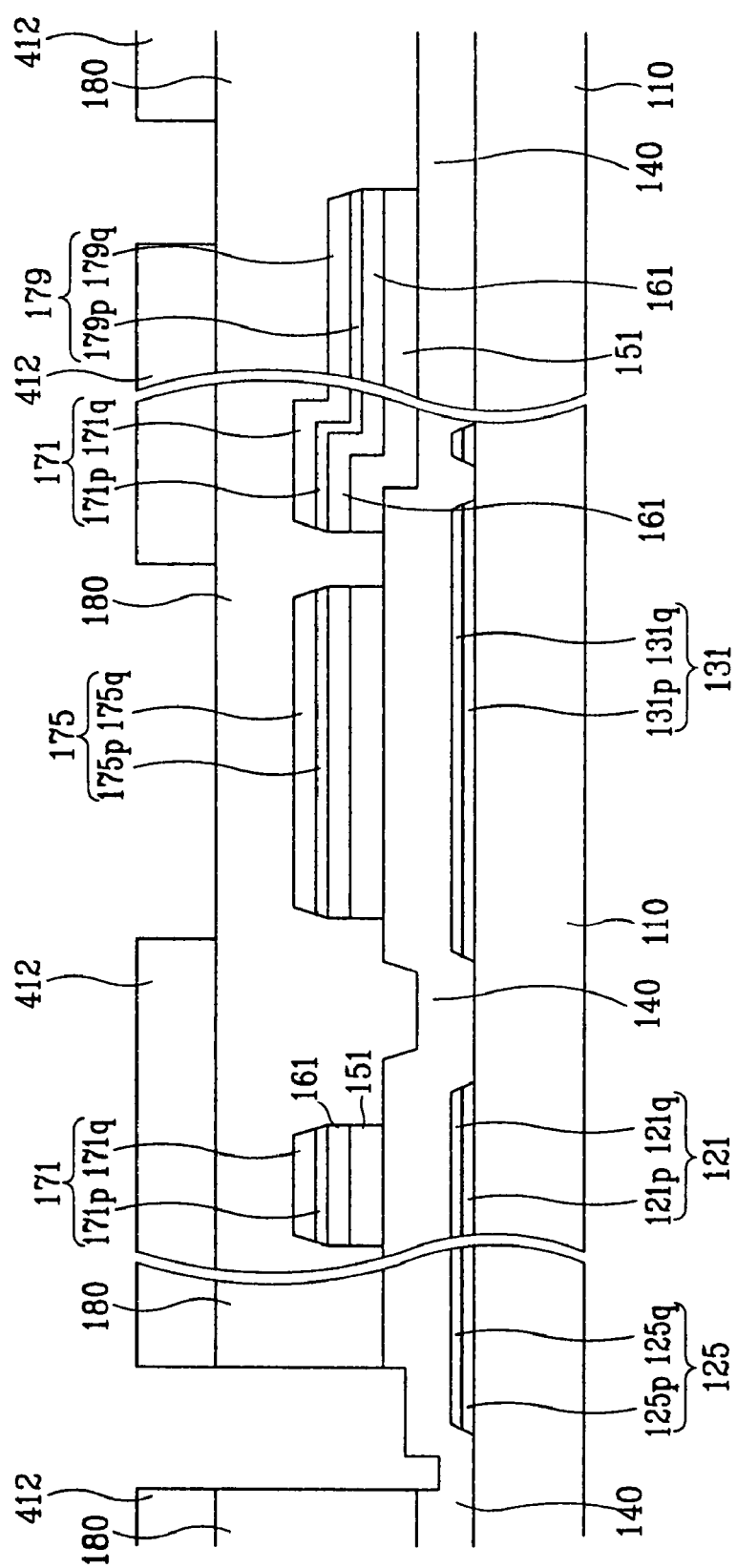

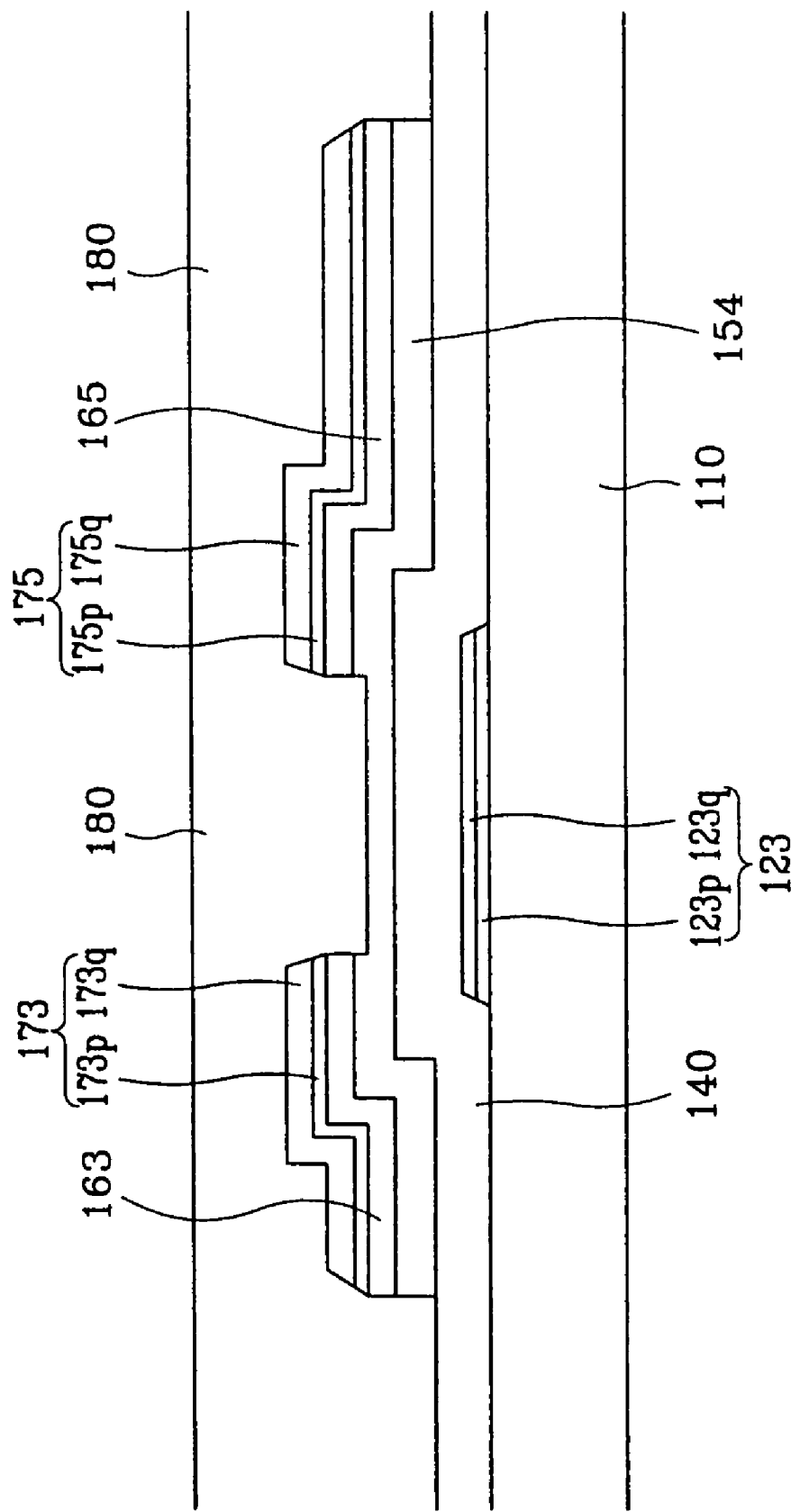

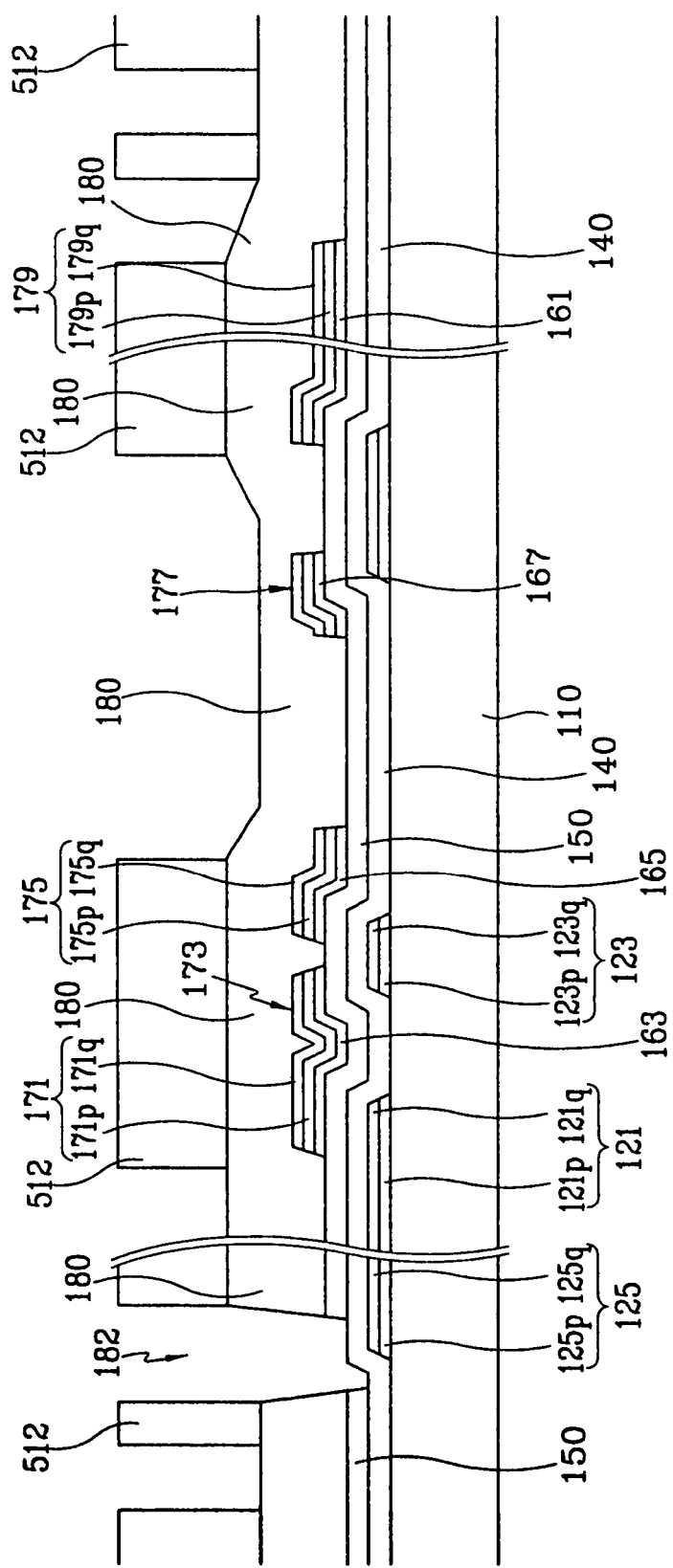

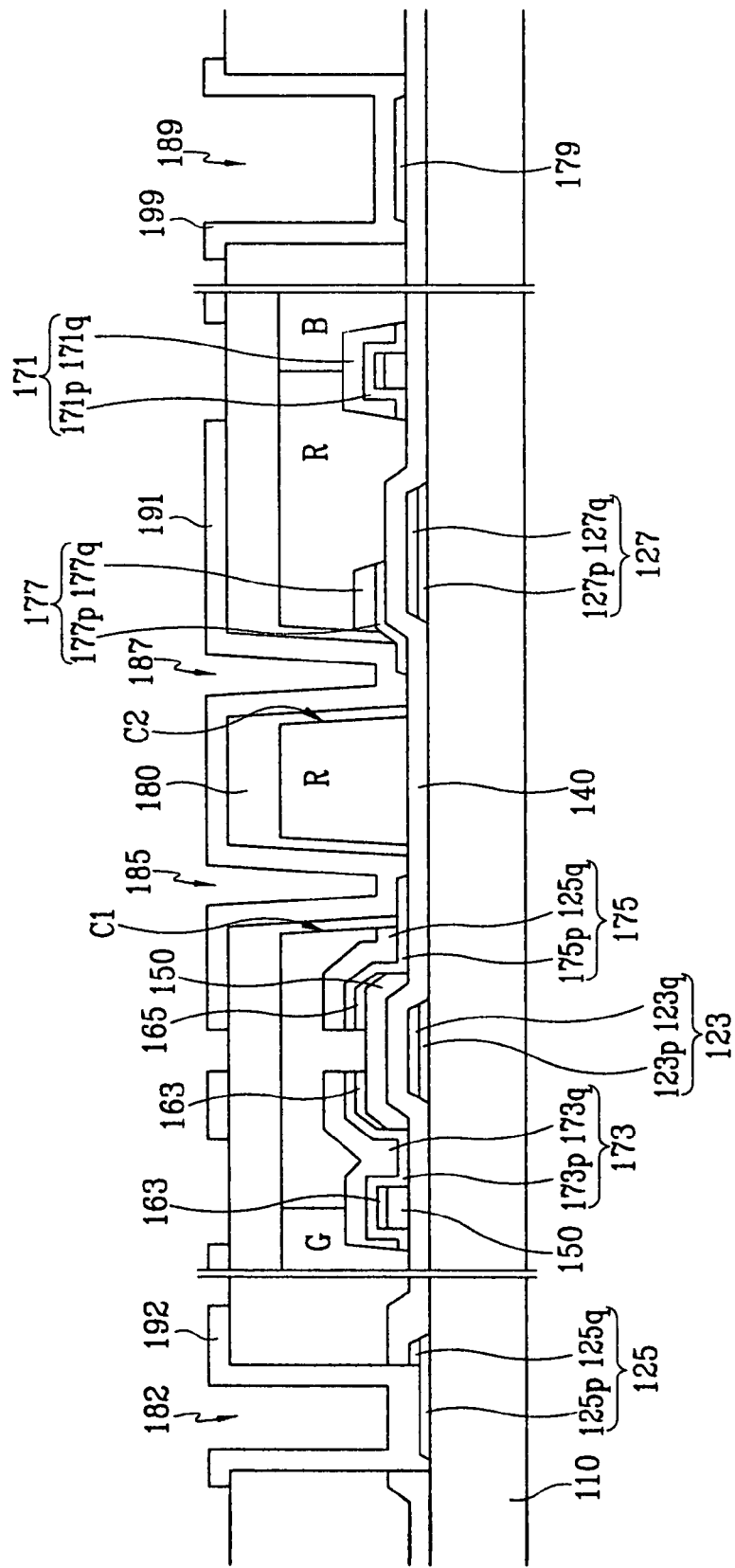

THIN FILM TRANSISTOR ARRAY PANEL, MANUFACTURING METHOD THEREOF, AND MASK THEREFOR

CROSS-REFERENCE TO RELATED APPLICATIONS

This application is a divisional of U.S. application Ser. No. 10/771,278 filed Feb. 2, 2004 now abandoned, entitled "Thin Film Transistor Array Panel, Manufacturing Method Thereof, and Mask Thereof," the disclosure of which is incorporated by reference herein in its entirety, which application claims priority to and the benefit of Korean Patent Application No. 2003-0006588 filed Feb. 3, 2003 and Korean Patent Application No. 2003-0007411 filed Feb. 6, 2003.

BACKGROUND OF THE INVENTION (a) Field of the Invention

The present invention relates to a thin film transistor array panel, a manufacturing method thereof, and a mask therefor.

(b) Description of the Related Art

Liquid crystal displays (LCDs) are one of the most widely used flat panel displays. An LCD includes two panels provided with field-generating electrodes and a liquid crystal (LC) layer interposed therebetween. The LCD displays images by applying voltages to the field-generating electrodes to generate an electric field in the LC layer, which determines orientations of LC molecules in the LC layer to adjust polarization of incident light.

Among LCDs including field-generating electrodes on respective panels, a kind of LCDs provides a plurality of pixel electrodes arranged in a matrix at one panel and a common electrode covering an entire surface of the other panel. The image display of the LCD is accomplished by applying individual voltages to the respective pixel electrodes. For the application of the individual voltages, a plurality of three-terminal thin film transistors (TFTs) are connected to the respective pixel electrodes, and a plurality of gate lines transmitting signals for controlling the TFTs and a plurality of data lines transmitting voltages to be applied to the pixel electrodes are provided on the panel.

The panel for an LCD has a layered structure including several conductive layers and several insulating layers. The gate lines, the data lines, and the pixel electrodes are made from different conductive layers (referred to as "gate conductor," "data conductor," and "pixel conductor" hereinafter) preferably deposited in sequence and separated by insulating layers. A TFT includes three electrodes: a gate electrode made from the gate conductor and source and drain electrodes made from the data conductor. The source electrode and the drain electrode are connected by a semiconductor usually located thereunder, and the drain electrode is connected to the pixel electrode through a hole in an insulating layer.

The gate conductor and the data conductor are preferably made of Al containing metal such as Al and Al alloy having low resistivity for reducing the signal delay in the gate lines and the data lines. The pixel electrodes are usually made of transparent conductive material such as indium tin oxide (ITO) and indium zinc oxide (IZO) for both the field generation upon voltage application and the light transmission.

In the meantime, the contact between Al containing metal and ITO or IZO causes several problems such as corrosion of the Al containing metal and the large contact resistance.

As described above, a drain electrode and a pixel electrode are connected through a contact hole in an insulator. This connection is obtained by forming the hole in the insulator to expose a portion of an upper Al-containing metal layer of the drain electrode, removing the exposed portions of the upper metal layer by blanket-etching to expose a lower layer having good contact characteristic, and finally, forming the pixel electrode thereon. However, the blanket etch frequently generates undercut formed by over-etching the Al containing metal under a sidewall of the contact hole. The undercut yields disconnection or poor profile of the subsequently-formed pixel electrode near the undercut to increase the contact resistance between the pixel electrode and the drain electrode.

SUMMARY OF THE INVENTION

A thin film transistor array panel is provided, which includes: a gate line formed on an insulating substrate; a gate insulating layer on the gate conductive layer; a semiconductor layer on the gate insulating layer; a data line formed on the gate insulating layer and including a portion disposed on the semiconductor layer; a passivation layer formed on the data line and having a first contact hole exposing at least a portion of a boundary of the gate line or the data line; and a contact assistant formed on the passivation layer and on the exposed portion of the boundary of the gate line or the data line.

At least one of the gate line, the data line, and the drain electrode preferably includes a lower film of Cr, Mo or Mo alloy and an upper film of Al or Al alloy, and the contact assistant, preferably including ITO or IZO, is preferably in contact with the lower film.

The thin film transistor array panel may further includes: a drain electrode separated from the data line and formed on the gate insulating layer and the semiconductor layer; and a pixel electrode formed on the passivation layer and connected to the drain electrode through a second contact hole.

An exposure mask is provided, which includes: an opaque area blocking light; and a slit pattern formed in the opaque area and including a plurality of slits, wherein the slits are substantially rectilinear, and width of each slit and distance between the slits are in a range about 0.8-2.0 microns.

The slits may have depressions.

The mask may be utilized in manufacturing a thin film transistor panel including a display area where a plurality of signal lines intersect each other and a peripheral area where end portions of the signal lines are disposed. The slits may include first slits in the display area and second slits in the peripheral area, and the first and the second slits have different width and distance.

The slits may include first slits in the display area and in the peripheral area and second slits in a remaining area, and the first and the second slits have different width and distance.

A method of manufacturing a thin film transistor array panel is provided, the method includes: forming a gate line on an insulating substrate; forming a gate insulating layer; forming a semiconductor member; forming a data conductive layer including a data line and a drain electrode; forming a passivation layer having a contact hole exposing at least a portion of the drain electrode and a portion of the gate insulating layer near an edge of the drain electrode; and forming a pixel electrode connected to the drain electrode through the contact hole, wherein at least one of the semiconductor member and the passivation layer is patterned by photolithography using a mask having a plurality of substantially rectilinear slits and width of each slit and distance between the slits range from about 0.8 to about 2.0 microns.

The mask may include a first area blocking light, a second area provided with the slits for partially transmitting light, and a third area fully transmitting light.

The photolithography may form a positive photoresist including a first portion on the data line and a first portion of the drain electrode, a second portion on a second portion of the drain electrode, and a third portion on an end portion of the gate line. The second portion of the photoresist is thinner than the first portion of the photoresist, and the third portion of the photoresist is thinner than the second portions of the photoresist.

The photoresist may further include a fourth portion on an end portion of the data line and having a thickness smaller than the first portion of the photoresist.

The method may further include: performing etching using the photoresist to expose portions of the passivation layer under the second and the fourth portions of the photoresist and a portion of the gate insulating layer under the third portion; and removing the exposed portions of the passivation layer and the gate insulating layer to form contact holes exposing the end portions of the gate line and the data line.

The slits may include first slits corresponding to the second portion of the photoresist and second slits corresponding to the fourth portion of the photoresist, and the first and the second slits have different width and distance.

The patterning of at least one of the semiconductor member and the passivation layer by photolithography may include: depositing a semiconductor layer on the gate insulating layer; depositing an insulating layer on the data conductive layer; forming the photoresist on the insulating layer; performing etching using the photoresist to expose portions of the passivation layer under the second and the fourth portions of the photoresist and a portion of the gate insulating layer under the third portion; removing the exposed portions of the passivation layer and the gate insulating layer to form contact holes exposing the end portions of the gate line and the data line and to expose portions of the semiconductor layer; and removing the exposed portions of the semiconductor layer to form the semiconductor member.

The semiconductor member may include a plurality of semiconductor portions separated from each other at positions between adjacent data lines.

The thin film transistor panel may include a display area where the gate line intersects the data line and a peripheral area where end portions of the gate line and the data line are disposed, the slits include first slits in the display area and in the peripheral area and second slits in a remaining area, and the first and the second slits have different width and distance.

At least one of the gate line and the data conductive layer may include a lower film of Cr, Mo or Mo alloy and an upper film of Al or Al alloy.

The drain electrode may include the lower film and the upper film and the method further include: removing the upper film of the at least a portion of the drain electrode before forming the pixel electrode.

The mask may be aligned such that at least one of the slits overlaps a boundary of the drain electrode, and the at least one of the slits may have a depression.

The mask may be aligned such that at least two of the slits are disposed out of the drain electrode.

BRIEF DESCRIPTION OF THE DRAWINGS

The present invention will become more apparent by describing embodiments thereof in detail with reference to the accompanying drawings in which:

FIGS. 5B, 6B, 7B and 9B are sectional views of the TFT array panel shown in FIGS. 5A, 6A, 7A and 9A taken along the lines VB-VB', VIB-VIB', VIIB-VIIB', and IX-IX', respectively;

FIGS. 16B and 16C are sectional views of the TFT array panel shown in FIG. 16A taken along the lines XVIB-XVIB' and XVIC-XVIC', respectively;

FIGS. 19A, 20A and 21A and FIGS. 19B, 20B and 21B are respective sectional views of the TFT array panel shown in FIG. 18A taken along the lines XVIIIB-XVIIIB' and XVIIIC-XVIIIC', respectively, and illustrate the steps following the step shown in FIGS. 18B and 18C;

FIGS. 22B and 22C are sectional views of the TFT array panel shown in FIG. 22A taken along the lines XXIIB-XXIIB' and XXIIC-XXIIC', respectively;

FIGS. 23A, 24A and 25A and FIGS. 23B, 24B and 25B are respective sectional views of the TFT array panel shown in FIG. 22A taken along the lines XXIIB-XXIIB' and XXIIC-XXIIC', respectively, and illustrate the steps following the step shown in FIGS. 22B and 22C;

FIGS. 31 and 32 are sectional views of the TFT array panel shown in FIG. 30A taken along the line XXXB-XXXB' in the steps of the manufacturing method following the step shown in FIG. 30B;

FIG. 34 is a sectional view of the TFT array panel shown in FIG. 33 taken along the line XXXIV-XXXIV'.

DETAILED DESCRIPTION OF EMBODIMENTS

Figure 1:
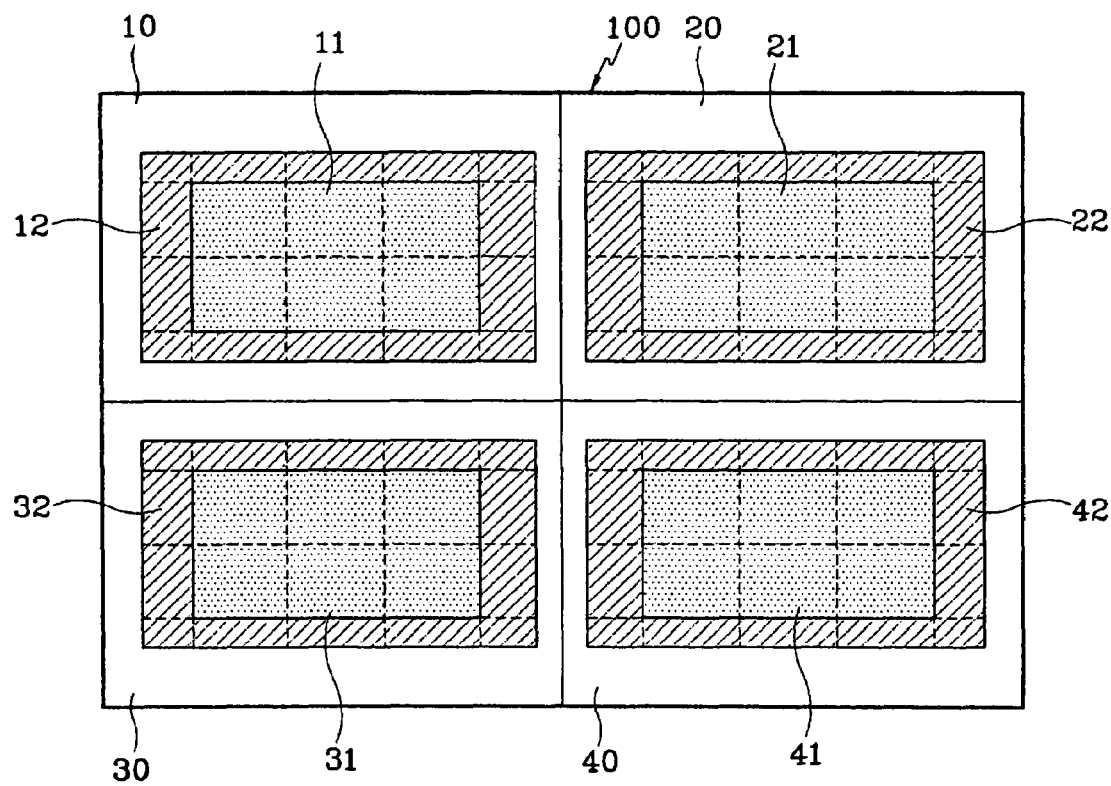
FIG. 1 is a schematic diagram of a substrate for LCD according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films and regions are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels and manufacturing methods thereof according to embodiments of the present invention will be described with reference to the accompanying drawings.

FIG. 1 is a schematic diagram of a substrate for LCD according to an embodiment of the present invention.

Referring to FIG. 1, a substrate 100 preferably made of glass includes a plurality of, for example, four device areas 10-40. When the substrate 100 is prepared for TFT array panels, each device area 10-40 includes a display area 11-41 provided with a plurality of pixel areas and a peripheral area 12-42. The display area 11-41 is provided with a plurality of TFTs, signal lines, and pixel electrodes, which are arranged in a matrix, and the peripheral area 12-42 is provided with elements such as pads of the signal lines, which will be connected to external driving devices, and electrostatic discharge protection circuits.

The elements of the LCD are formed preferably using an exposer called stepper. When using the stepper, the display area 11-41 and the peripheral area 12-42 are divided by several exposure areas (having boundaries indicated by dotted lines in FIG. 1), portions of a photoresist film (not shown) on the exposure areas are separately exposed to light through the same or different exposure masks. Subsequently, the photoresist film is developed to form a photoresist pattern and a layer under the photoresist pattern is etched to form a predetermined pattern. A TFT array panel for an LCD is completed by the repeated formation of the layer patterns.

Figure 2:
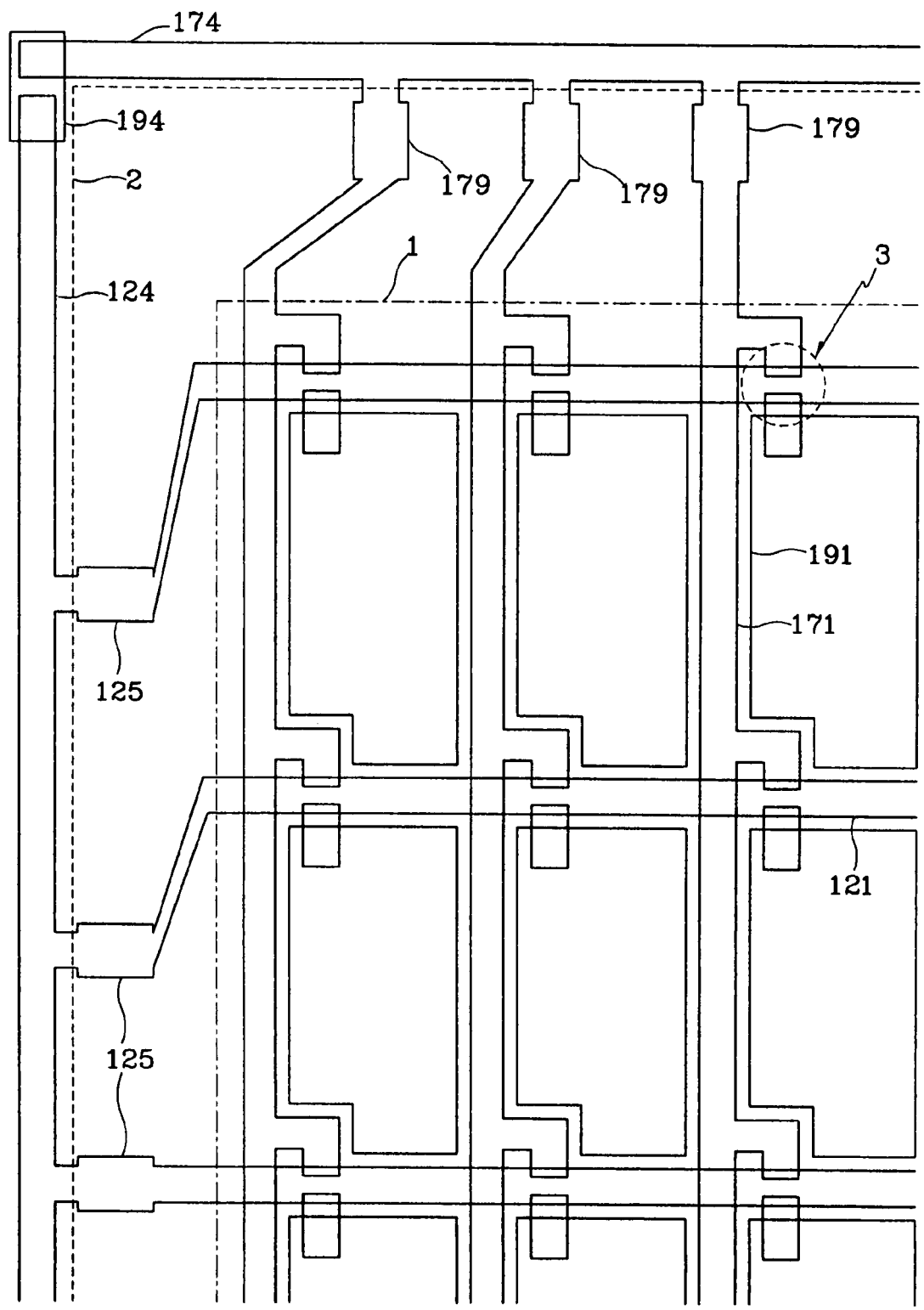
FIG. 2 is a schematic layout view of a TFT array panel for an LCD according to an embodiment of the present invention.

FIG. 2 is a schematic layout view of a TFT array panel for an LCD according to an embodiment of the present invention.

Referring to FIG. 2, a plurality of TFTs 3, a plurality of pixel electrodes 191 electrically connected to the TFTs 3, a plurality of signal lines including mutually intersecting gate lines 121 and data lines 171 are disposed in a display area surrounded by lines 1. In a peripheral area disposed out of the display area, expansions 125 and 179 of the gate lines 121 and the data lines 179 are disposed to be connected to gate driving ICs and data driving ICs for receiving signals to be applied to the gate lines 121 and the data lines 171. In addition, a gate shorting bar 124 and a data shorting bar 174, which are electrically connected to the gate lines 121 and the data lines 171, respectively, and a shorting bar connection 194 connected to the shorting bars 124 and 174 are provided in the peripheral area, and they make the gate lines 121 and the data lines 171 have equal potential to prevent device breakdown due to electrostatic discharge. The shorting bars 124 and 174 are electrically disconnected from the gate lines 121 and the data lines 171 at a later time by scribing the substrate 100 along a line 2. Although it is not shown in the figure, insulator(s) is interposed between the shorting bar connection 194 and the shorting bars 124 and 174 and contact holes for connecting the connection 194 and the shorting bars 124 and 174 are provided at the insulator. In addition, an insulator is disposed between the TFT 3 and the pixel electrode 191 and a contact hole for connecting the TFT3 and the pixel electrode 191 is provided at the insulator.

First Embodiment

A TFT array panel for an LCD will be described in detail with reference to FIGS. 3 and 4 as well as FIGS. 1 and 2.

A TFT array panel for an LCD will be described in detail with reference to FIGS. 3 and 4 as well as FIGS. 1 and 2.

Figure 3:
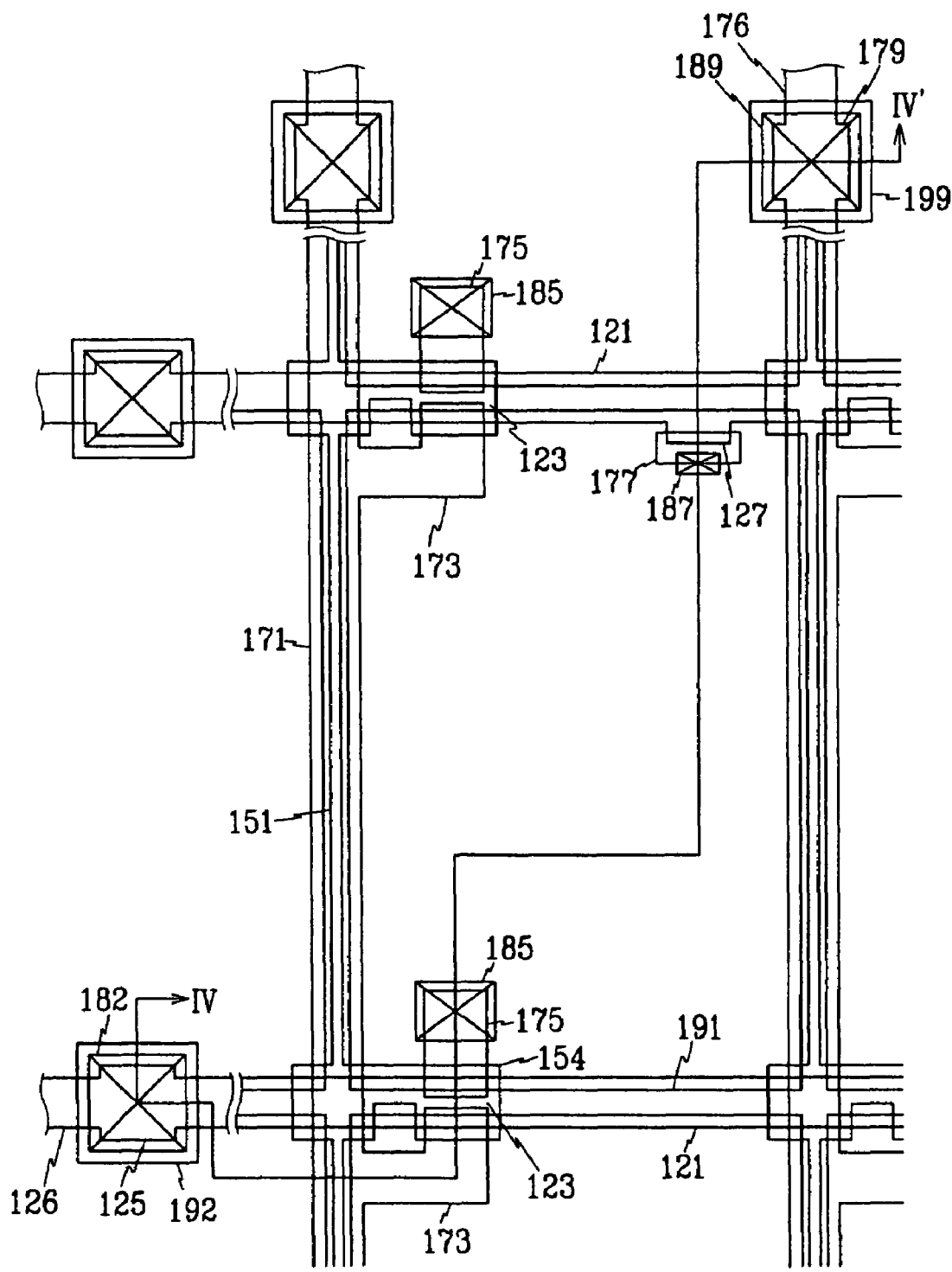
FIG. 3 is a layout view of an exemplary TFT array panel for an LCD according to an embodiment of the present invention.
Figure 4:
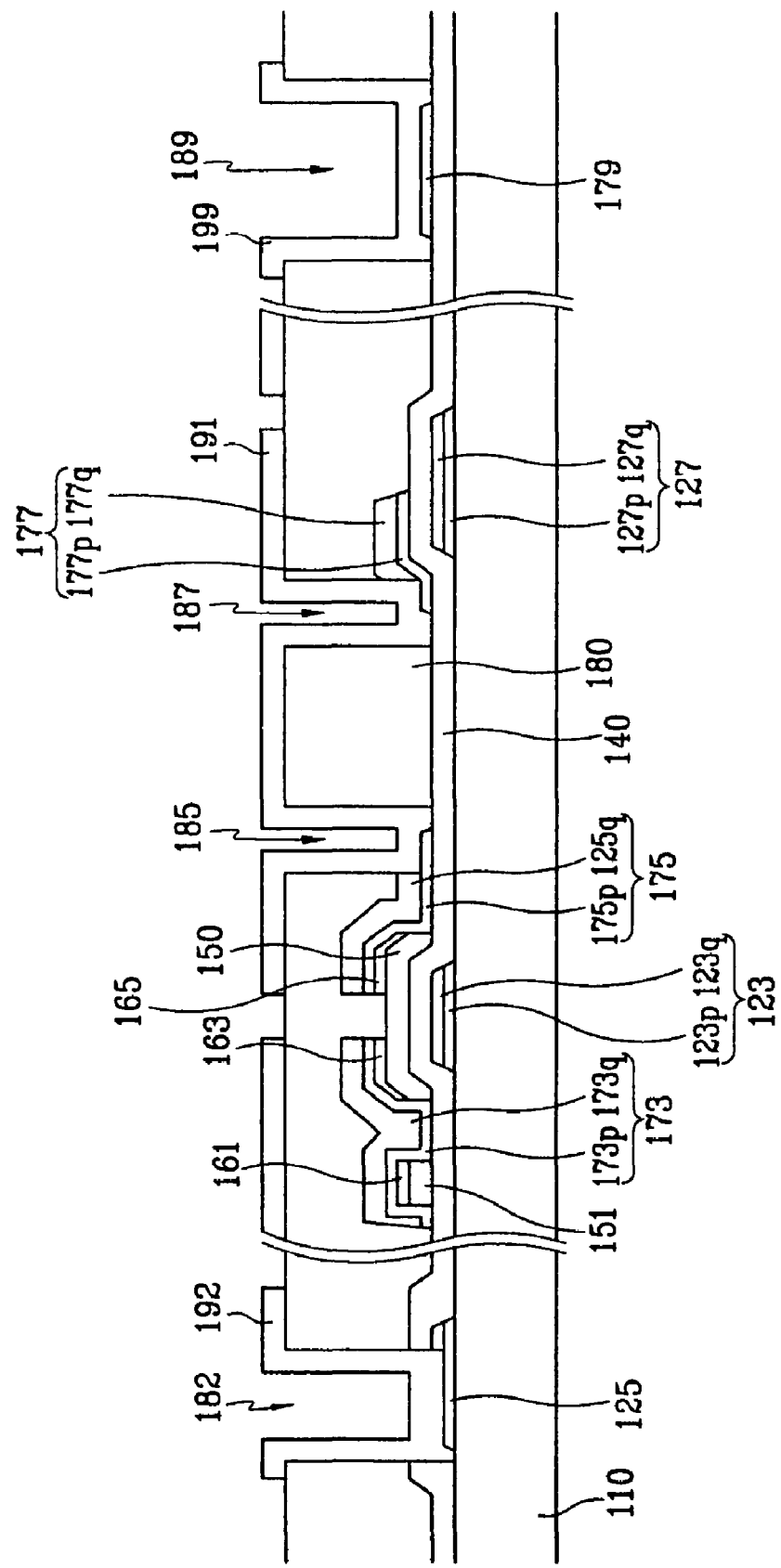
FIG. 4 is a sectional view of the TFT array panel shown in FIG. 3 taken along the line IV-IV'.

FIG. 3 is an exemplary layout view of TFTs, pixel electrodes, portions of signal lines located on the display area and expansions of the signal lines located on the peripheral area of the exemplary TFT array panel shown in FIG. 2 according to an embodiment of the present invention, and FIG. 4 is a sectional view of the TFT array panel shown in FIG. 3 taken along the line IV-IV'.

A plurality of gate lines 121 for transmitting gate signals and a gate shorting bar 124 extending substantially in a longitudinal direction are formed on an insulating substrate 110. Each gate line 121 extends substantially in a transverse direction and a plurality of portions of each gate line 121 form a plurality of gate electrodes 123. Each gate line 121 includes a plurality of projections 127 protruding downward, an expansion 125 having wider width for contact with another layer or an external device, and an extension 126 connected between the expansion 125 and the gate shorting bar 124. Most portions of the gate lines 121 are disposed on the display area, while the expansions 125 and the extensions 126 of the gate lines 121 as well as the gate shorting bar 124 are disposed on the peripheral area.

The gate lines 121 as well as the gate shorting bar 124 include two films having different physical characteristics, a lower film 121$p$ and an upper film 121$q$. The upper film 121$q$ is preferably made of low resistivity metal including Al containing metal such as Al and Al alloy for reducing signal delay or voltage drop in the gate lines 121. On the other hand, the lower film 121$p$ is preferably made of material such as Cr, Mo, Mo alloy, Ta and Ti, which has good physical, chemical, and electrical contact characteristics with other materials such as indium tin oxide (ITO) and indium zinc oxide (IZO). A good exemplary combination of the lower film material and the upper film material is Cr and Al—Nd alloy. In FIG. 4, the lower and the upper films of the gate electrodes 123 are indicated by reference numerals 123$p$ and 123$q$, respectively, and the lower and the upper films of the projections 127 are indicated by reference numerals 127$p$ and 127$q$, respectively. However, the expansions 125 of the gate lines 121 include only a lower film.

In addition, the lateral sides of the upper film 121q and the lower film 121p are tapered, and the inclination angle of the lateral sides with respect to a surface of the substrate 110 ranges about 30-80 degrees.

A gate insulating layer 140 preferably made of silicon nitride (SiNx) is formed on the gate lines 121 and the gate shorting bar 124.

A plurality of semiconductor stripes 151 preferably made of hydrogenated amorphous silicon (abbreviated to "a-Si") are formed on the gate insulating layer 140. Each semiconductor stripe 151 extends substantially in the longitudinal direction and has a plurality of projections 154 branched out toward the gate electrodes 123. The width of each semiconductor stripe 151 becomes large near the gate lines 121 such that the semiconductor stripe 151 covers large areas of the gate lines 121.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of projections 163, and the projections 163 and the ohmic contact islands 165 are located in pairs on the projections 154 of the semiconductor stripes 151.

The lateral sides of the semiconductor stripes 151 and the ohmic contacts 161 and 165 are tapered, and the inclination angles thereof are preferably in a range between about 30-80 degrees.

A plurality of data lines 171, a plurality of drain electrodes 175, a plurality of storage capacitor conductors 177, and a data shorting bar 174 are formed on the ohmic contacts 161 and 165 and the gate insulating layer 140.

The data lines 171 for transmitting data voltages extend substantially in the longitudinal direction and intersect the gate lines 121. Each data line 171 includes an expansion 179 having wider width for contact with another layer or an external device, and an extension 176 connected between the expansion 179 and the data shorting bar 174. Most portions of the data lines 171 as well as the drain electrodes 175 and the storage capacitor conductors 177 are disposed on the display area, while the expansions 179 and the extensions 176 of the data lines 171 as well as the data shorting bar 174 are disposed on the peripheral area.

A plurality of branches of each data line 171, which project toward the drain electrodes 175, form a plurality of source electrodes 173. Each pair of the source electrodes 173 and the drain electrodes 175 are separated from each other and opposite each other with respect to a gate electrode 123. A gate electrode 123, a source electrode 173, and a drain electrode 175 along with a projection 154 of a semiconductor stripe 151 form a TFT having a channel formed in the projection 154 disposed between the source electrode 173 and the drain electrode 175.

The storage capacitor conductors 177 overlap the projections 127 of the gate lines 121, and the data shorting bar 174 extends substantially in the transverse direction.

The data lines 171, the drain electrodes 175, and the storage capacitor conductors 177 as well as the data shorting bar 174 also include a lower film 171p, 175p and 177p preferably made of Mo, Mo alloy or Cr and an upper film 171q, 175q and 177q located thereon and preferably made of Al containing metal or Ag containing metal. However, the expansions 179 of the data lines 171 include only a lower film, and portions of the upper films 175q and 177q of the drain electrodes 175 and the storage capacitor conductors 177 are removed to expose the underlying portions of the lower films 175p and 177p.

Like the gate lines 121, the lower film 171p, 175p and 177p and the upper film 171q, 175q and 177q of the data lines 171, the drain electrodes 175, and the storage capacitor conductors 177 as well as the data shorting bar 174 have tapered lateral sides, and the inclination angles thereof range about 30-80 degrees.

The ohmic contacts 161 and 165 are interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175. Although the semiconductor stripes 151 are narrower than the data lines 171 at most places, the width of the semiconductor stripes 151 becomes large near the gate lines 121 as described above, to smooth the profile of the surface, thereby preventing the disconnection of the data lines 171.

A passivation layer 180 is formed on the data lines 171, the drain electrodes 175, the storage conductors 177, the data shorting bar 174, and the exposed portions of the semiconductor stripes 151. The passivation layer 180 is preferably made of photosensitive organic material having a good flatness characteristic, low dielectric insulating material having dielectric constant lower than 4.0 such as a-Si:C:O and a-Si:O:F formed by plasma enhanced chemical vapor deposition (PECVD), or inorganic material such as silicon nitride.

The passivation layer 180 has a plurality of contact holes 185, 187 and 189 exposing the lower films 175p of the drain electrodes 175, the lower films 177p of the storage conductors 177, and the expansions 179 of the data lines 171, respectively. The passivation layer 180 and the gate insulating layer 140 have a plurality of contact holes 182 exposing the expansions 125 of the gate lines 121. The passivation layer 180 and/or the gate insulating layer 140 have a plurality contact holes (not shown) exposing adjacent end portions of the gate shorting bar 124 and the data shorting bar 174.

In addition, FIGS. 3 and 4 shows that the contact holes 182, 185, 187 and 189 expose edges of the lower films 125, 175p, 177p and 179 and some portions of the gate insulating layer 140 and the substrate 110. There is no undercut at the contact holes 182, 185, 187 and 189.

A plurality of pixel electrodes 191, a plurality of contact assistants 192 and 199, and a shorting bar connection 194, which are preferably made of ITO or IZO, are formed on the passivation layer 180.

The pixel electrodes 191 are physically and electrically connected to the drain electrodes 175 through the contact holes 185 and to the storage capacitor conductors 177 through the contact holes 187 such that the pixel electrodes 191 receive the data voltages from the drain electrodes 175 and transmit the received data voltages to the storage capacitor conductors 177.

The pixel electrodes 191 supplied with the data voltages generate electric fields in cooperation with a common electrode (not shown) on another panel (not shown), which reorient liquid crystal molecules in a liquid crystal layer (not shown) disposed therebetween.

A pixel electrode 191 and a common electrode form a liquid crystal capacitor, which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 191 with the gate lines 121 adjacent thereto (called "previous gate lines"). The capacitances of the storage capacitors, i.e., the storage capacitances are increased by providing the projections 127 at the gate lines 121 for increasing overlapping areas and by providing the storage capacitor conductors 177, which are connected to the pixel electrodes 191 and overlap the projections 127, under the pixel electrodes 191 for decreasing the distance between the terminals.

The pixel electrodes 191 overlap the gate lines 121 and the data lines 171 to increase aperture ratio but it is optional.

The contact assistants 192 and 199 are connected to the exposed expansions 125 of the gate lines 121 and the exposed expansions 179 of the data lines 171 through the contact holes 182 and 189, respectively. The contact assistants 192 and 199 are not requisites but preferred to protect the exposed portions 125 and 179 and to complement the adhesiveness of the exposed portions 125 and 179 and external devices.

The shorting bar connection 194 is connected to the gate shorting bar 124 and the data shorting bar 174 through the contact holes exposing them.

As described above, the lower films 125, 179, 175$p$ and 177$p$ of the expansions 125 of the gate lines 121, the expansions 179 of the data lines 171, the drain electrodes 175, and the storage capacitor conductors 177, which have a good contact characteristic with ITO and IZO, are exposed, and the contact holes 182, 185, 187 and 189 expose at least an edge of the lower films 125, 175$p$, 177$p$ and 179. Accordingly, the pixel electrodes 191 and the contact assistants 192 and 199 are in contact with the lower films 175$p$, 177$p$, 125 and 179 with sufficiently large contact areas to provide low contact resistance. Furthermore, since there is no undercut at the contact holes 185, 187 and 189 and thus the pixel electrodes 191 and the contact assistants 199 are also in contact with the gate insulating layer 140 through the contact holes 185, 187 and 189, the pixel electrodes 191 and the contact assistants 92 and 97 have smooth profiles.

According to another embodiment of the present invention, the pixel electrodes 191 are made of transparent conductive polymer. For a reflective LCD, the pixel electrodes 191 are made of opaque reflective metal. In these cases, the contact assistants 192 and 199 may be made of material such as ITO or IZO different from the pixel electrodes 191.

1st Embodiment Method

A method of manufacturing the TFT array panel shown in FIGS. 1-4 according to an embodiment of the present invention will be now described in detail with reference to FIGS. 5A to 12 as well as FIGS. 1-4.

Figure 5A:
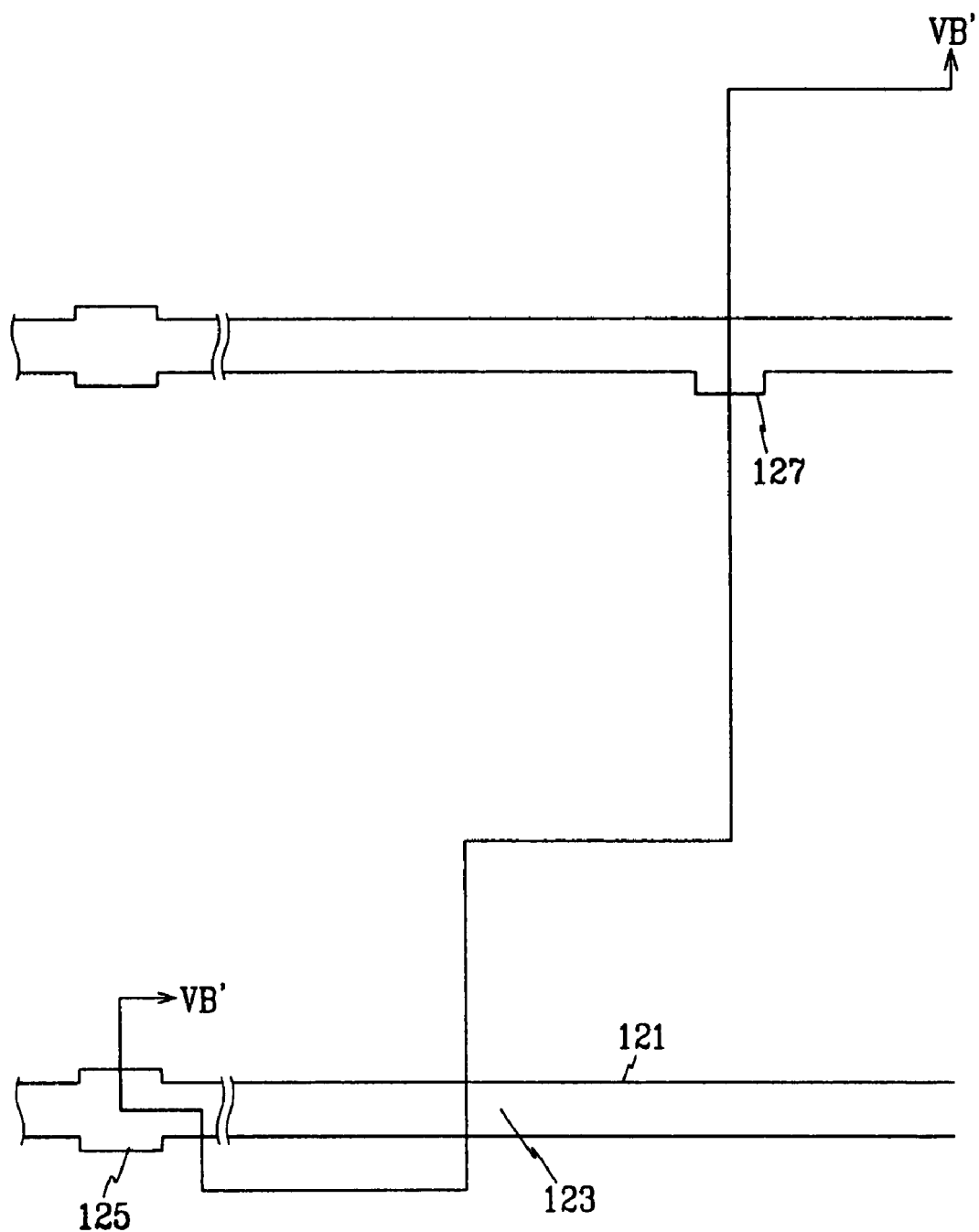
FIGS. 5A, 6A, 7A and 9A are layout views of the TFT array panel shown in FIGS. 1-4 in intermediate steps of a manufacturing method thereof according to an embodiment of the present invention.
Figure 5B:
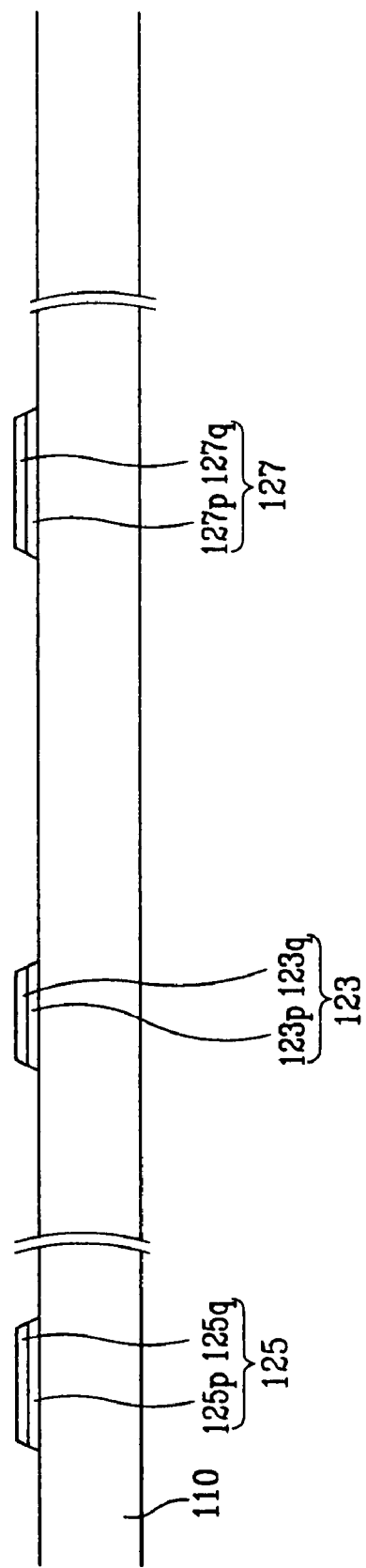
Figure 6A:
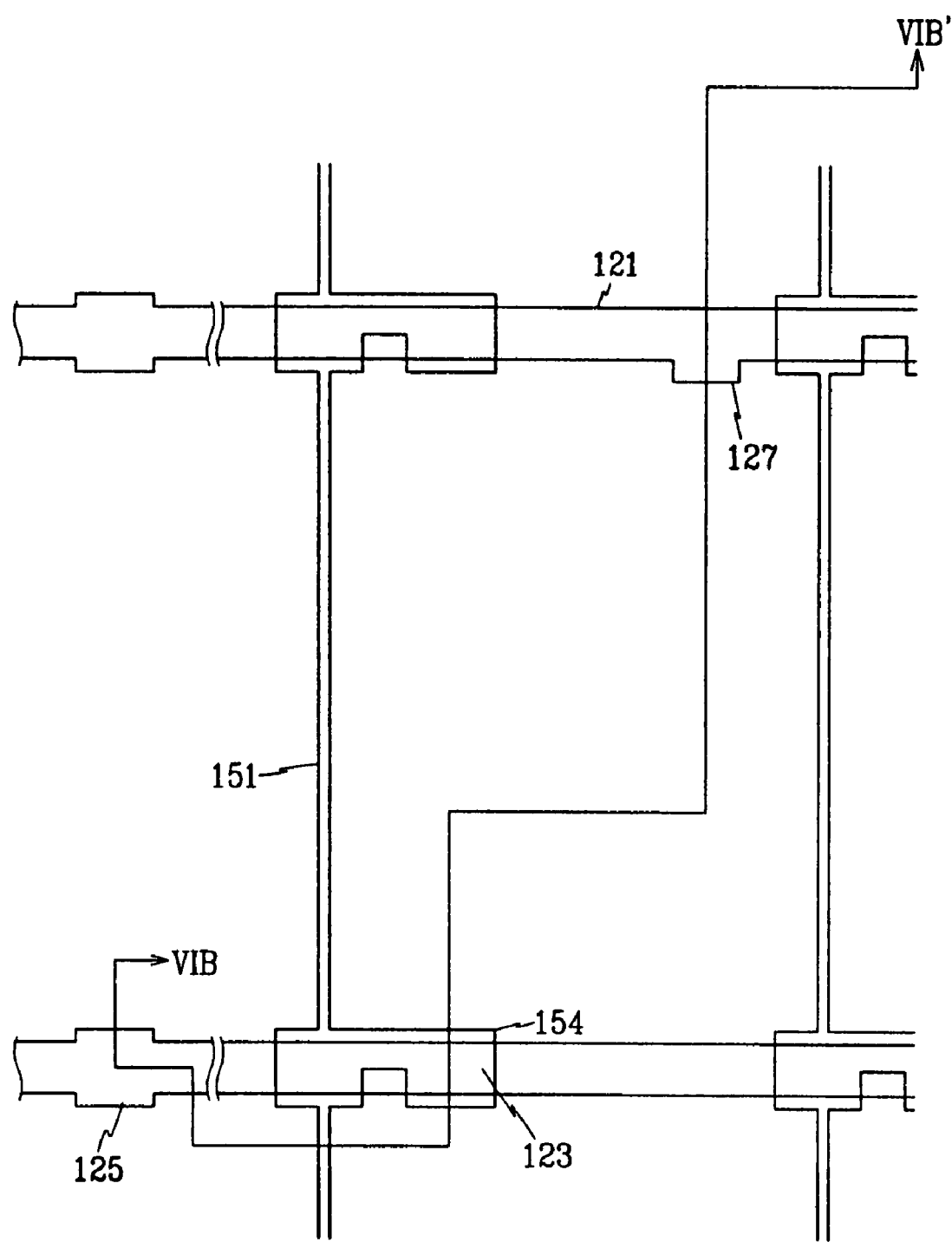
Figure 7A:
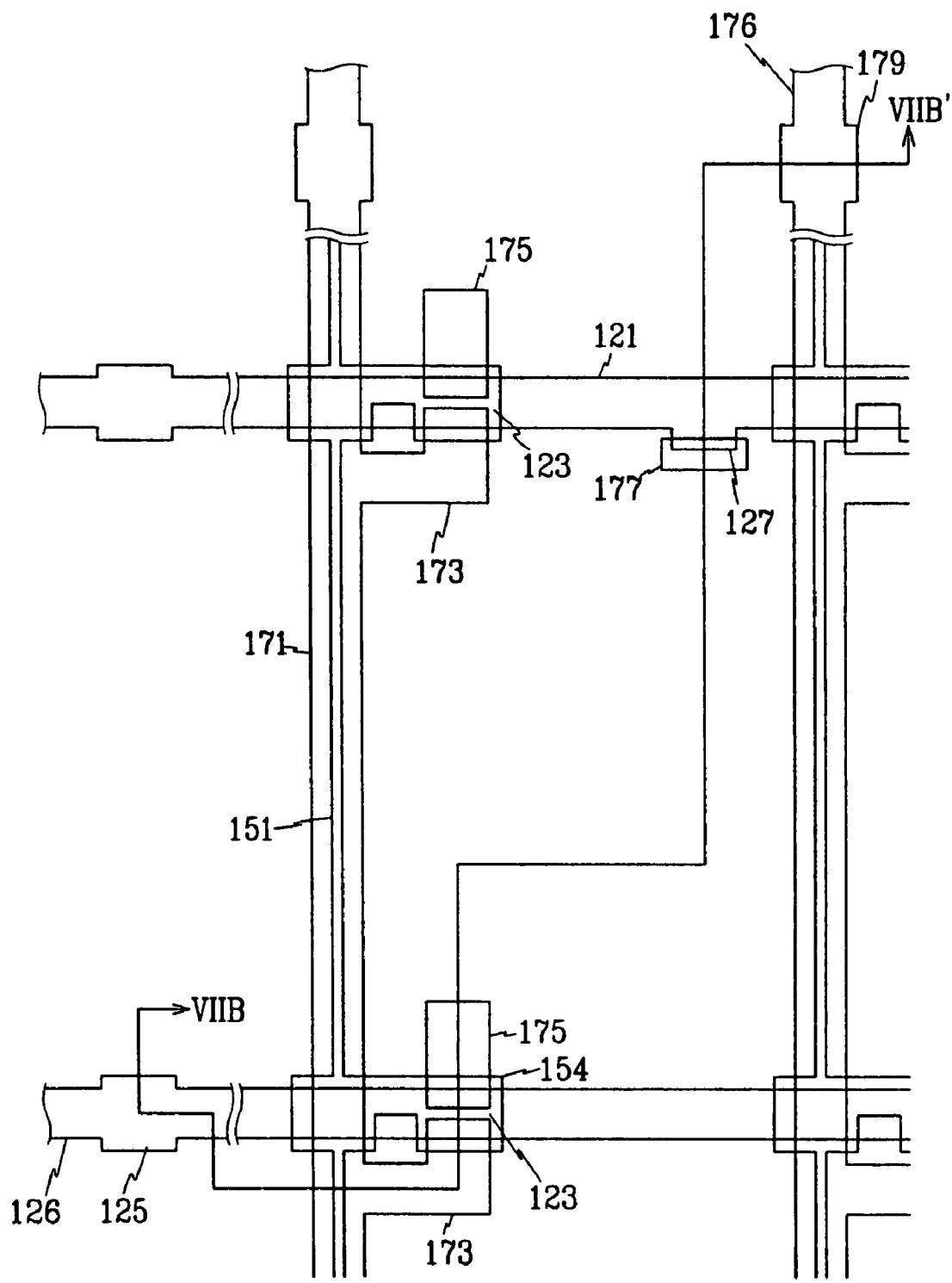
Figure 7B:
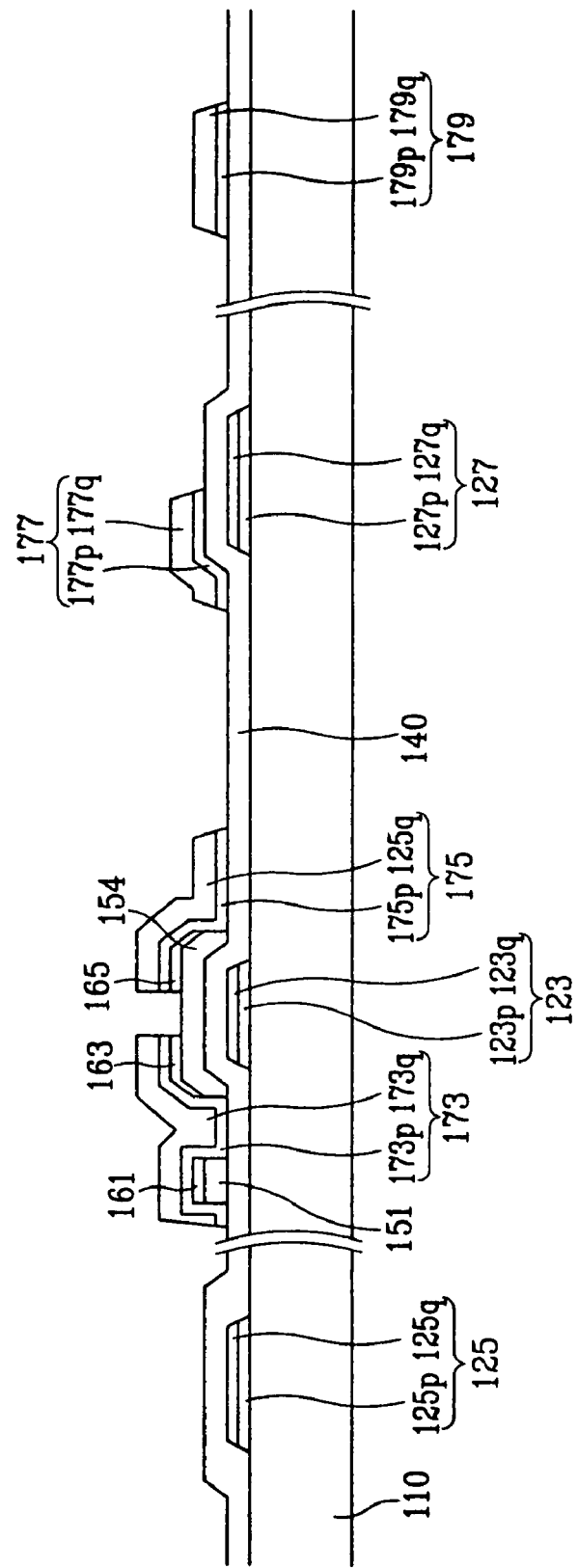
Figure 8:
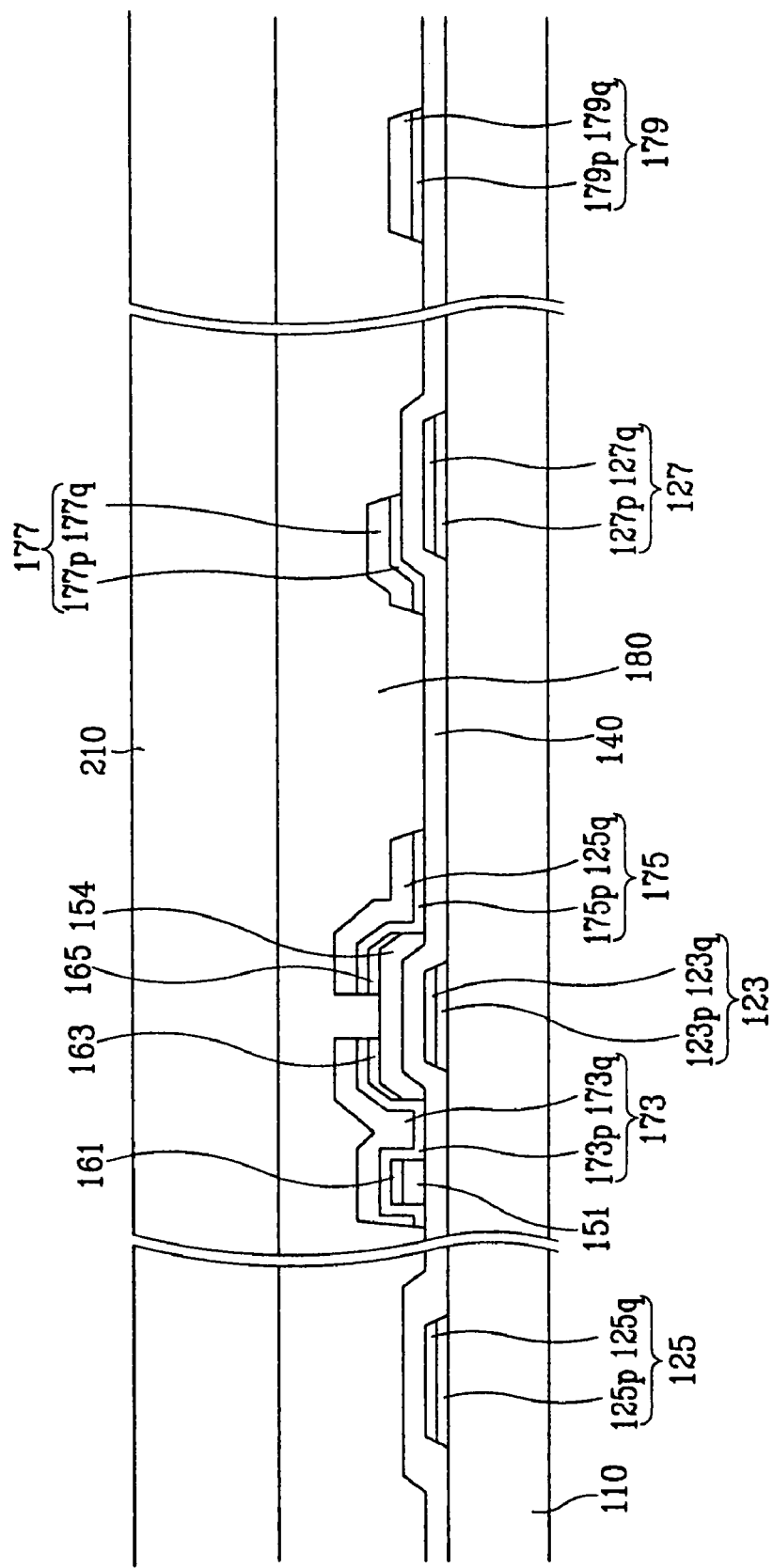
FIG. 8 is a sectional view of the TFT array panel shown in FIG. 7A taken along the line VII-VII' in the step of the manufacturing method following the step shown in FIG. 7B.
Figure 9A:
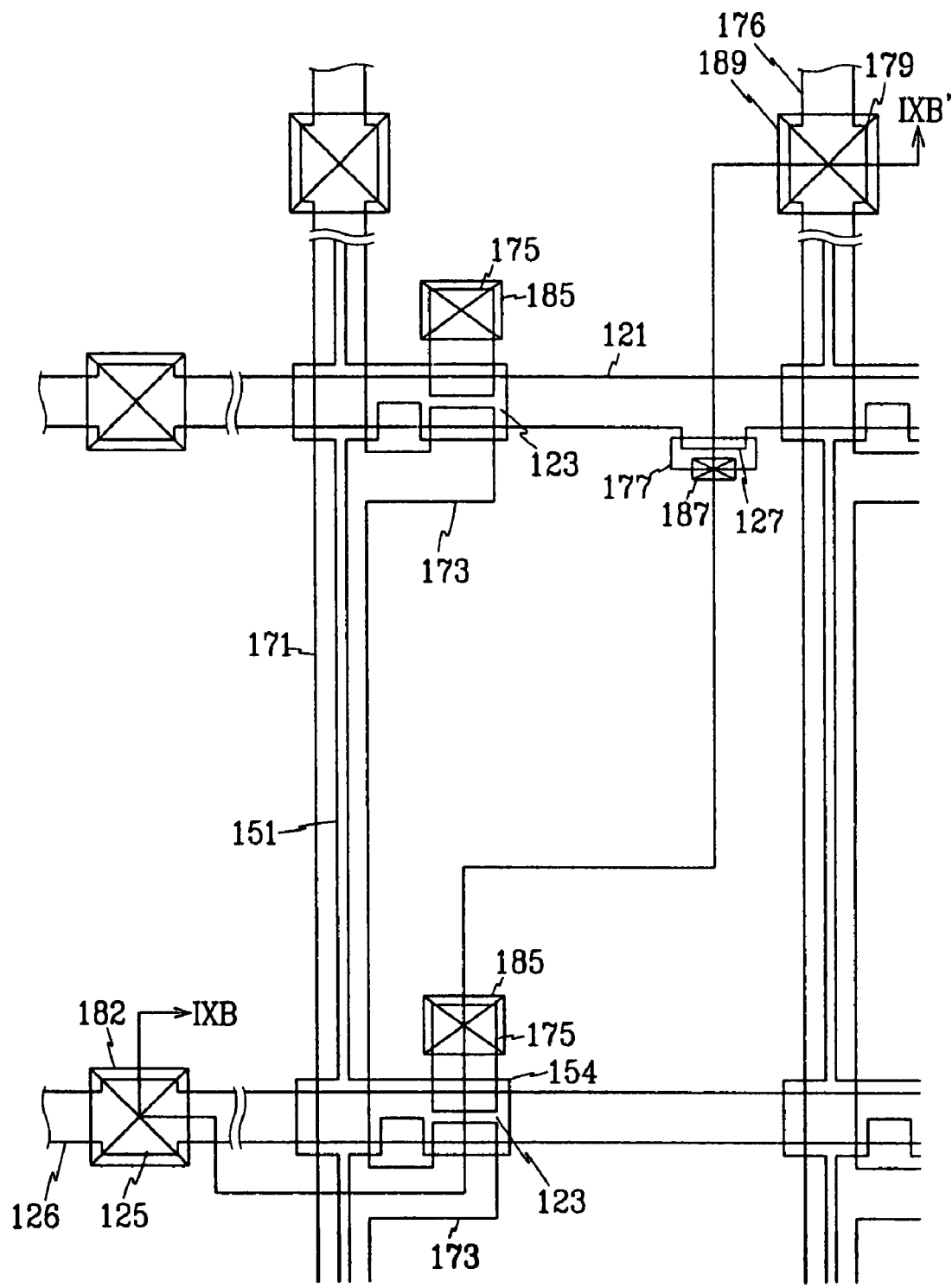
Figure 9B:
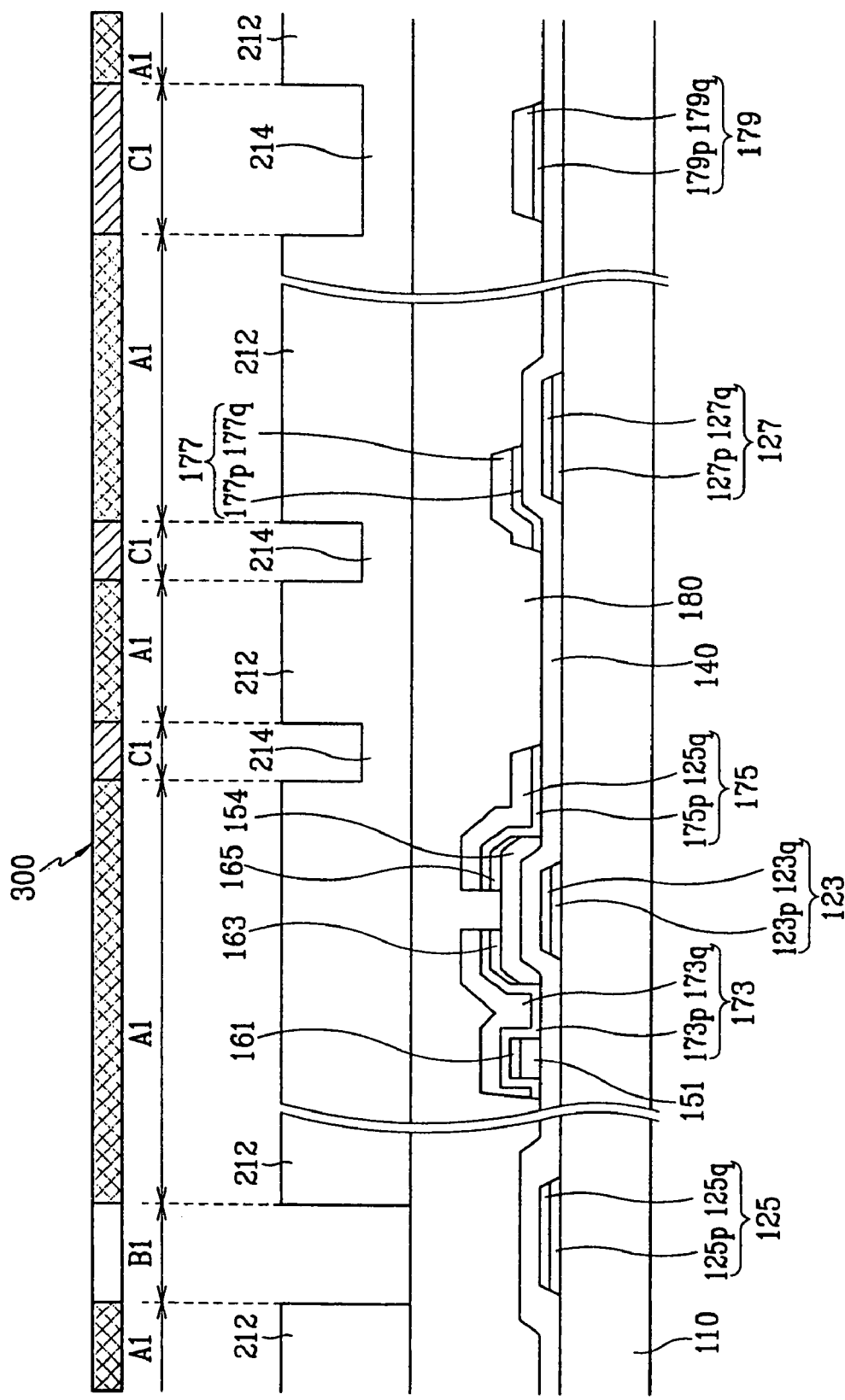
Figure 10:
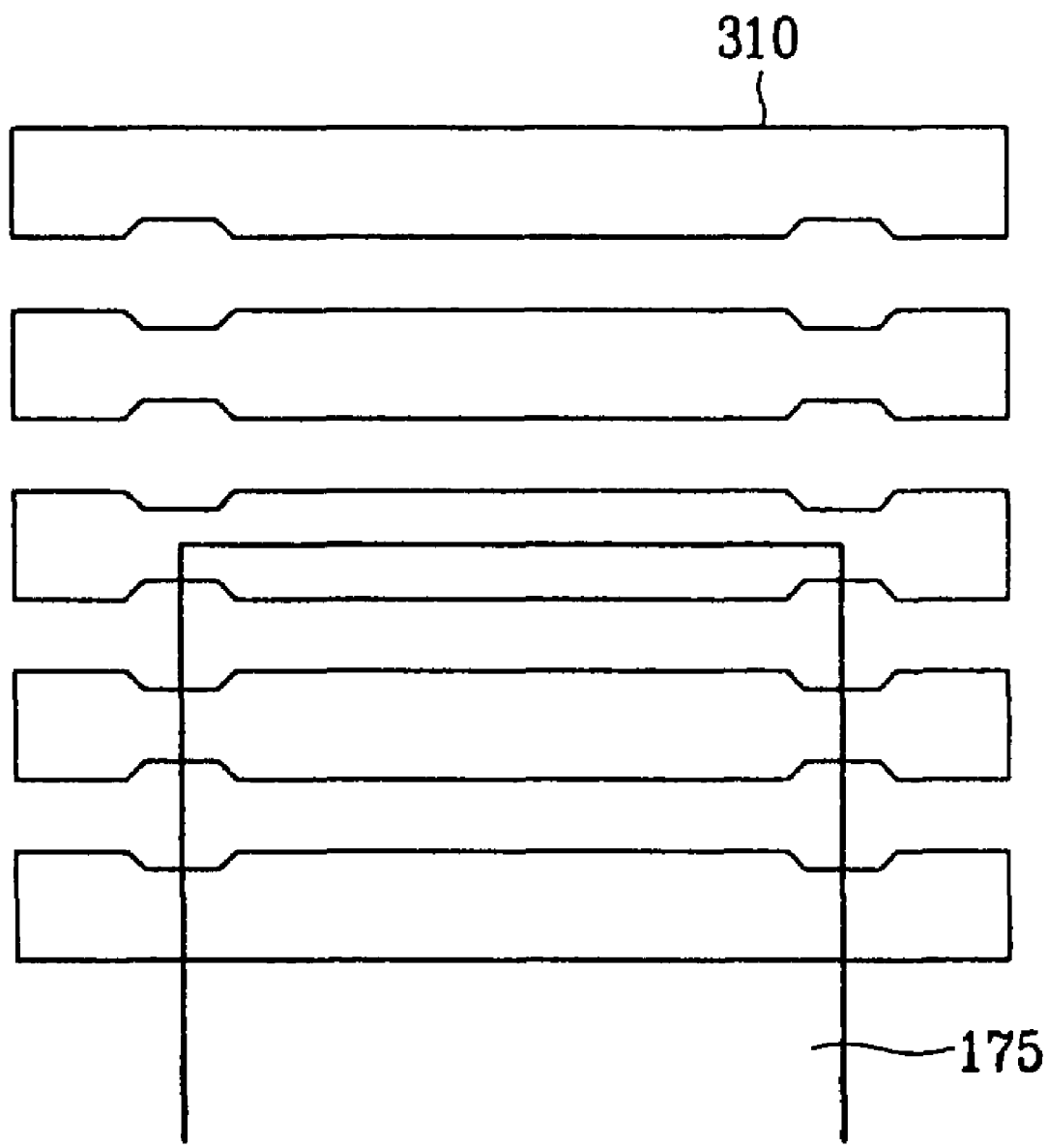
FIG. 10 illustrates alignment between slits of a mask and a drain electrode.
Figure 11:
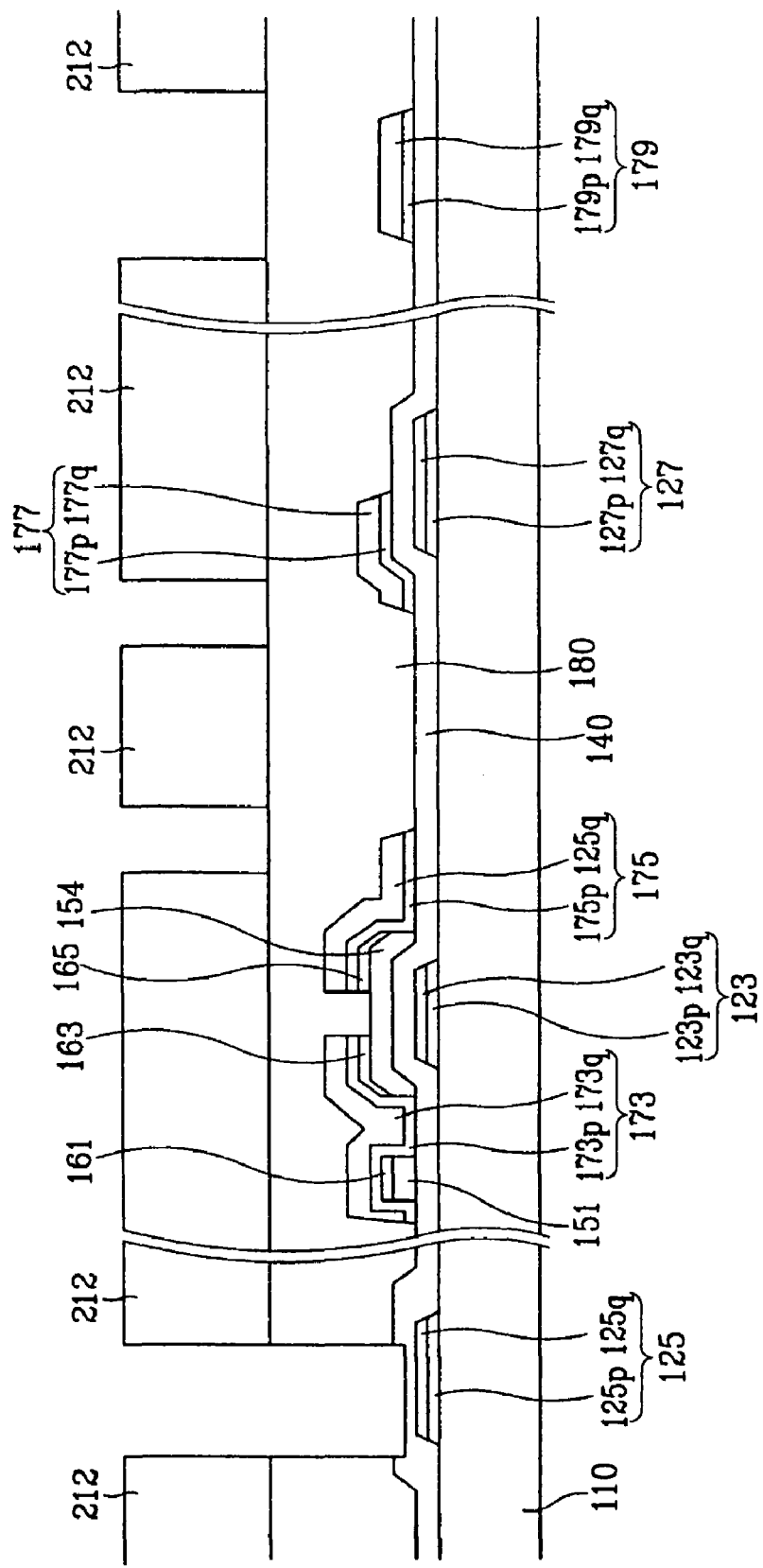
FIGS. 11 and 12 are sectional views of the TFT array panel shown in FIG. 9A in the steps of the manufacturing method following the step shown in FIG. 9B.
Figure 12:
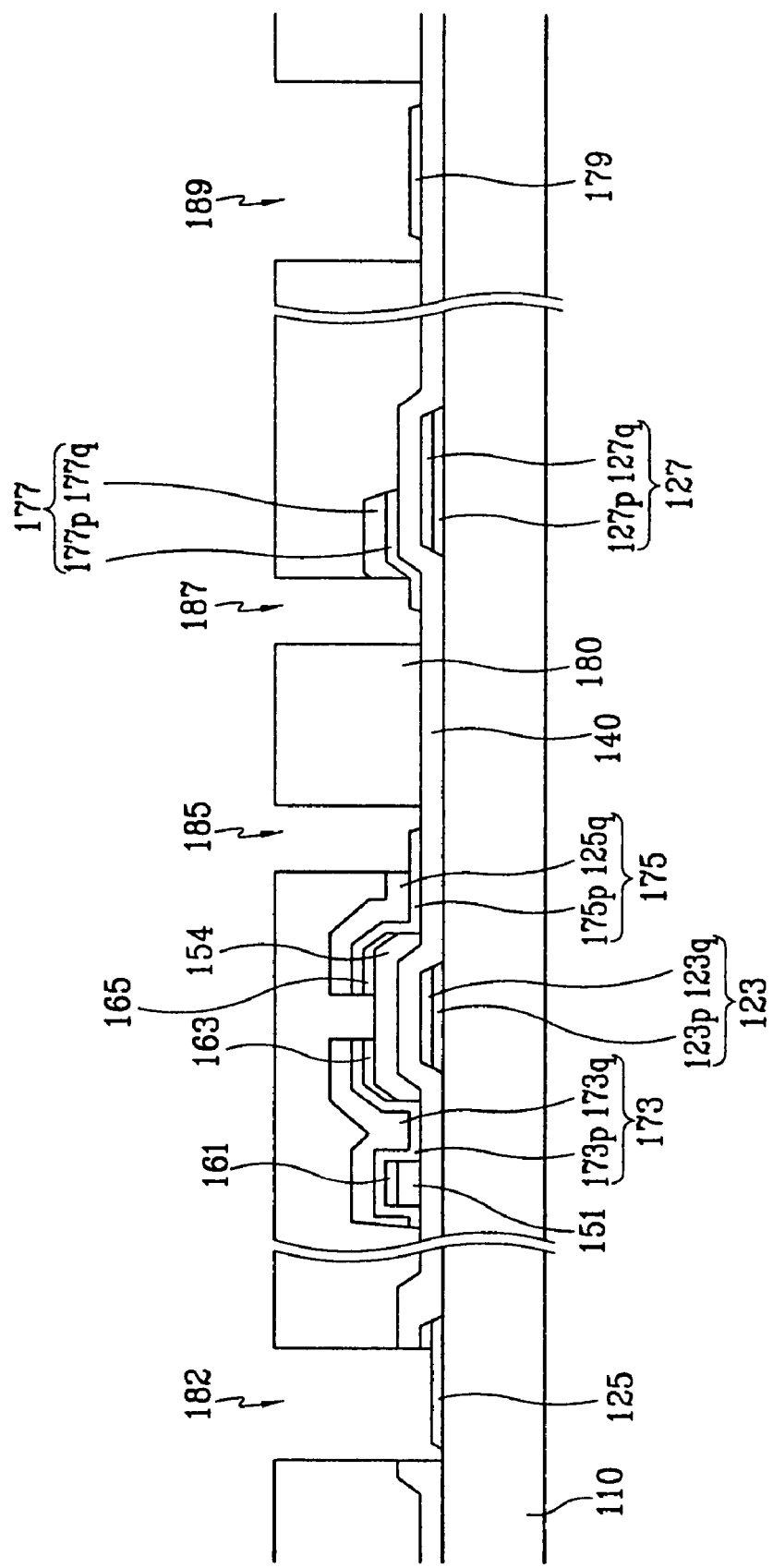

FIGS. 5A, 6A, 7A and 9A are layout views of the TFT array panel shown in FIGS. 1-4 in intermediate steps of a manufacturing method thereof according to an embodiment of the present invention, and FIGS. 5B, 6B, 7B and 9B are sectional views of the TFT array panel shown in FIGS. 5A, 6A, 7A and 9A taken along the lines VB-VB', VIB-VIB', VIIB-VIIB', and IXB-IXB', respectively. FIG. 8 is a sectional view of the TFT array panel shown in FIG. 7A taken along the line VIIB-VIIB' in the step of the manufacturing method following the step shown in FIG. 7B, and FIGS. 11 and 12 are sectional views of the TFT array panel shown in FIG. 9A in the steps of the manufacturing method following the step shown in FIG. 9B. FIG. 10 illustrates alignment between slits of a mask and a drain electrode.

Two conductive films, a lower conductive film and an upper conductive film are sputtered in sequence on an insulating substrate 110 such as transparent glass. The upper conductive film is preferably made of Al containing metal such as Al—Nd alloy. An Al—Nd target for sputtering the upper film preferably contains 2 atm % and the upper film preferably has a thickness of about 2,500 Å.

Referring to FIGS. 5A and 5B, the upper conductive film and the lower conductive film are patterned in sequence to form a plurality of gate lines 121 including a plurality of gate electrodes 123, a plurality of projections 127, and a gate shorting bar 124.

Referring to FIGS. 6A and 6B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of projections 154 on the gate insulating layer 140. The gate insulating layer 140 is preferably made of silicon nitride with thickness of about 2,000 Å to about 5,000 Å, and the deposition temperature is preferably in a range between about 250° C. and about 500° C.

Two conductive films, a lower conductive film and an upper conductive film are sputtered in sequence. The lower conductive film is preferably made of Mo, Mo alloy or Cr, and preferably has a thickness of about 500 Å. It is preferable that the upper conductive film has a thickness of about 2,500 Å, the sputtering target for the upper conductive film includes pure Al or Al—Nd containing 2 atomic % Nd, and the sputtering temperature is about 150° C.

Referring to FIGS. 7A and 7B, the upper conductive film and the lower conductive film are wet-etched and dry-etched, respectively, or both the films are wet etched to form a plurality of data lines 171 including a plurality of source electrodes 173, a plurality of drain electrodes 175, a plurality of storage capacitor conductors 177, and a data shorting bar 174. When the lower film is made of Mo or Mo alloy, the upper and the lower layers can be etched under the same etching conditions.

Thereafter, portions of the extrinsic semiconductor stripes 164, which are not covered with the data lines 171, the drain electrodes 175, the storage capacitor conductors 177, and the data shorting bar 174, are removed to complete a plurality of ohmic contact stripes 161 including a plurality of projections 163 and a plurality of ohmic contact islands 165 and to expose portions of the intrinsic semiconductor stripes 151. Oxygen plasma treatment preferably follows thereafter in order to stabilize the exposed surfaces of the semiconductor stripes 151.

As shown in FIG. 8, after depositing a passivation layer 180, a photoresist film 210 is spin-coated on the passivation layer 180. The photoresist film 210 is exposed to light through an exposure mask 300, and developed such that the developed photoresist has a position dependent thickness as shown in FIG. 9B. The photoresist shown in FIG. 9B includes a plurality of first to third portions with decreased thickness. The first portions in areas A1 and the second portions in data contact areas C1 located on the expansions 179 of the data lines 171 and portions of the drain electrodes 175 and the storage capacitor conductors 177 are indicated by reference numerals 212 and 214, respectively, and no reference numeral is assigned to the third portions in gate contact areas B1 located on the expansions 125 of the gate lines 121 since they have substantially zero thickness to expose underlying portions of the passivation layer 180. The portions 214 located on the expansions 125 of the gate lines 121 may have the same thickness as the third portions. Furthermore, the second portions 214 of the photoresist are disposed on a portion of the data shorting bar 174, and the third portions or the second portions 214 of the photoresist are disposed on a portion of the gate shorting bar 124. The thickness ratio of the second portions 214 to the first portions 212 is adjusted depending upon the process conditions in the subsequent process steps.

The position-dependent thickness of the photoresist is obtained by several techniques, for example, by providing translucent areas on the exposure mask 300 as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. In detail, once a photoresist pattern made of a reflowable material is formed by using a normal exposure mask only with transparent areas and opaque areas, it is subject to reflow process to flow onto areas without the photoresist, thereby forming thin portions.

Referring to FIG. 10, the exposure mask 300 according this embodiment has a plurality of slits 310 for forming the second portions 214 of the photoresist. The slits 310 are approximately rectilinear and they have depressions (or projections). The slits 310 extend substantially parallel to each other and they are arranged in their width direction. Each slit 310 has a width in a range of about 0.8-2.0 microns since a slit wider than 2.0 microns may serve as a transparent area. An exposure mask having a slit pattern is easily manufactured with cheap cost and it has a uniform reproductivity.

When aligning the exposure mask 300 with the substrate 110, the slits 310 for the drain electrode 175 are arranged such that their length is substantially parallel to an edge of the drain electrode 175; at least two slits 310 are disposed out of the drain electrode 175, a slit 310 overlaps an edge of the drain electrode 175, and the depressions of the slits 310 overlap edges of the drain electrode 175. The slits 310 for other elements such as the storage capacitor conductors 177, the expansions 179 and shorting bars 124 and 174 are aligned in a similar manner. The width and the distance of the slits 310 for the drain electrodes 175 and the storage capacitor conductors 177 in the display area is preferably different from those for the expansions 179 and the shorting bars 124 and 174 in the peripheral area. Although the above-described alignment is advantageous for obtaining alignment margin of the exposure mask and thickness margin of the second portions 214 of the photoresist and for obtaining uniform thickness of the second portions 214 of the photoresist, there may be other ways of the alignment between the slits 310 and the related elements 175, 177 and 179.

The different thickness of the photoresist 212 and 214 enables to selectively etch the underlying layers when using suitable process conditions. Therefore, a plurality of contact holes 182, 185, 187 and 189 are obtained. The second portions 214 may be disposed on any contact holes and they prevent the gate insulating layer 140 at the contact holes 185, 187 and 189 exposing the drain electrodes 175, the storage capacitor electrodes 177, and the expansions 179 of the data lines 171 from being etched, thereby preventing undercut at the contact holes 185, 187 and 189.

For descriptive purpose, portions on the areas A1 are called first portions, portions of the passivation layer 180, the drain electrodes 175, the storage capacitor conductors 177, the data lines 171, and the gate insulating layer 140 on the data contact areas C1 are called second portions, and portions of the passivation layer 180, the gate insulating layer 140, and the gate lines 121 on the gate contact areas B1 are called third portions.

An exemplary sequence of forming such a structure is as follows:

As shown in FIG. 11, the exposed third portions of the passivation layer 180 on the gate contact areas B1 are removed by dry etching, preferably under the condition that the etching ratios for the passivation layer 180 and the photoresist 212 and 214 are substantially equal such that the second portions 214 of the photoresist can be also removed or can be remained with reduced thickness for next etching step. Although the dry etching may etch out the top portions of the second portions of the passivation layer 180 and the third portions of the gate insulating layer 140, it is preferable that the thickness of the third portions of the gate insulating layer 140 is smaller than that of the second portions of the passivation layer 180 so that the second portions of the gate insulating layer 140 may not be removed in later steps and thus the undercut can be prevented. Residue of the second portions 214 of the photoresist remained on the data contact areas C1 is removed by ashing to completely expose the second portions of the passivation layer 180.

Referring to FIG. 12, the third portions of the gate insulating layer 140 and the second portions of the passivation layer 180 are removed to complete the contact holes 182, 185, 187 and 189. The removal of those portions are made by dry etching under the condition that the etching ratios for the gate insulating layer 140 and the passivation layer 180 are substantially equal.

Subsequently, the third portions of the upper film $125q$ of the expansions 125 of the gate lines 121 and the second portions of the upper films $175q$, $177q$ and $179q$ of the drain electrodes 175, the storage capacitor conductors 177, and the expansions 179 of the data lines 171 are removed to expose the underlying lower films $125p$, $175q$, $177p$ and $179p$.

Finally, as shown in FIGS. 1-4, a plurality of pixel electrodes 191, a plurality of contact assistants 192 and 199, and a shorting bar connection 194 are formed on the passivation layer 180 by sputtering and photo-etching an ITO or IZO layer. Since there is no undercut under the drain electrodes 175, the storage capacitor conductors 177, and the expansions 125 and 179, the profiles of the pixel electrodes 179 and the contact assistants 192 and 199 become smooth. In addition, since the pixel electrodes 191 and the contact assistants 192 and 199 are in contact with the lower films $175p$ and $177p$ of the drain electrodes 175 and the storage capacitor conductors 177 and the lower films 125 and 179 of the gate lines 121 and the data lines 171, which have good contact characteristics with ITO and IZO, the contact resistance at contact portions is reduced.

In the TFT array panel according to an embodiment of the present invention, the gate lines 121 and the data lines 171 include Al or Al alloy with low resistivity while they have minimized contact resistance between the pixel electrodes 191 and the contact assistants 192 and 199. In addition, the smooth profile of the contact assistants 192 and 199 increases the reliability of the contact between the contact assistants 192 and 199 and external driving integrated circuit chips.

2nd Embodiment Structure

A TFT array panel for an LCD according to another embodiment of the present invention will be described in detail with reference to FIGS. 13-15.

Figure 13:
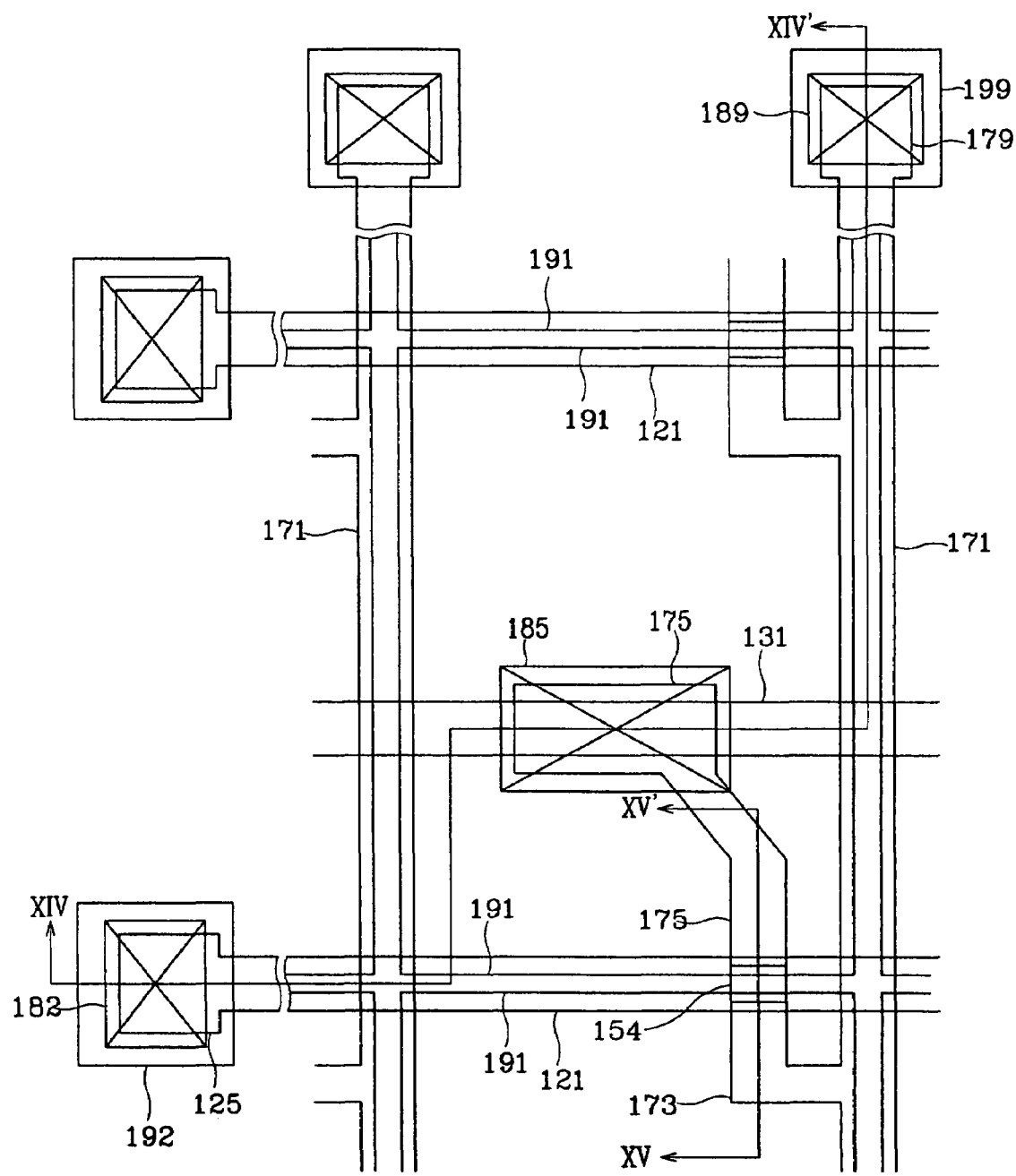
FIG. 13 is a layout view of an exemplary TFT array panel for an LCD according to another embodiment of the present invention.
Figure 14:
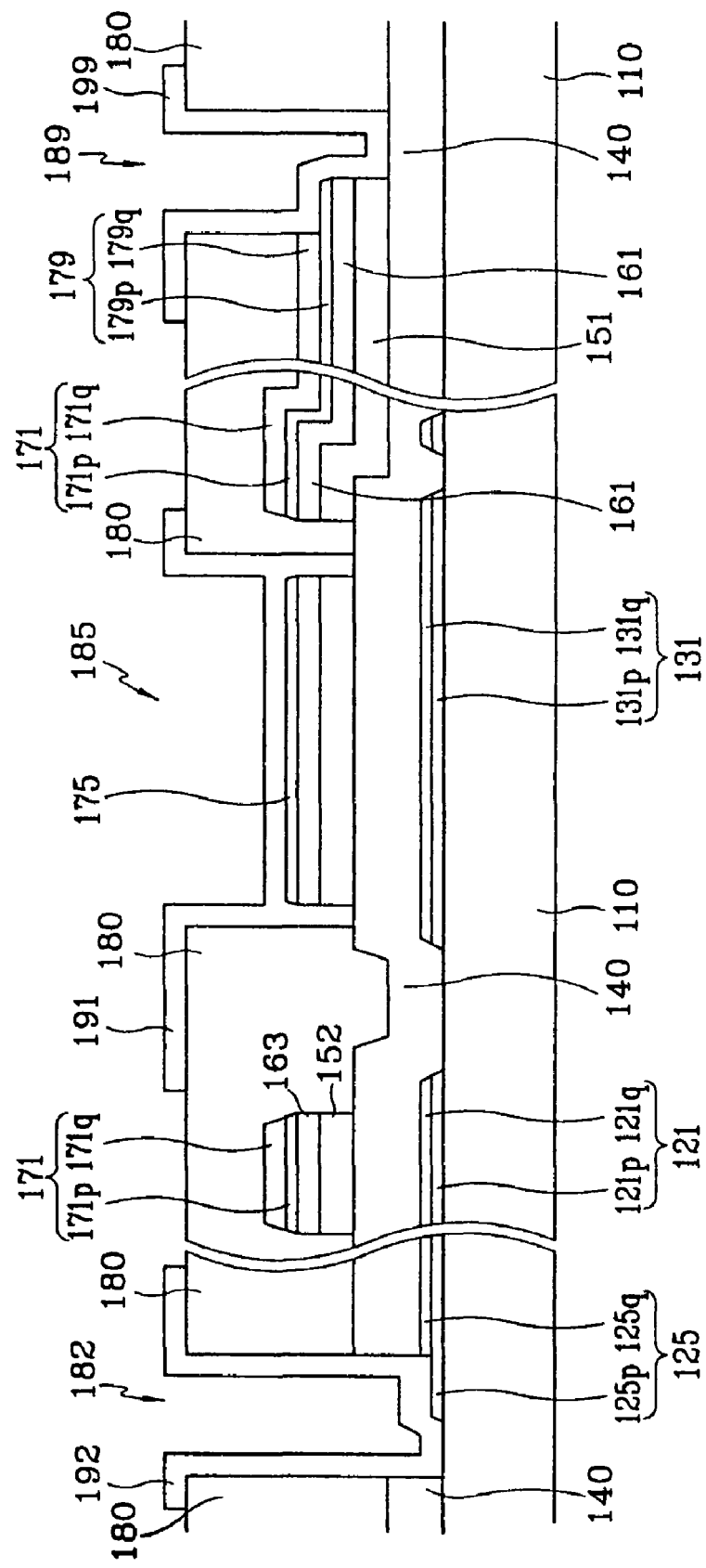
FIGS. 14 and 15 are sectional views of the TFT array panel shown in FIG. 13 taken along the line XIV-XIV' and the line XV-XV', respectively.
Figure 15:
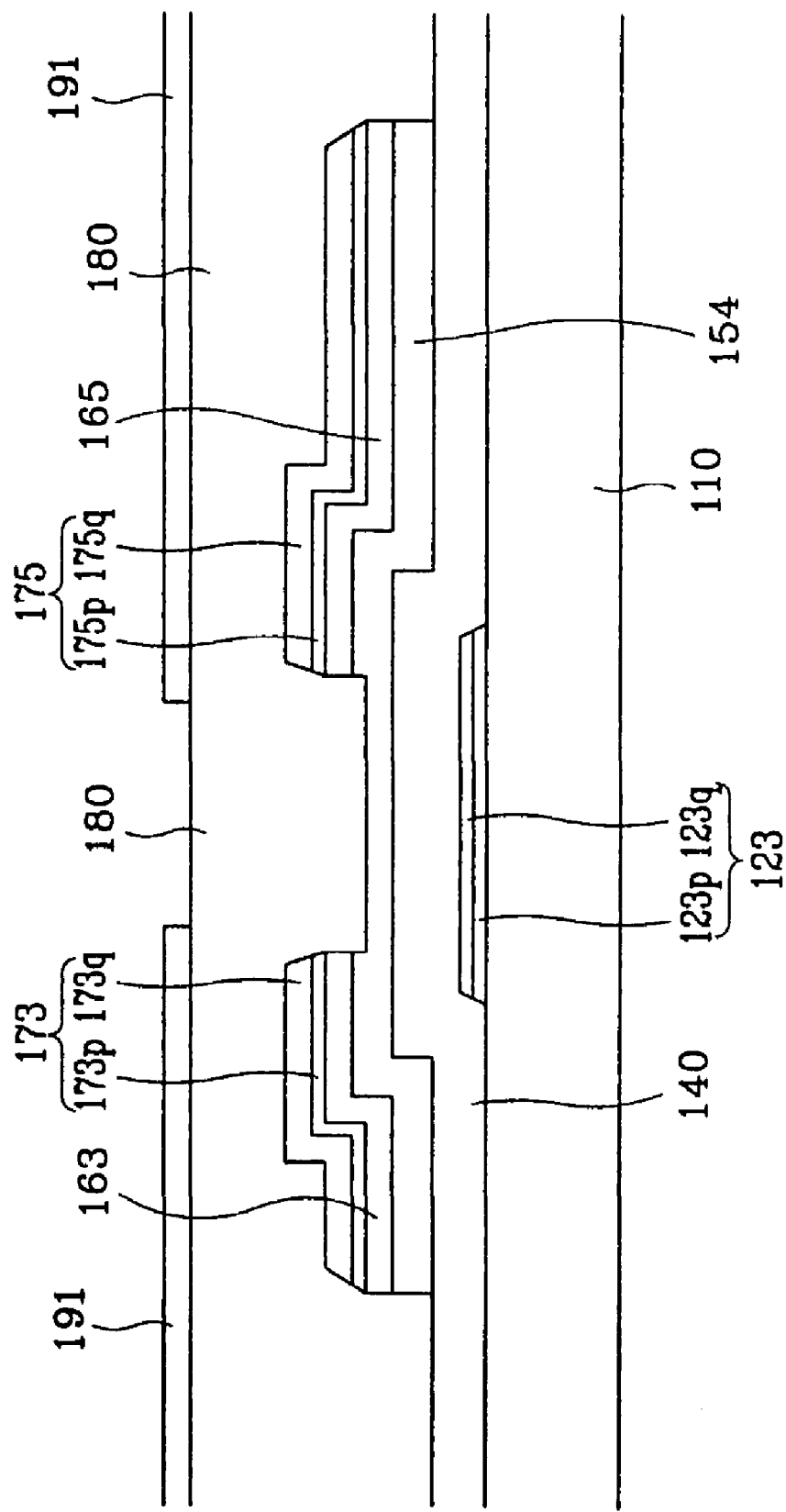

FIG. 13 is a layout view of an exemplary TFT array panel for an LCD according to another embodiment of the present invention, and FIGS. 14 and 15 are sectional views of the TFT array panel shown in FIG. 13 taken along the line XIV-XIV' and the line XV-XV', respectively.

For simplicity, the extensions 126 and 176 shown in FIG. 3 are omitted.

As shown in FIGS. 13-15, a layered structure of a TFT array panel of an LCD according to this embodiment is almost the same as that shown in FIGS. 3 and 4. That is, a plurality of gate lines 121 including a plurality of gate electrodes 123 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 are formed on the ohmic contacts 161 and 165, and a passivation layer 180 is formed thereon. A plurality of contact holes 182, 185 and 189 are provided at the passivation layer 180 and/or the gate insulating layer 140, and a plurality of pixel electrodes 191 and a plurality of contact assistants 192 and 199 are formed on the passivation layer 180.

Different from the TFT array panel shown in FIGS. 3 and 4, the TFT array panel according to this embodiment provides a plurality of storage electrode lines 131, which are separated from the gate lines 121, on the same layer as the gate lines 121 without projections. The storage electrode lines 131 include, like the gate lines 121, a lower film 131p and an upper film 131q. The storage electrode lines 131 are supplied with a predetermined voltage such as the common voltage. Without providing the storage capacitor conductors 177 shown in FIGS. 3 and 4, the drain electrodes 175 extend to overlap the storage electrode lines 131 to form storage capacitors. The storage electrode lines 131 may be omitted if the storage capacitance generated by the overlapping of the gate lines 121 and the pixel electrodes 191 is sufficient.

Furthermore, the contact holes 182 and 189 exposes portions of expansions 125 and 179 of the gate lines 121 and the data lines 175 instead of exposing all portions of the expansions 125 and 179 such that some portions of a upper film 125q and 179q are remained.

The semiconductor stripes 151 have almost the same planar shapes as the data lines 171 and the drain electrodes 175 as well as the underlying ohmic contacts 161 and 165, except for the projections 154 where TFTs are provided. That is, the semiconductor stripes 151 include some exposed portions, which are not covered with the data lines 171 and the drain electrodes 175, such as portions located between the source electrodes 173 and the drain electrodes 175.

2nd Embodiment Method

Now, a method of manufacturing the TFT array panel shown in FIGS. 13-15 according to an embodiment of the present invention will be described in detail with reference to FIGS. 16A-25B as well as FIGS. 13-15.

Figure 16A:
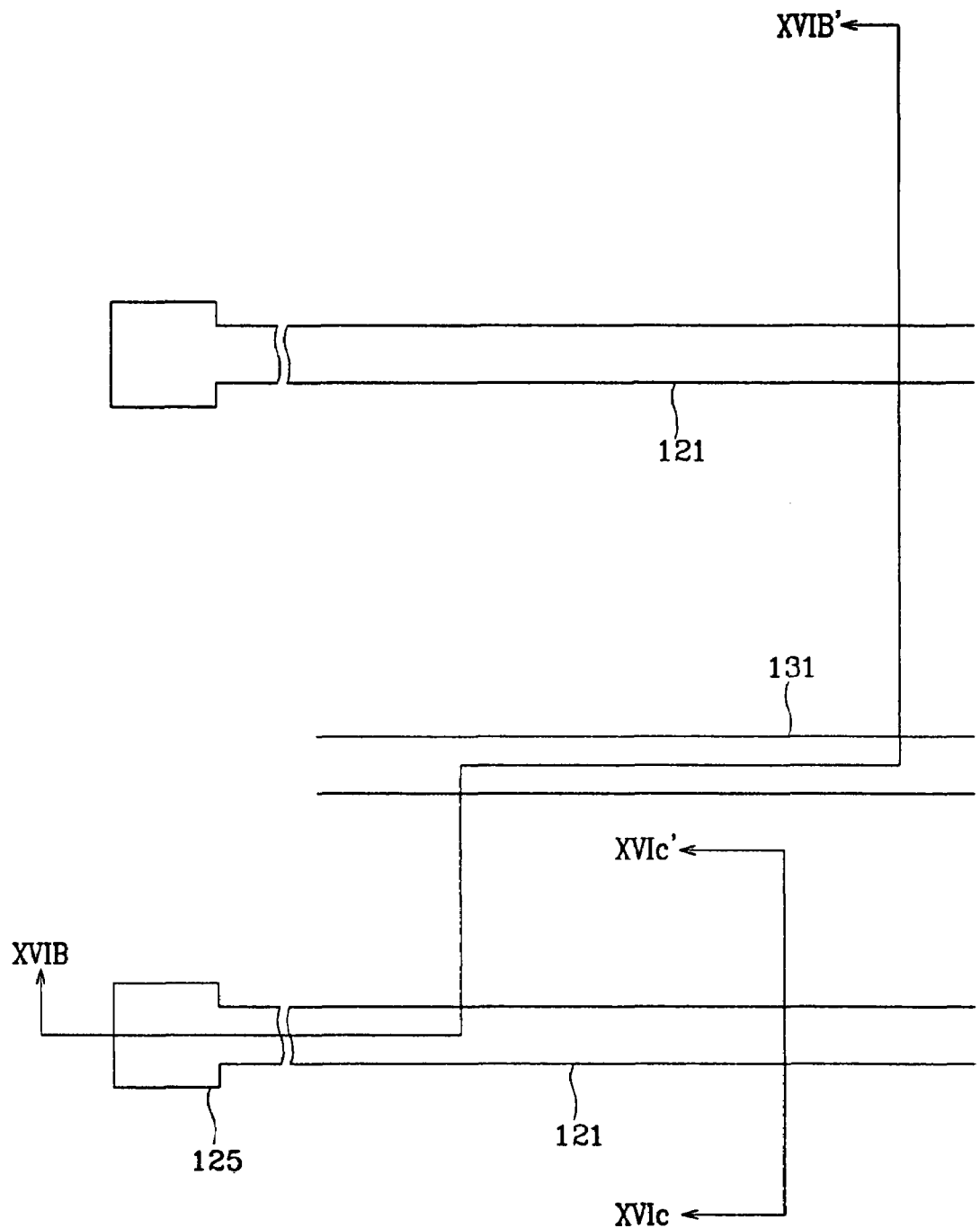
FIG. 16A is a layout view of a TFT array panel shown in FIGS. 13-15 in the first step of a manufacturing method thereof according to an embodiment of the present invention.
Figure 16B:
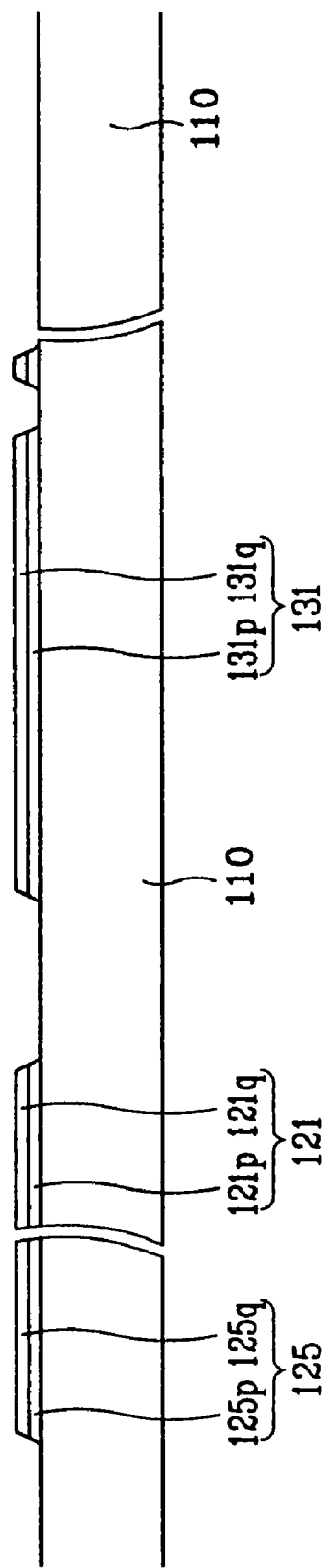
Figure 17A:
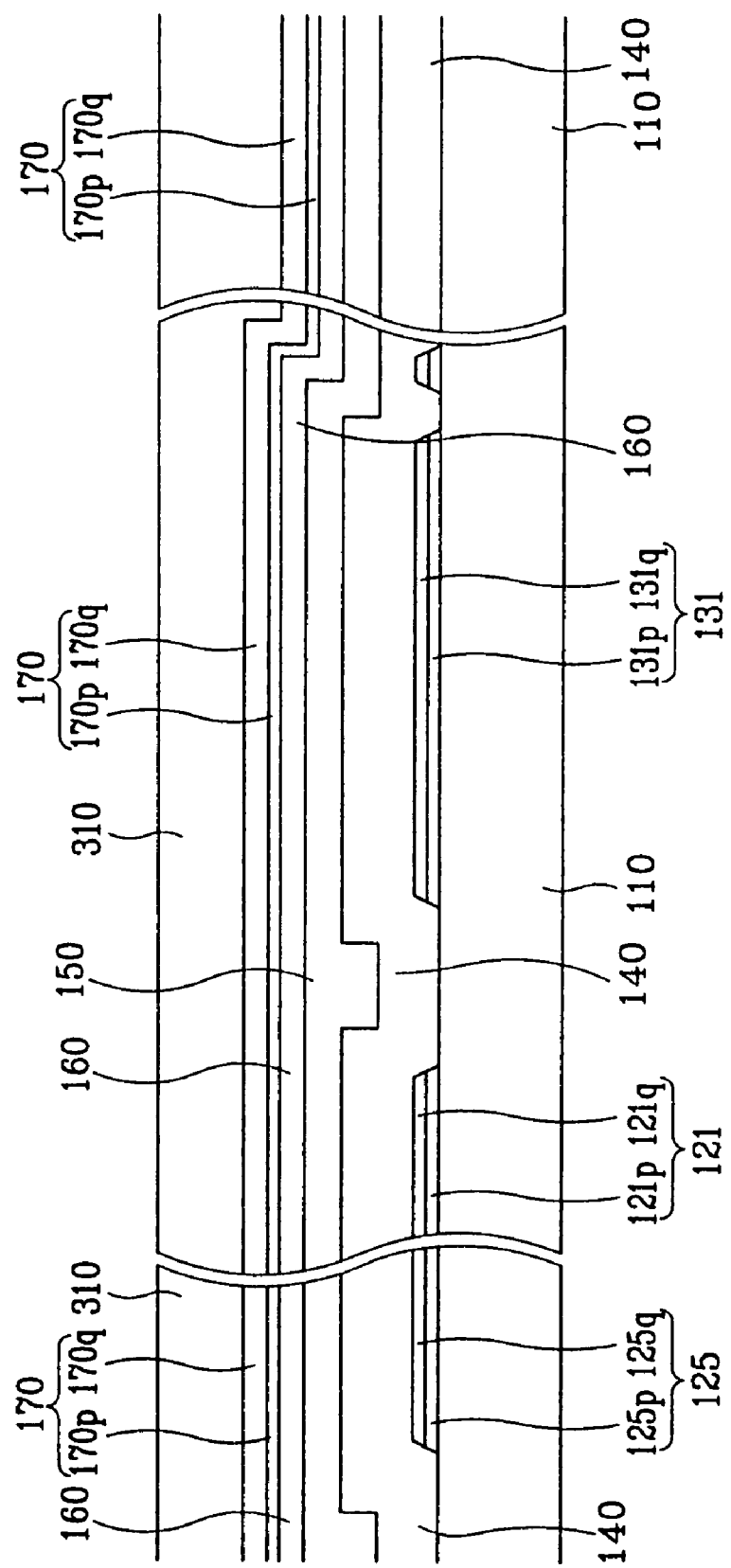
FIGS. 17A and 17B are sectional views of the TFT array panel shown in FIG. 16A taken along the lines XVIB-XVIB' and XVIC-XVIC', respectively, and illustrate the step following the step shown in FIGS. 16B and 16C.
Figure 17B:
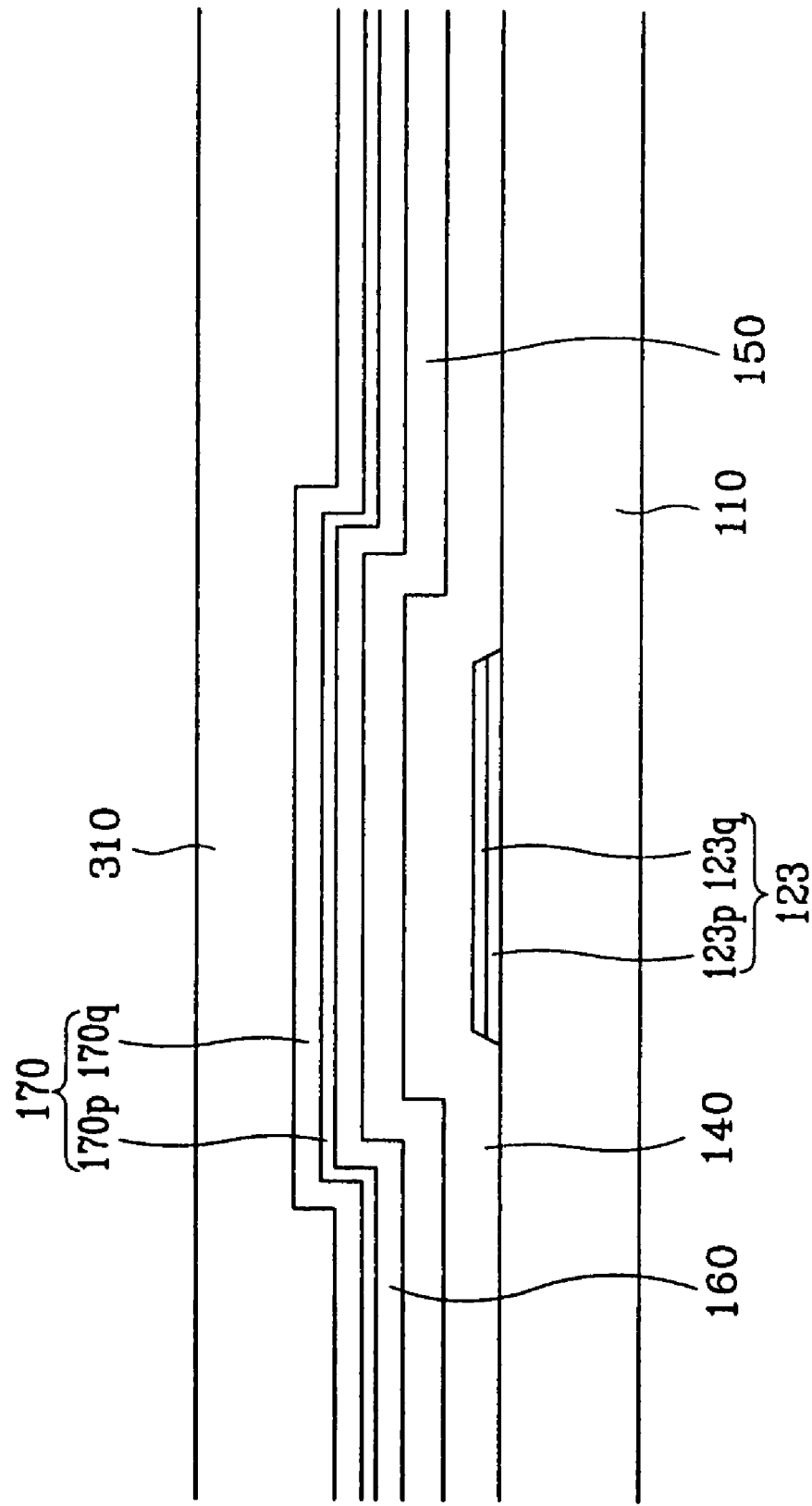
Figure 18A:
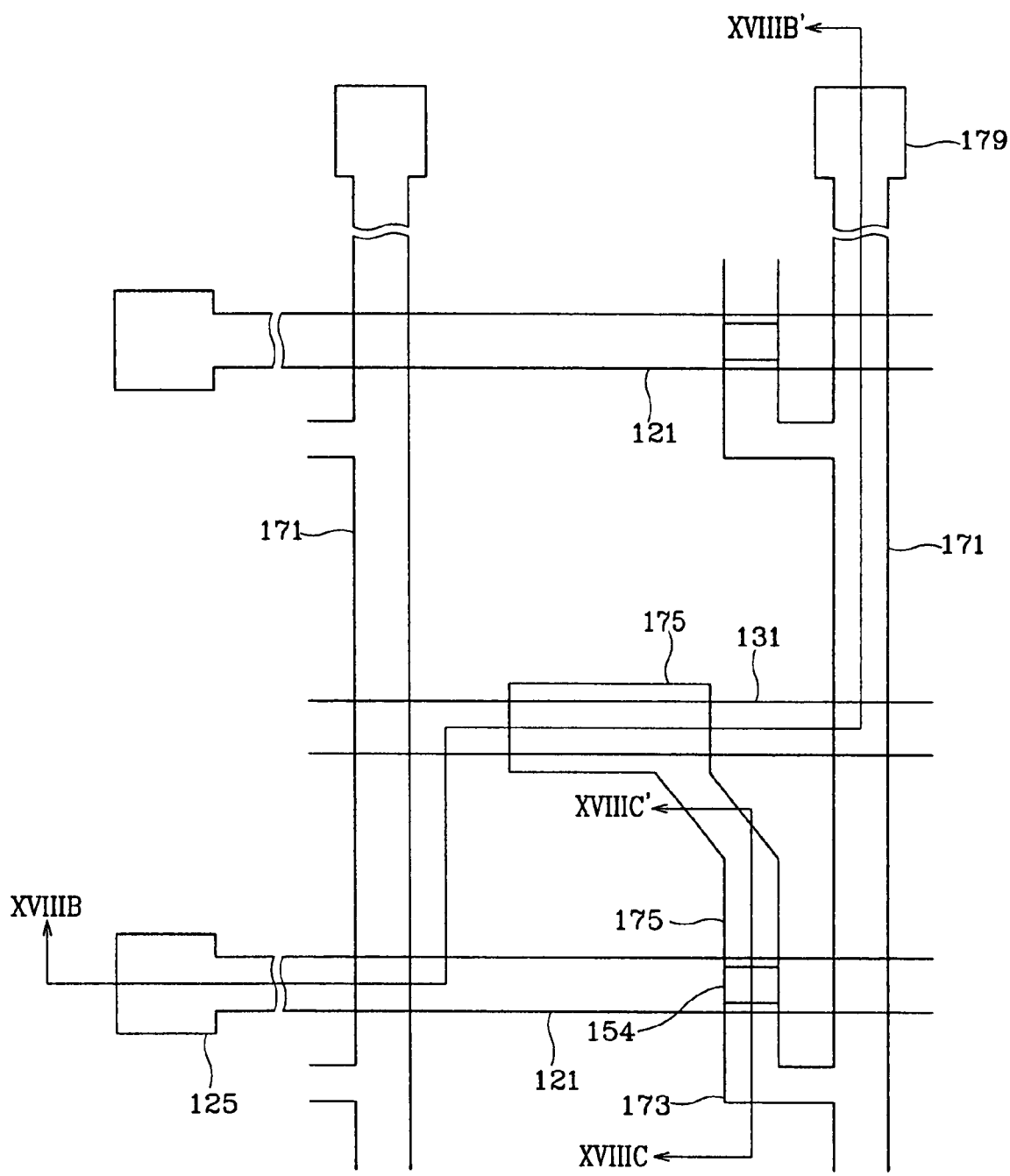
FIG. 18A is a layout view of the TFT array panel in the step following the step shown in FIGS. 17A and 17B.
Figure 18B:
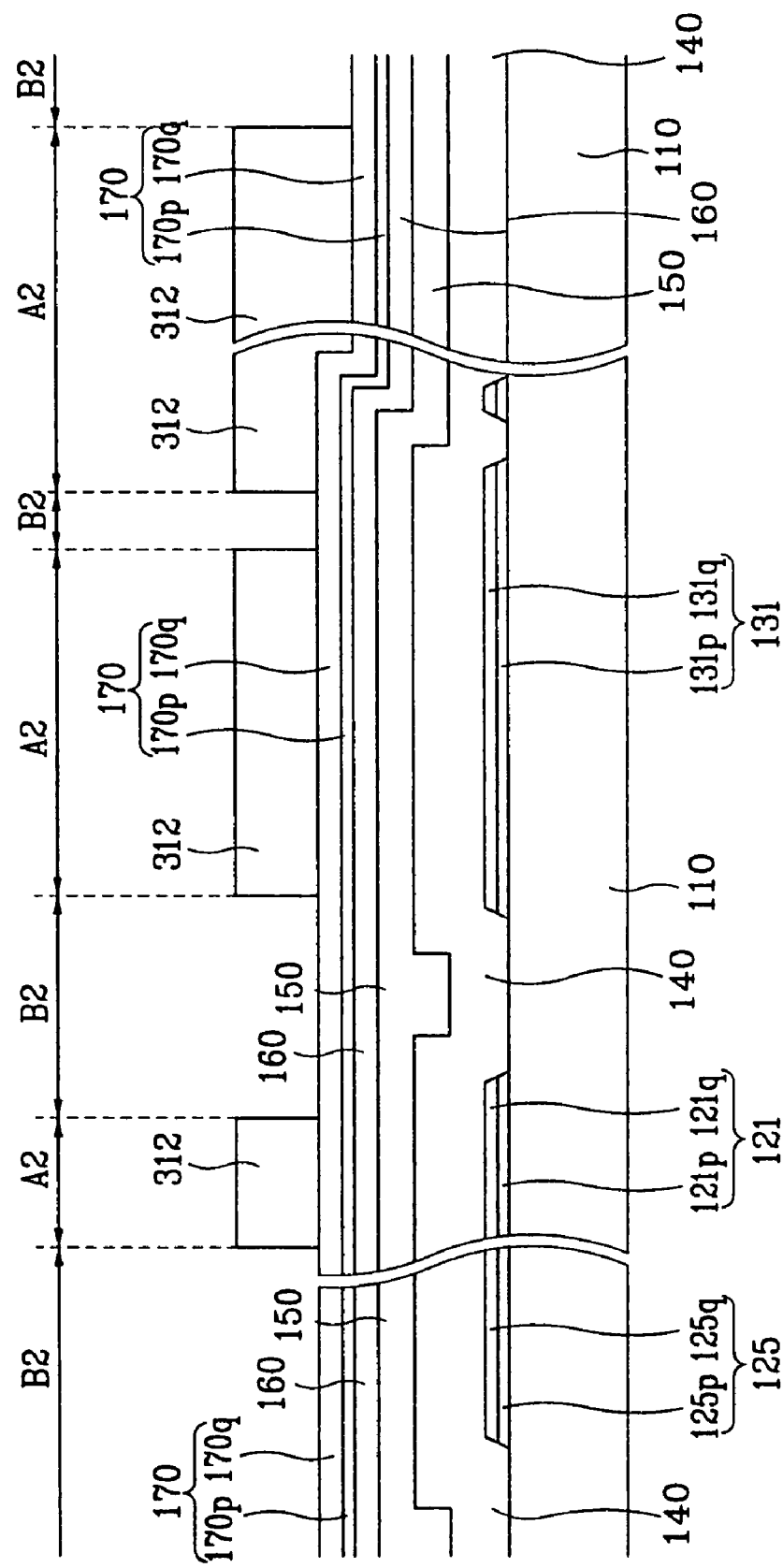
FIGS. 18B and 18C are sectional views of the TFT array panel shown in FIG. 18A taken along the lines XVIIIB-XVIIIB' and XVIIIC-XVIIIC', respectively.
Figure 18C:
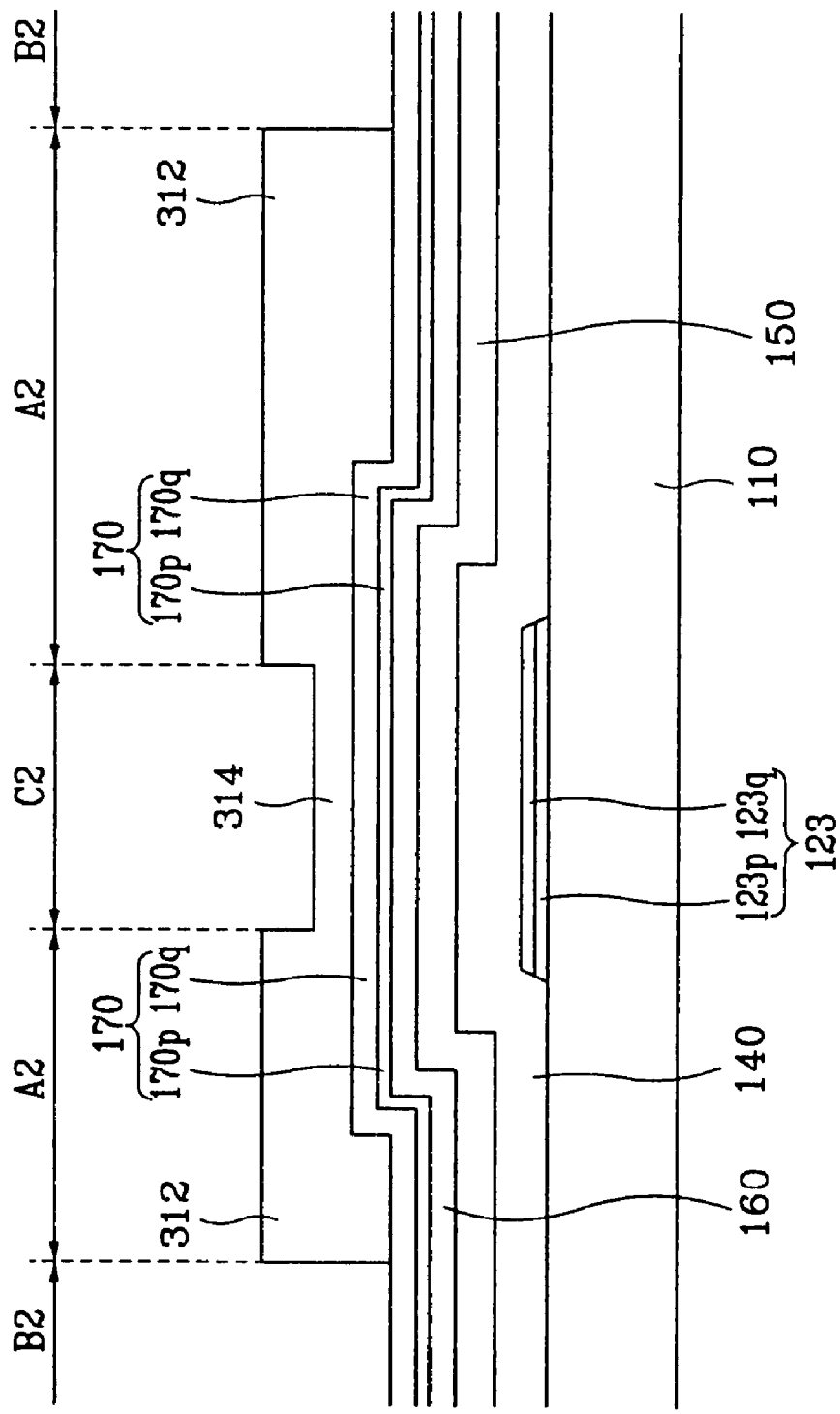
Figure 22A:
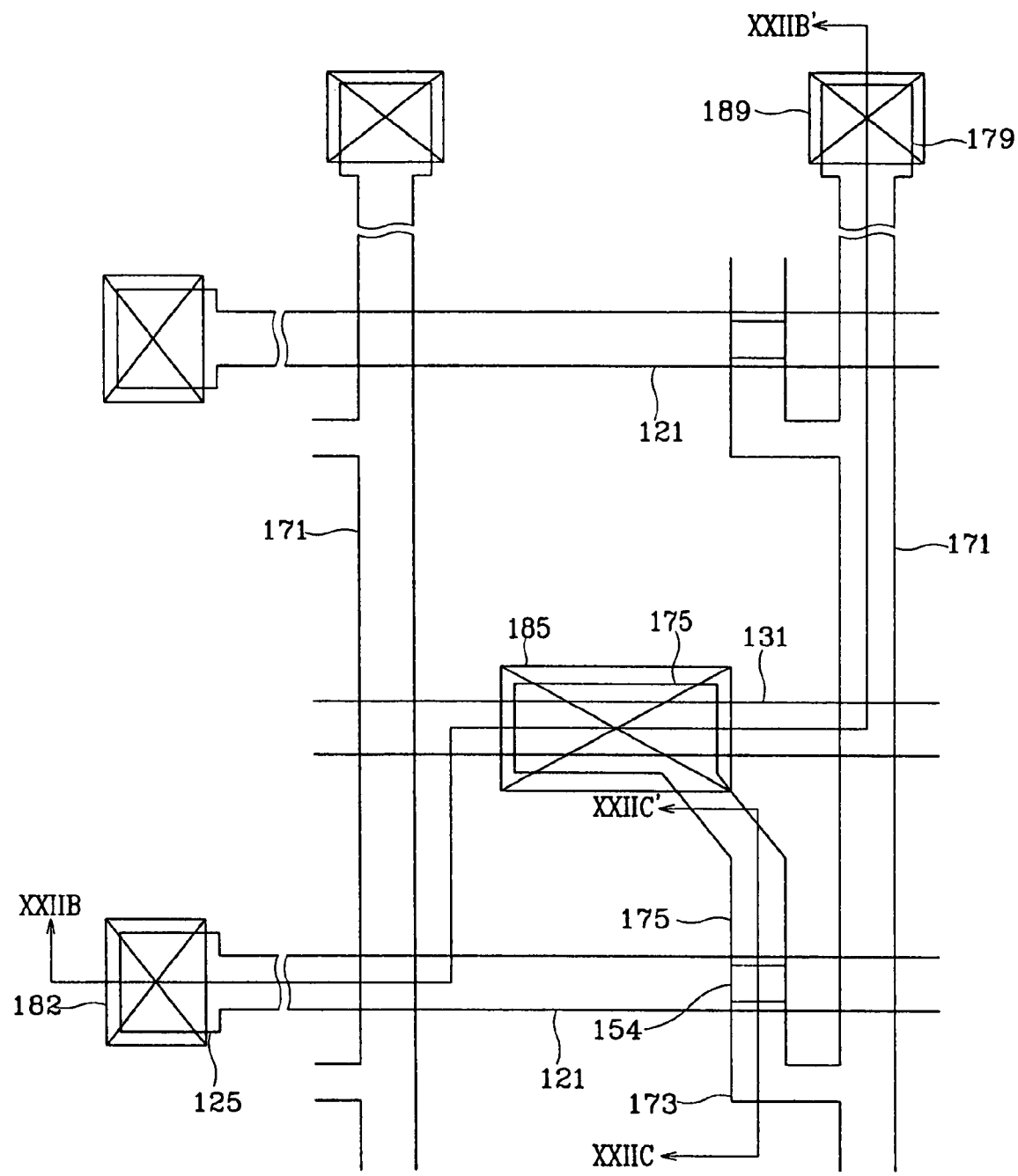
FIG. 22A is a layout view of a TFT array panel in the step following the step shown in FIGS. 21A and 21B.
Figure 22B:
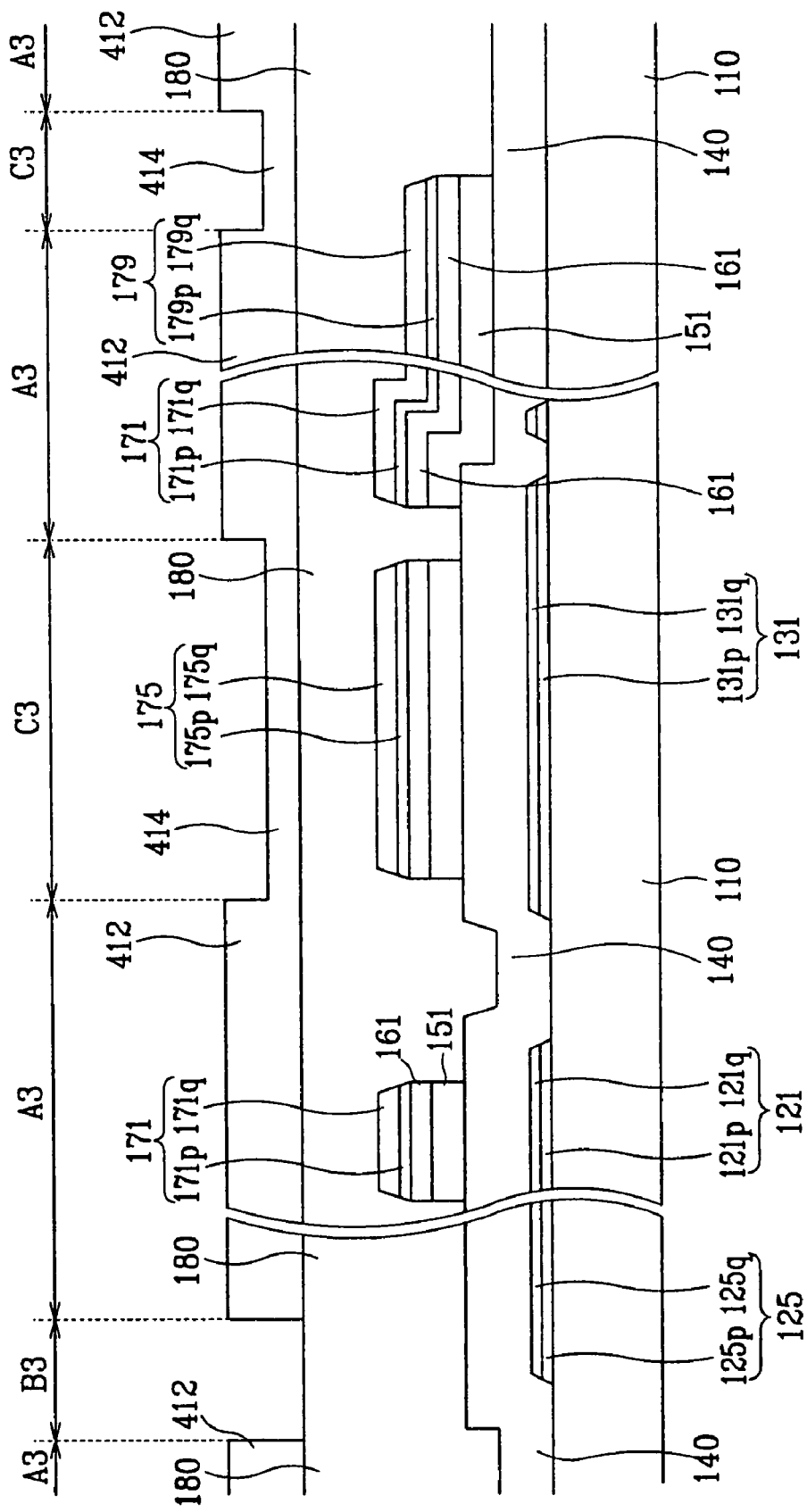

FIG. 16A is a layout view of a TFT array panel shown in FIGS. 13-15 in the first step of a manufacturing method thereof according to an embodiment of the present invention; FIGS. 16B and 16C are sectional views of the TFT array panel shown in FIG. 16A taken along the lines XVIB-XVIB' and XVIC-XVIC', respectively; FIGS. 17A and 17B are sectional views of the TFT array panel shown in FIG. 16A taken along the lines XVIB-XVIB' and XVIC-XVIC', respectively, and illustrate the step following the step shown in FIGS. 16B and 16C; FIG. 18A is a layout view of the TFT array panel in the step following the step shown in FIGS. 17A and 17B; FIGS. 18B and 18C are sectional views of the TFT array panel shown in FIG. 18A taken along the lines XVIIIB-XVIIIB' and XVIIIC-XVIIIC', respectively; FIGS. 19A, 20A and 21A and FIGS. 19B, 20B and 21B are respective sectional views of the TFT array panel shown in FIG. 18A taken along the lines XVIIIB-XVIIIB' and XVIIIC-XVIIIC', respectively, and illustrate the steps following the step shown in FIGS. 18B and 18C; FIG. 22A is a layout view of a TFT array panel in the step following the step shown in FIGS. 21A and 21B; FIGS. 22B and 22C are sectional views of the TFT array panel shown in FIG. 22A taken along the lines XXIIB-XXIIB' and XXIIC-XXIIC', respectively; and FIGS. 23A, 24A and 25A and FIGS. 23B, 24B and 25B are respective sectional views of the TFT array panel shown in FIG. 22A taken along the lines XXIIB-XXIIB' and XXIIC-XXIIC', respectively, and illustrate the steps following the step shown in FIGS. 22B and 22C.

Referring to FIGS. 16A-16C, a plurality of gate lines 121 including a plurality of gate electrodes 123, a plurality of storage electrode lines 131, and a gate shorting bar 124 are formed on a substrate 110 by photo etching. The gate lines 121 and the storage electrode lines 131 as well as the gate shorting bar 124 include lower films 121p and 131p and the upper films 121q and 131q.

As shown in FIGS. 17A and 17B, a gate insulating layer 140, an intrinsic a-Si layer 150, and an extrinsic a-Si layer 160 are sequentially deposited by CVD such that the layers 140, 150 and 160 bear thickness of about 1,500-5,000 Å, about 500-2,000 Å and about 300-600 Å, respectively. A conductive layer 170 including a lower film 170p and an upper film 170q having a thickness of about 1,500-3,000 Å is deposited by sputtering, and a photoresist film 310 with the thickness of about 1-2 microns is coated on the conductive layer 170.

The photoresist film 310 is exposed to light through an exposure mask (not shown), and developed such that the developed photoresist has a position dependent thickness. The photoresist shown in FIGS. 18B and 18C includes a plurality of first to third portions with decreased thickness. The first portions located on wire areas A2 and the second portions located on channel areas C2 are indicated by reference numerals 312 and 314, respectively, and no reference numeral is assigned to the third portions located on remaining areas B2 since they have substantially zero thickness to expose underlying portions of the conductive layer 170.

The different thickness of the photoresist 312 and 314 enables to selectively etch the underlying layers when using suitable process conditions. Therefore, a plurality of data lines 171 including a plurality of source electrodes 173, a plurality of drain electrodes 175, and a data shorting bar 174 as well as a plurality of ohmic contact stripes 161 including a plurality of projections 163, a plurality of ohmic contact islands 165 and a plurality of semiconductor stripes 151 including a plurality of projections 154 are obtained by a series of etching steps.

For descriptive purpose, portions of the conductive layer 170, the extrinsic a-Si layer 160, and the intrinsic a-Si layer 150 on the wire areas A2 are called first portions, portions of the conductive layer 170, the extrinsic a-Si layer 160, and the intrinsic a-Si layer 150 on the channel areas C2 are called second portions, and portions of the conductive layer 170, the extrinsic a-Si layer 160, and the intrinsic a-Si layer 150 on the remaining areas B2 are called third portions.

An exemplary sequence of forming such a structure is as follows:

(1) Removal of third portions of the conductive layer 170, the extrinsic a-Si layer 160 and the intrinsic a-Si layer 150 on the wire areas A2;

(2) Removal of the second portions 314 of the photoresist;

(3) Removal of the second portions of the conductive layer 170 and the extrinsic a-Si layer 160 on the channel areas C2; and (4) Removal of the first portions 312 of the photoresist.

Another exemplary sequence is as follows:

(1) Removal of the third portions of the conductive layer 170;

(2) Removal of the second portions 314 of the photoresist;

(3) Removal of the third portions of the extrinsic a-Si layer 160 and the intrinsic a-Si layer 150;

(4) Removal of the second portions of the conductive layer 170;

(5) Removal of the first portions 312 of the photoresist; and (6) Removal of the second portions of the extrinsic a-Si layer 160.

The first example is described in detail.

Figure 19A:
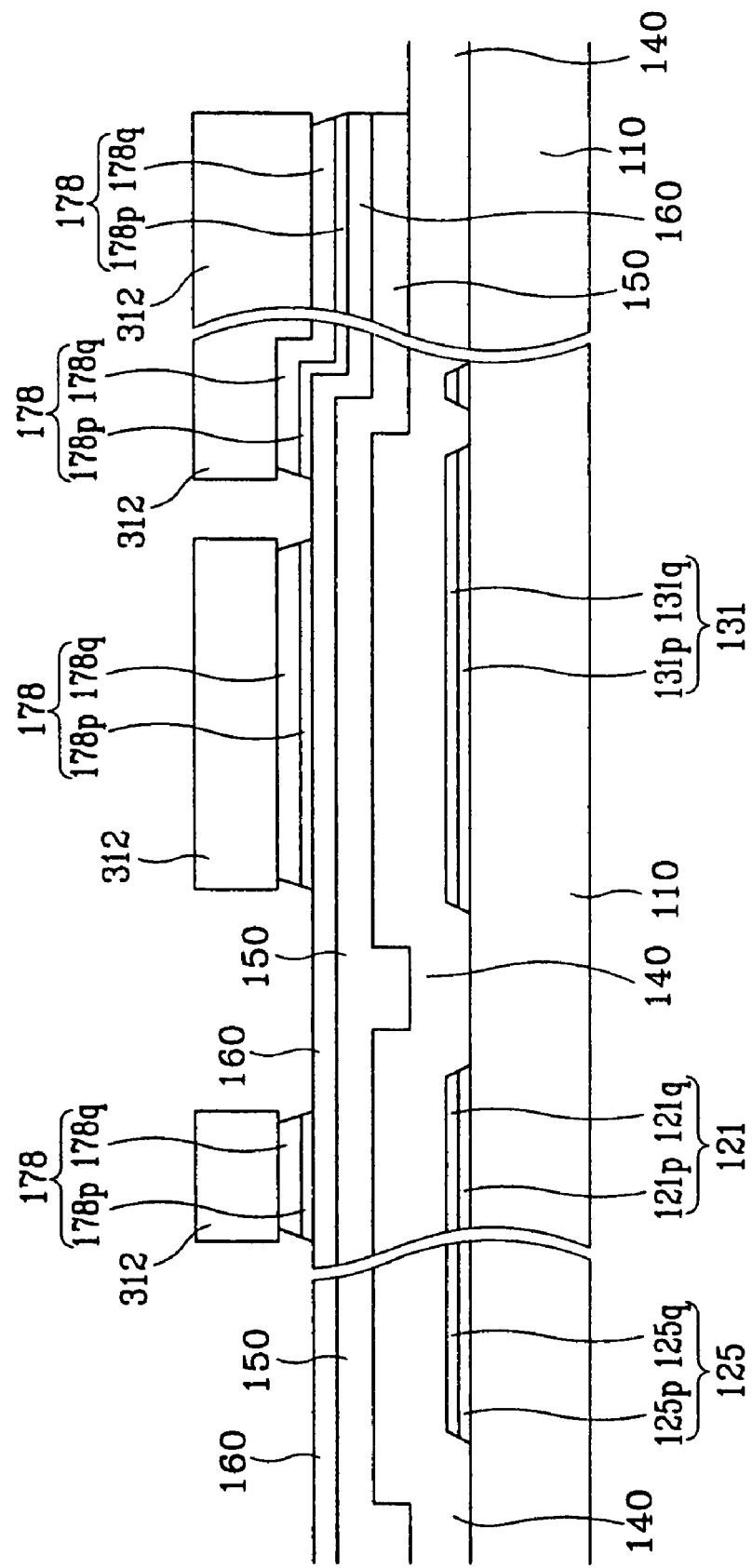

As shown in FIGS. 19A and 19B, the exposed third portions of the conductive layer 170 on the remaining areas B2 are removed by wet etching or dry etching to expose the underlying third portions of the extrinsic a-Si layer 160. A Mo, MoW, Al, Ta or Ta film can be etched by any of dry etching and wet etching, while a Cr film is hardly etched by dry etching. When the lower film 170p is made of Cr, wet etching with an etchant of CeNHO$_3$ can be used. When the lower film 170p is Mo or MoW, a gas mixture of CF$_4$ and HCl or a gas mixture of CF$_4$ and O2 can be used and the latter gas mixture etches the photoresist by an etching ratio similar to that of the conductive film.

Reference numeral 178 indicates portions of the conductive layer 170 including the data lines 171 and the drain electrode 175 connected to each other. The dry etching may etch out the top portions of the photoresist 312 and 314.

Figure 20A:
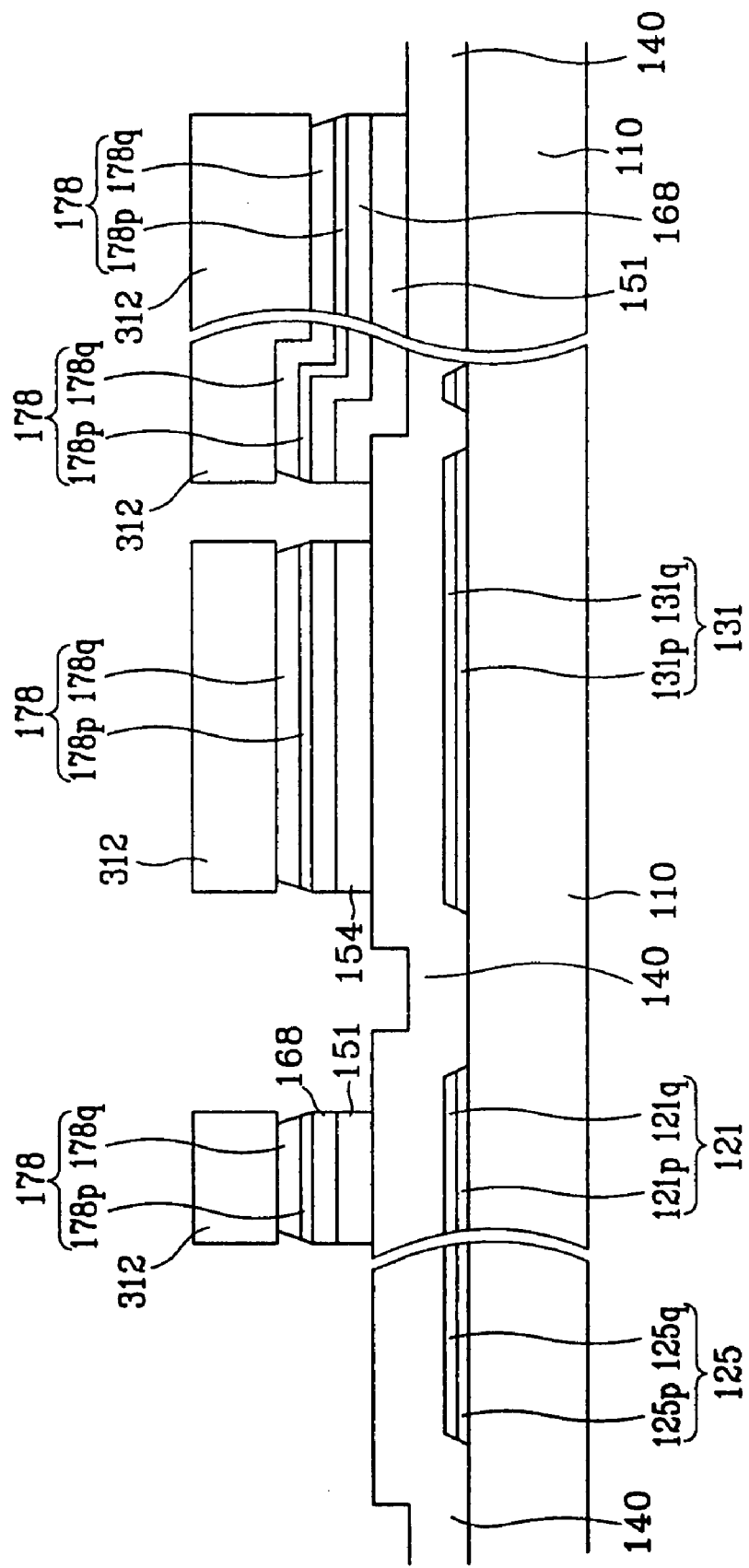

Referring to FIGS. 20A and 20B, the third portions of the extrinsic a-Si layer 160 on the areas B2 and of the intrinsic a-Si layer 150 are removed preferably by dry etching and the second portions 314 of the photoresist are removed to expose the second portions of the conductors 178. The removal of the second portions 314 of the photoresist are performed either simultaneously with or independent from the removal of the third portions of the extrinsic a-Si layer 160 and of the intrinsic a-Si layer 150. A gas mixture of SF$_6$ and HCl or a gas mixture of SF$_6$ and O$_2$ can etch the a-Si layers 150 and 160 and the photoresist by nearly the same etching ratio. Residue of the second portions 314 of the photoresist remained on the channel areas C2 is removed by ashing.

The semiconductor stripes 151 are completed in this step, and reference numeral 164 indicates portions of the extrinsic a-Si layer 160 including the ohmic contact stripes and islands 161 and 165 connected to each other, which are called "extrinsic semiconductor stripes."

As shown in FIGS. 21A and 21B, the second portions of the conductors 178 and the extrinsic a-Si stripes 164 on the channel areas C2 as well as the first portion 312 of the photoresist are removed.

Both the conductors 178 and the extrinsic semiconductor stripes 164 may be dry etched with a gas mixture of SF$_6$ and O$_2$.

Alternatively, the conductors 178 are dry etched, while the extrinsic semiconductor stripes 164 are dry etched. Since lateral sides of the conductors 178 are also dry etched, while lateral sides of the extrinsic semiconductor stripes 164 are hardly etched, step-wise lateral profiles are obtained. Examples of the gas mixtures are CF$_4$ and HCl and CF$_4$ and O$_2$, as described above. The latter gas mixture leaves uniform thickness of the intrinsic semiconductor stripes 151.

As shown in FIG. 21B, top portions of the projections 154 of the intrinsic semiconductor stripes 151 on the channel areas C2 may be removed to cause thickness reduction, and the first portions 312 of the photoresist are etched to a predetermined thickness.

In this way, each conductor 178 is divided into a data line 171 and a plurality of drain electrodes 175 to be completed, and each extrinsic semiconductor stripe 164 is divided into an ohmic contact stripe 161 and a plurality of ohmic contact islands 165 to be completed.

As shown in FIGS. 22A-22C, after depositing a passivation layer 180, a photoresist film is spin-coated on the passivation layer 180. The photoresist film is exposed to light through an exposure mask (not shown), and developed such that the developed photoresist has a position dependent thickness. The photoresist shown in FIGS. 22B and 22C includes a plurality of first to third portions with decreased thickness. The first portions in areas A3 and the second portions in data contact areas C3 located on the expansions 179 of the data lines 171 and portions of the drain electrodes 175 are indicated by reference numerals 412 and 414, respectively, and no reference numeral is assigned to the third portions in gate contact areas B3 located on the expansions 125 of the gate lines 121 since they have substantially zero thickness to expose underlying portions of the passivation layer 180. The thickness ratio of the second portions 414 to the first portions 412 is adjusted depending upon the process conditions in the subsequent process steps.

The different thickness of the photoresist 412 and 414 enables to selectively etch the underlying layers when using suitable process conditions. Therefore, a plurality of contact holes 182, 185, 187 and 189 are obtained.

For descriptive purpose, portions on the areas A3 are called first portions, portions of the passivation layer 180, the drain electrodes 175, the data lines 171, and the gate insulating layer 140 on the data contact areas C3 are called second portions, and portions of the passivation layer 180, the gate insulating layer 140, and the gate lines 121 on the gate contact areas B3 are called third portions.

Figure 23B:
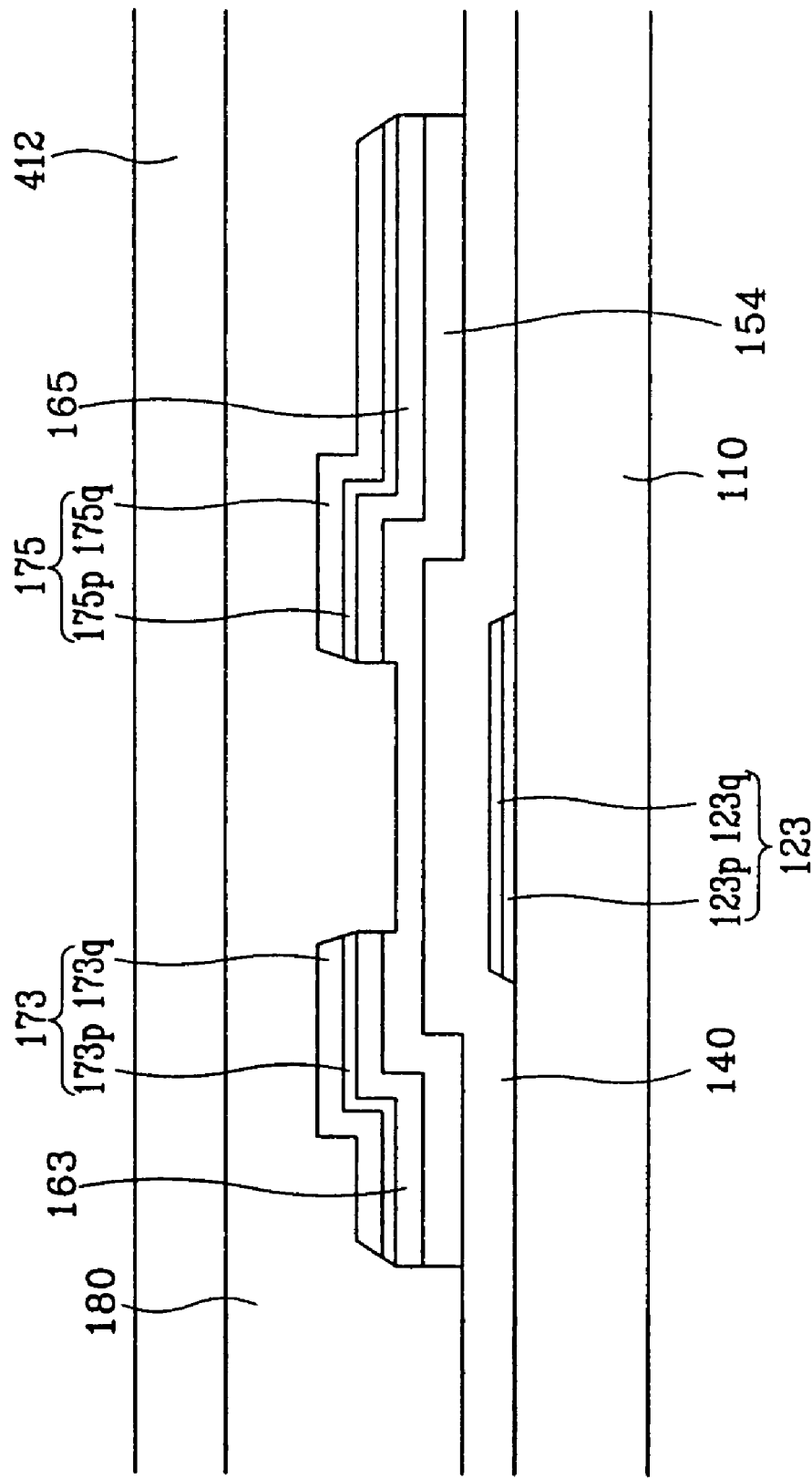

An exemplary sequence of forming such a structure is as follows:

As shown in FIGS. 23A and 23B, the exposed third portions of the passivation layer 180 on the gate contact areas B3 are removed by etching. Although the dry etching may etch out the top portions of the second portions of the passivation layer 180 and the third portions of the gate insulating layer 140, it is preferable that the third portions of the gate insulating layer 140 is thinner than the second portions of the passivation layer 180 so that the second portions of the gate insulating layer 140 may not be removed in later steps. Residue of the second portions 414 of the photoresist remained on the data contact areas C3 is removed by ashing to completely expose the second portions of the passivation layer 180.

Figure 24A:
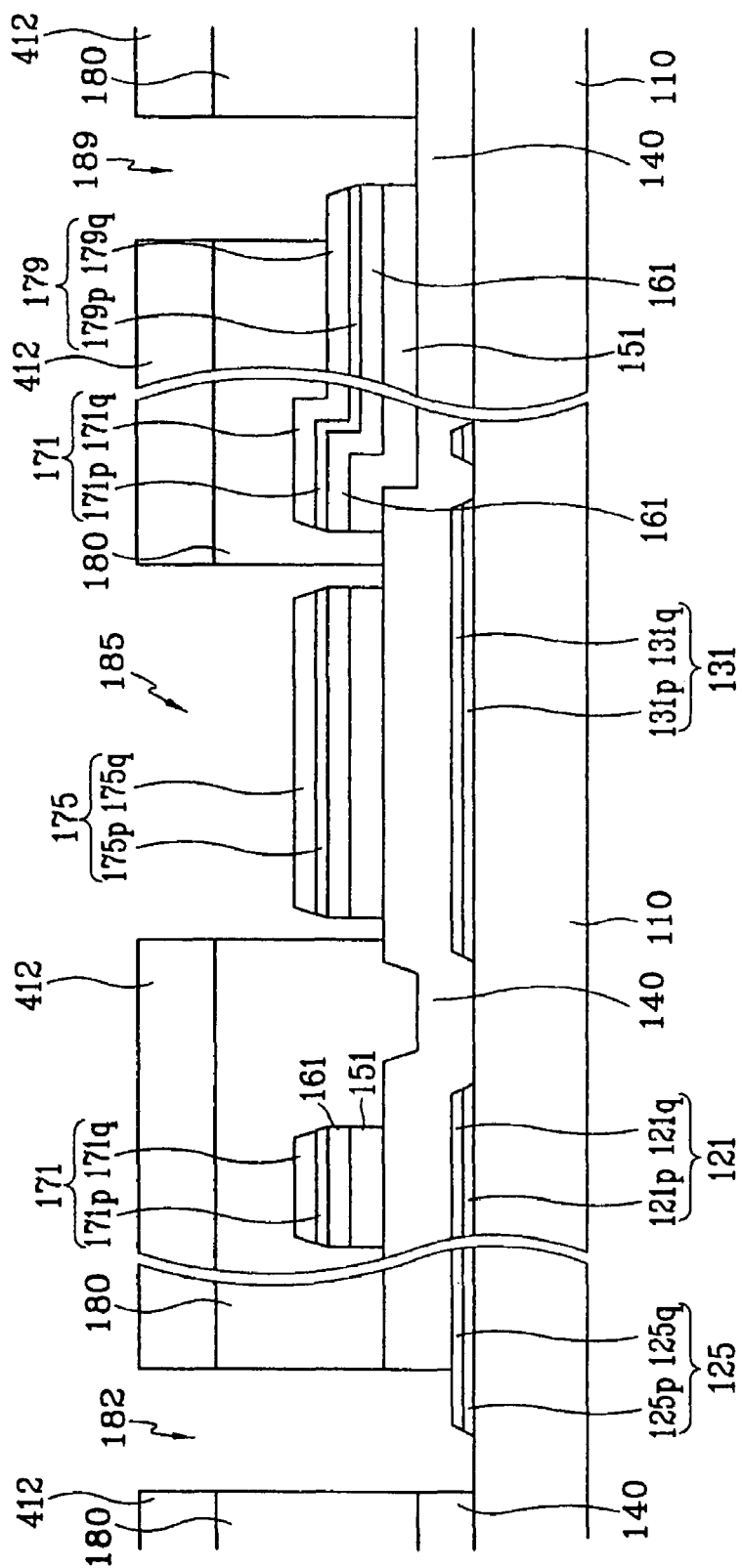
Figure 24B:
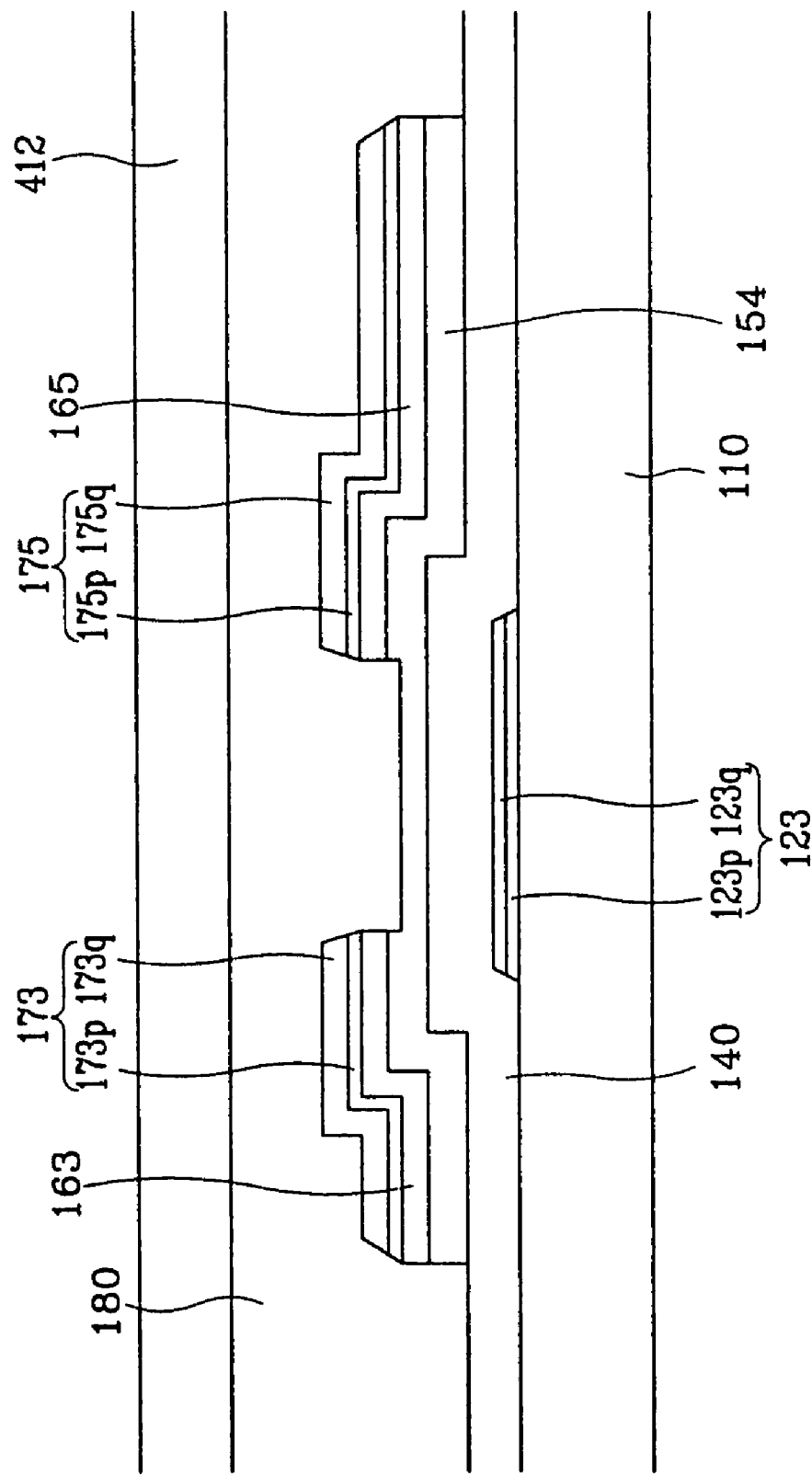

Referring to FIGS. 24A and 24B, the third portions of the gate insulating layer 140 and the second portions of the passivation layer 180 are removed to complete the contact holes 182, 185 and 189. The removal of those portions are made by dry etching under the condition that the etching ratios for the gate insulating layer 140 and the passivation layer 180 are substantially equal. Since the thickness of the third portions of the gate insulating layer 140 is smaller than that of the second portions of the passivation layer 180, the third portions of the gate insulating layer 140 and the second portions of the passivation insulating layer 180 are completely removed, and simultaneously, the second portions of the gate insulating layer 140 are remained to prevent the undercut of the gate insulating layer 140 under the drain electrodes 175.

Figure 25A:
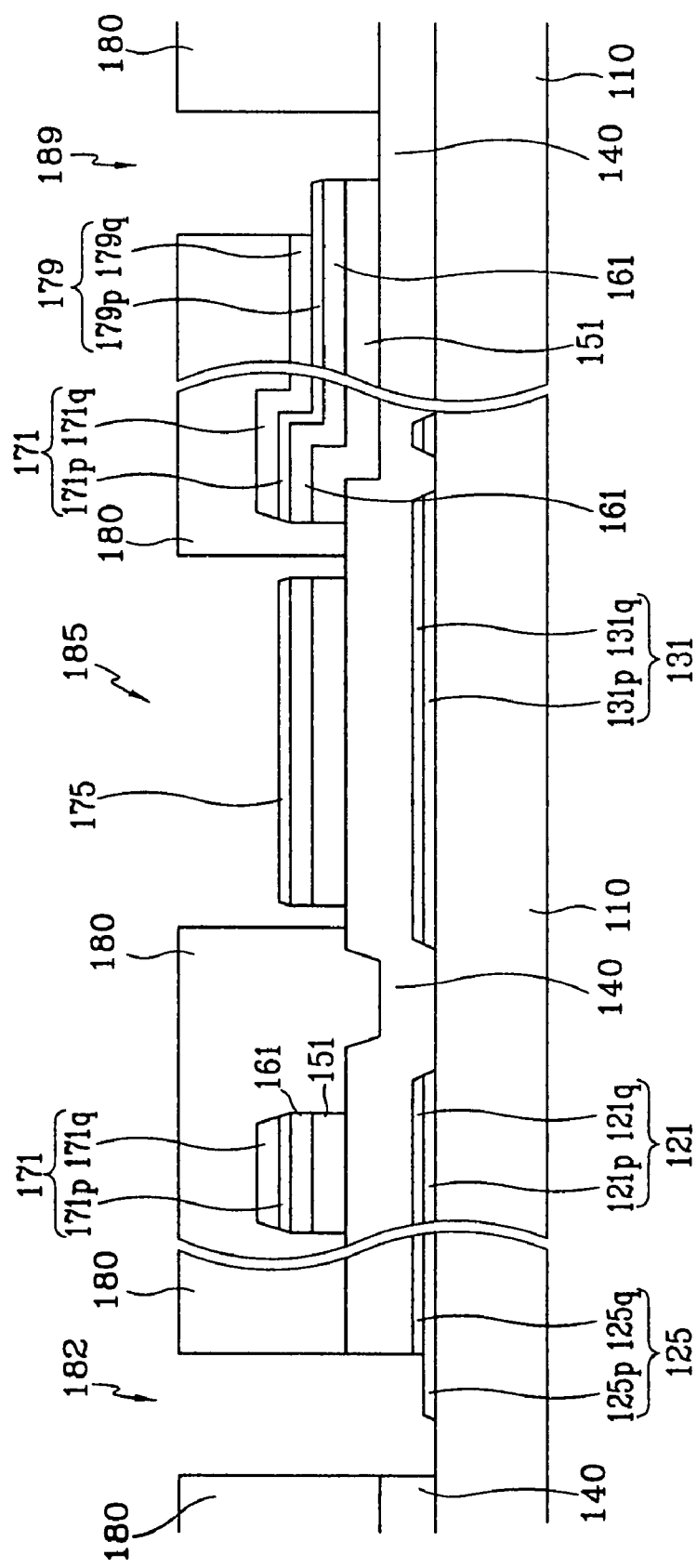

As shown in FIGS. 25A and 25B, after removing the photoresist 412 and 414, the third portions of the upper film 125q of the expansions 125 of the gate lines 121 and the second portions of the upper films 175q and 179q of the drain electrodes 175, and the expansions 179 of the data lines 171 are removed to expose the underlying lower films 125p, 175p and 179p.

Finally, as shown in FIGS. 13 to 15, an ITO or IZO layer with a thickness in a range between about 500 Å and about 1,500 Å is sputtered and photo-etched to form a plurality of pixel electrodes 191, a plurality of contact assistants 192 and 199, and a shorting bar connection 194. The etching of the IZO layer preferably includes wet etching using a Cr etchant of $HNO_3/(NH_4)_2Ce(NO_3)_6/H_2O$, which does not erode Al of the data lines 171 and the drain electrodes 175.

This embodiment simplifies the manufacturing process by forming the data lines 171 and the drain electrodes 175 as well as the ohmic contacts 161 and 165 and the semiconductor stripes 151 and using a single photolithography step.

3rd Embodiment Structure

A TFT array panel for an LCD according to another embodiment of the present invention will be described in detail with reference to FIGS. 26 and 27.

Figure 26:
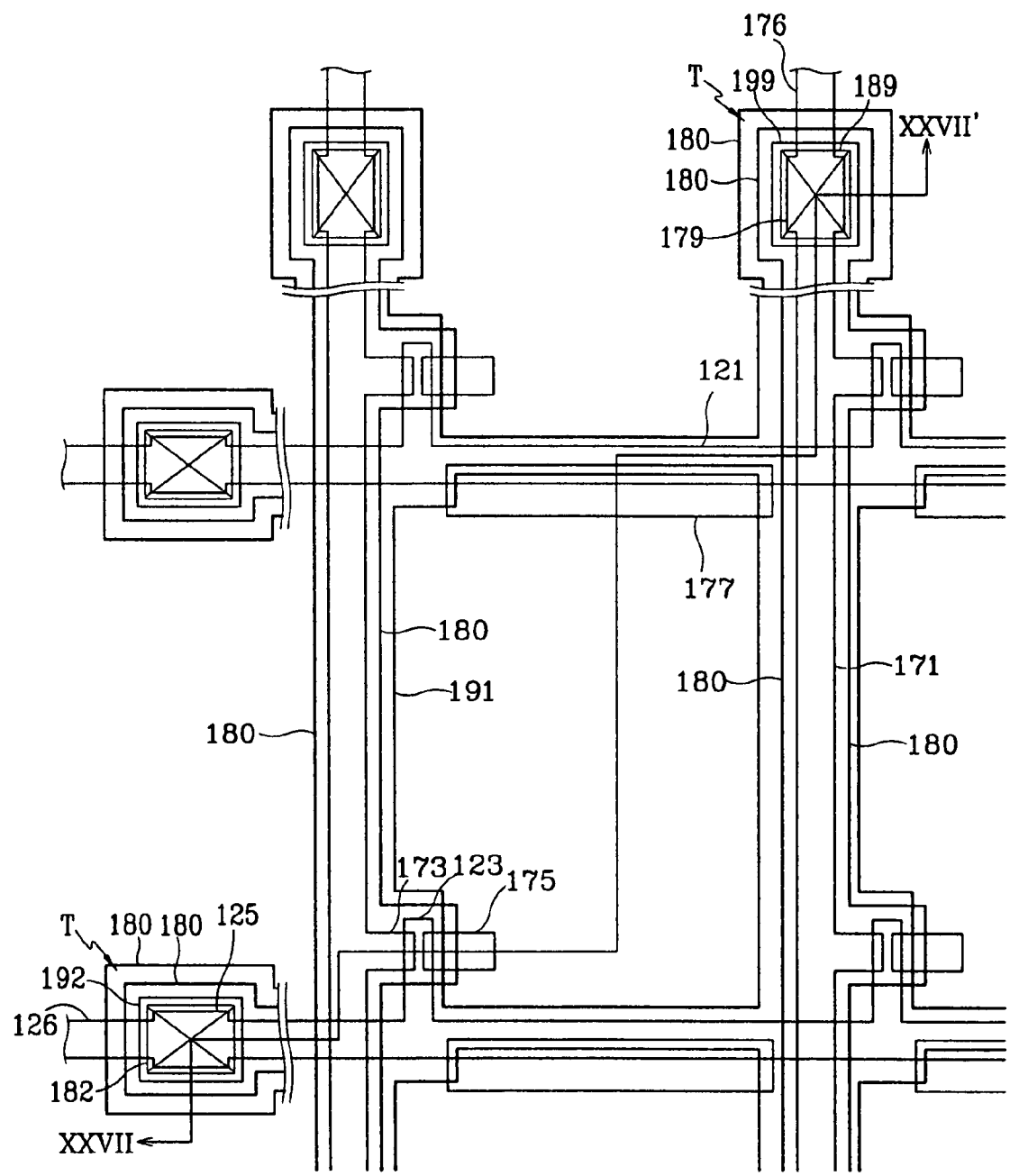
FIG. 26 is a layout view of an exemplary TFT array panel for an LCD according to another embodiment of the present invention.
Figure 27:
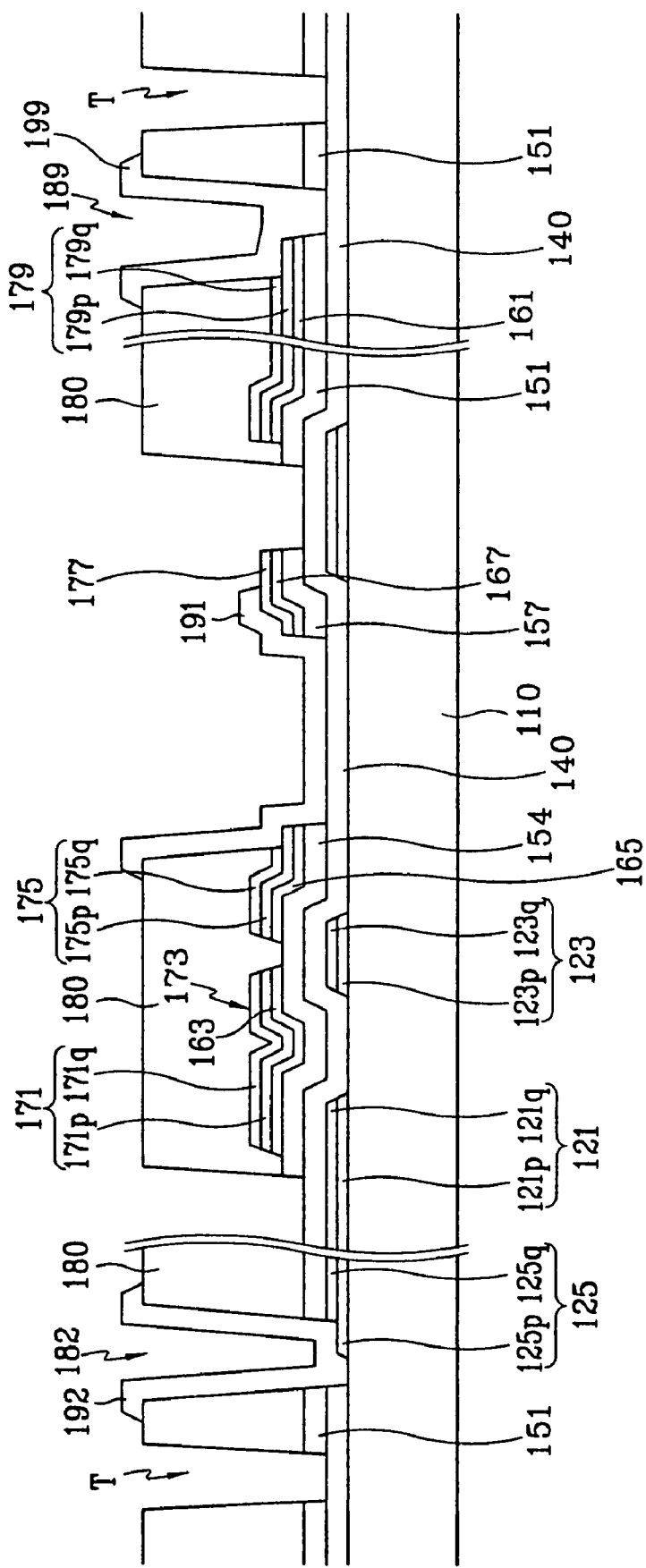
FIG. 27 is a sectional view of the TFT array panel shown in FIG. 26 taken along the line XXVII-XXVII'.

FIG. 26 is a layout view of an exemplary TFT array panel for an LCD according to another embodiment of the present invention, and FIG. 27 is a sectional view of the TFT array panel shown in FIG. 26 taken along the line XXVII-XXVII'.

As shown in FIGS. 26 and 27, a layered structure of a TFT array panel of an LCD according to this embodiment is almost the same as that shown in FIGS. 3 and 4. That is, a plurality of gate lines 121 including a plurality of gate electrodes 123 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173 and a plurality of drain electrodes 175 are formed on the ohmic contacts 161 and 165, and a passivation layer 180 is formed thereon. A plurality of contact holes 182 and 189 exposing expansions 125 and 179 of the gate lines 121 and the data lines 171 are provided at the passivation layer 180 and/or the gate insulating layer 140, and a plurality of pixel electrodes 191 and a plurality of contact assistants 192 and 199 are formed.

Different from the TFT array panel shown in FIGS. 3 and 4, the passivation layer 180 of the TFT array panel according to this embodiment includes a plurality of portions extending along the data lines 171 and a plurality of portions disposed near the expansions 125 of the gate lines 121. The passivation layer 180 covers the data lines 171 including the source electrodes 173 and portions of the drain electrodes 175, while other portions of the drain electrodes 175 and the storage capacitor conductors 177 are not covered with the passivation layer 180.

In addition, as well as the semiconductor stripes 151 and the ohmic contacts 161 and 165, a plurality of semiconductor islands 157 and a plurality of ohmic contacts 167 thereover are provided between the storage conductors 177 and the gate insulating layer 140.

The semiconductor stripes and islands 151 and 157 have almost the same planar shapes as the passivation layer 180 except for portions under the exposed portions of the drain electrodes 175, the expansions 125 of the gate lines 121, expansions 179 of the data lines 171, and the storage capacitor conductors 177. In particular, the semiconductor islands 157, the ohmic contact islands 167 and the storage conductors 177 have substantially the same planar shape. In addition, the ohmic contact stripes and islands 161 and 165 have substantially the same planar shape as the data lines 171 and the drain electrodes 175. The semiconductor stripes 151 and the passivation layer 180 has a plurality of trenches T exposing the gate insulating layer 140 and surrounding expansions 125 and 179 of the gate lines 121 and the data lines 171 for separating the semiconductors 151.

Most portions of the pixel electrodes 191 are disposed directly on the gate insulating layer 140 and some portions of the pixel electrodes 191 are disposed directly on the exposed portions of the drain electrodes 175 and portions of the storage capacitor conductors 177 for electrical connection to the drain electrodes 175 and the storage capacitor conductors 177.

3rd Embodiment Method

Now, a method of manufacturing the TFT array panel shown in FIGS. 26 and 27 according to an embodiment of the present invention will be described in detail with reference to FIGS. 28A-32 as well as FIGS. 26 and 27.

Figure 28A:
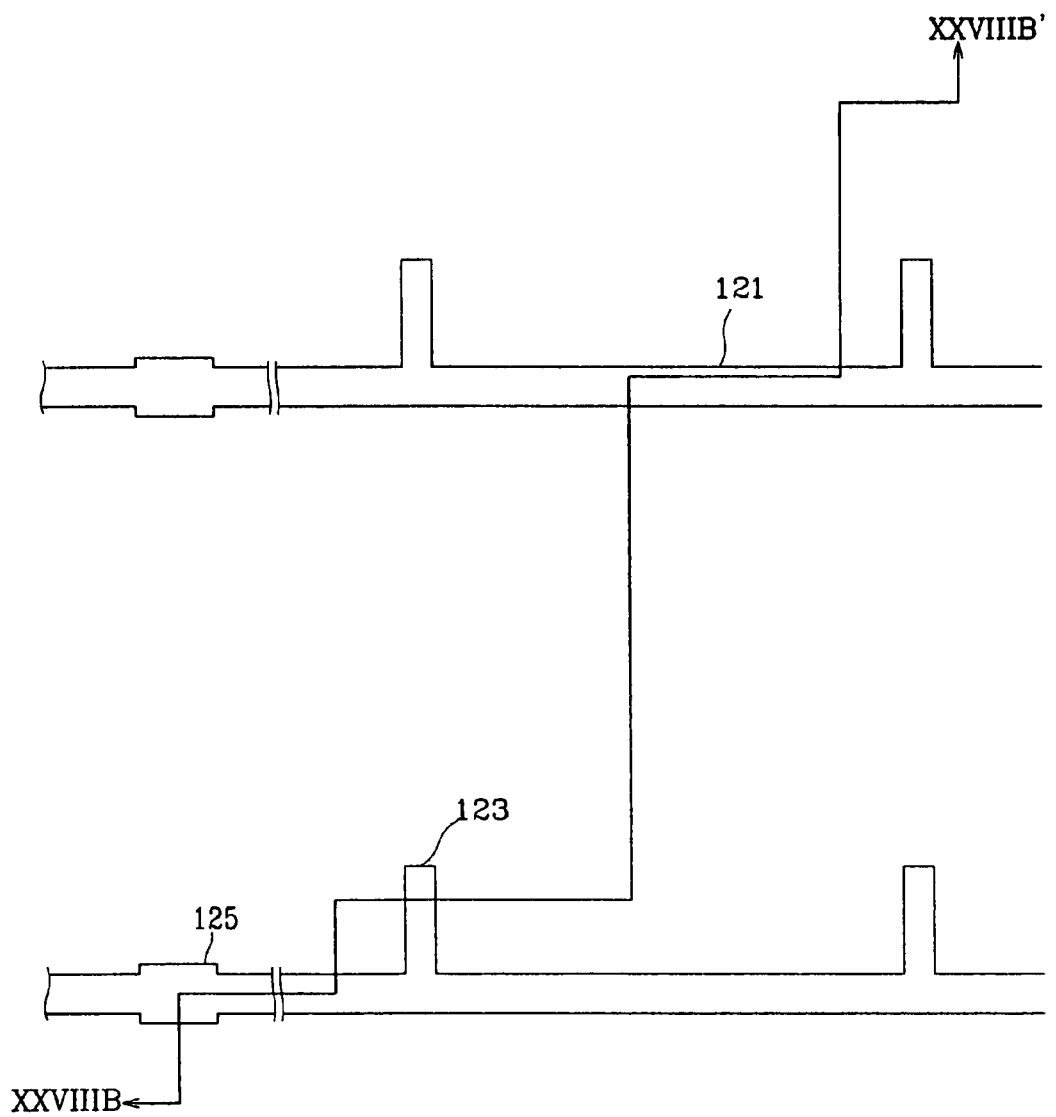
FIGS. 28A, 29A and 30A are layout views of the TFT array panel shown in FIGS. 26 and 27 in intermediate steps of a manufacturing method thereof according to an embodiment of the present invention.
Figure 28B:
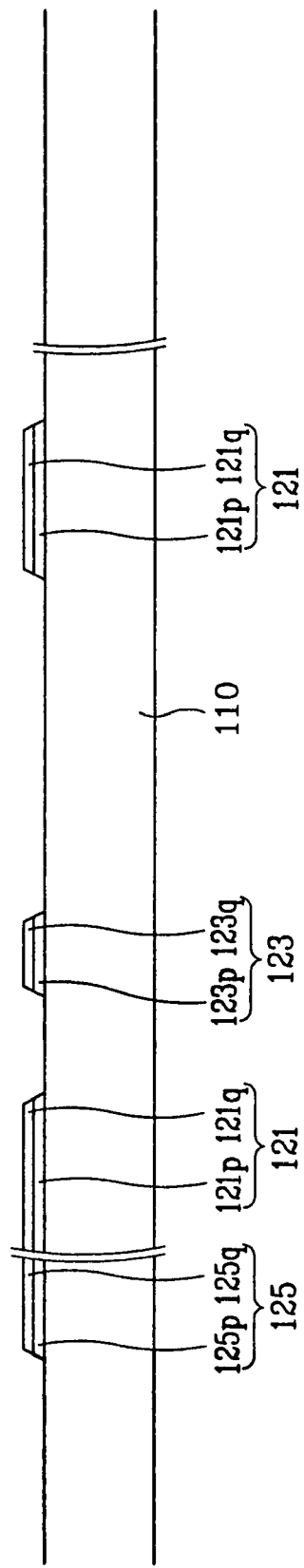
FIGS. 28B, 29B and 30B are sectional views of the TFT array panel shown in FIGS. 28A, 29A and 30A taken along the lines XXVIIIB-XXVIIIB', XXIXB-XXIXB', and XXX-XXX', respectively.
Figure 29A:
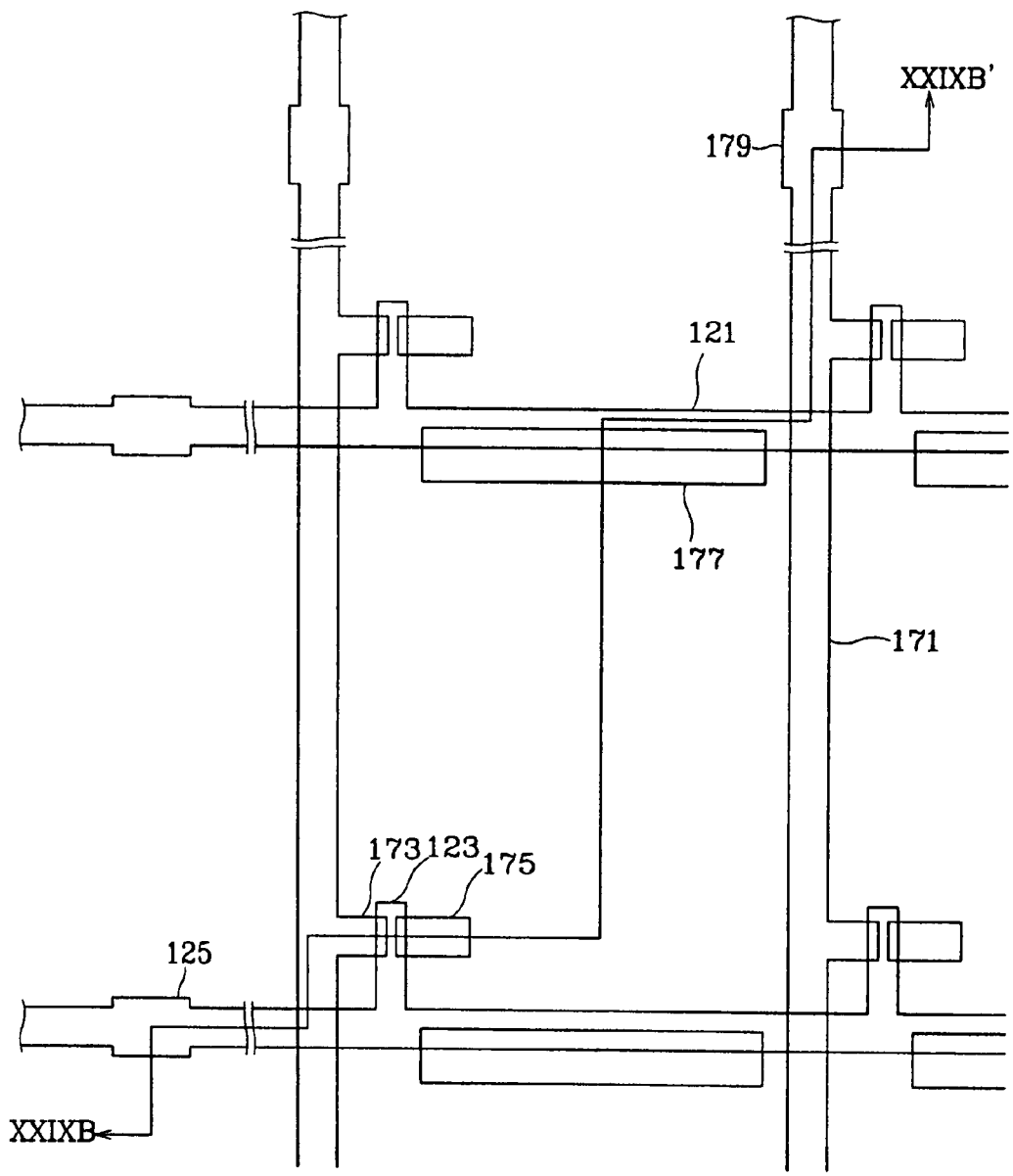
Figure 29B:
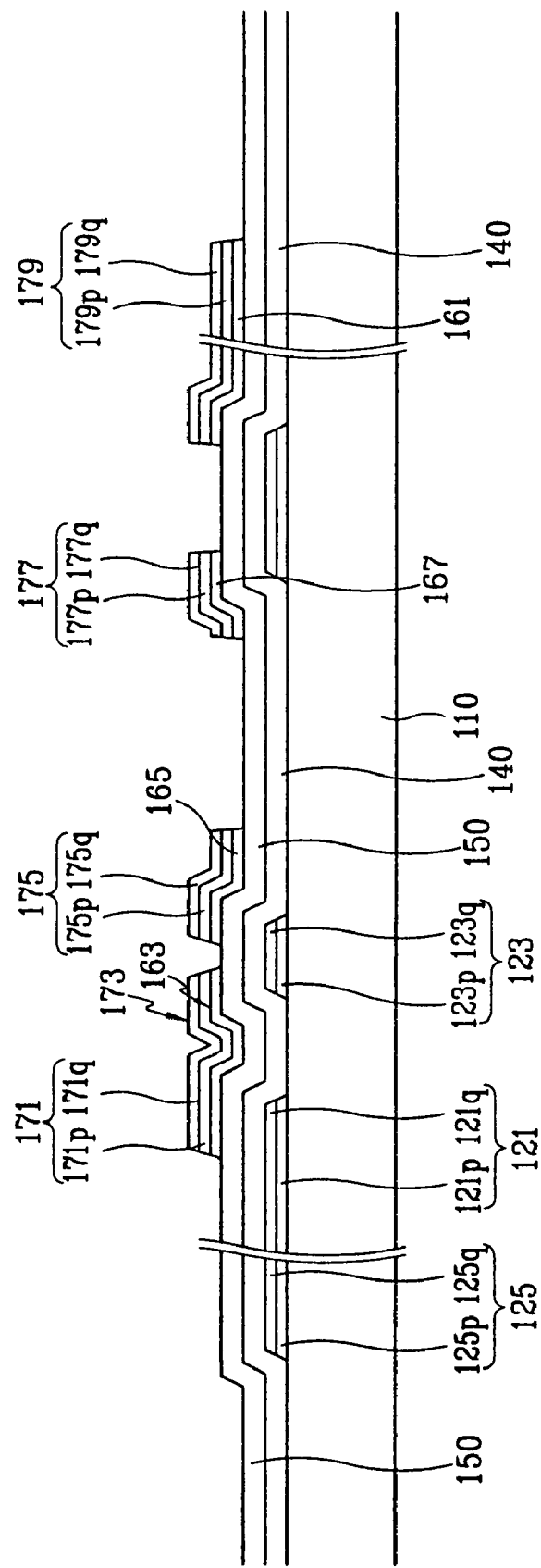
Figure 30A:
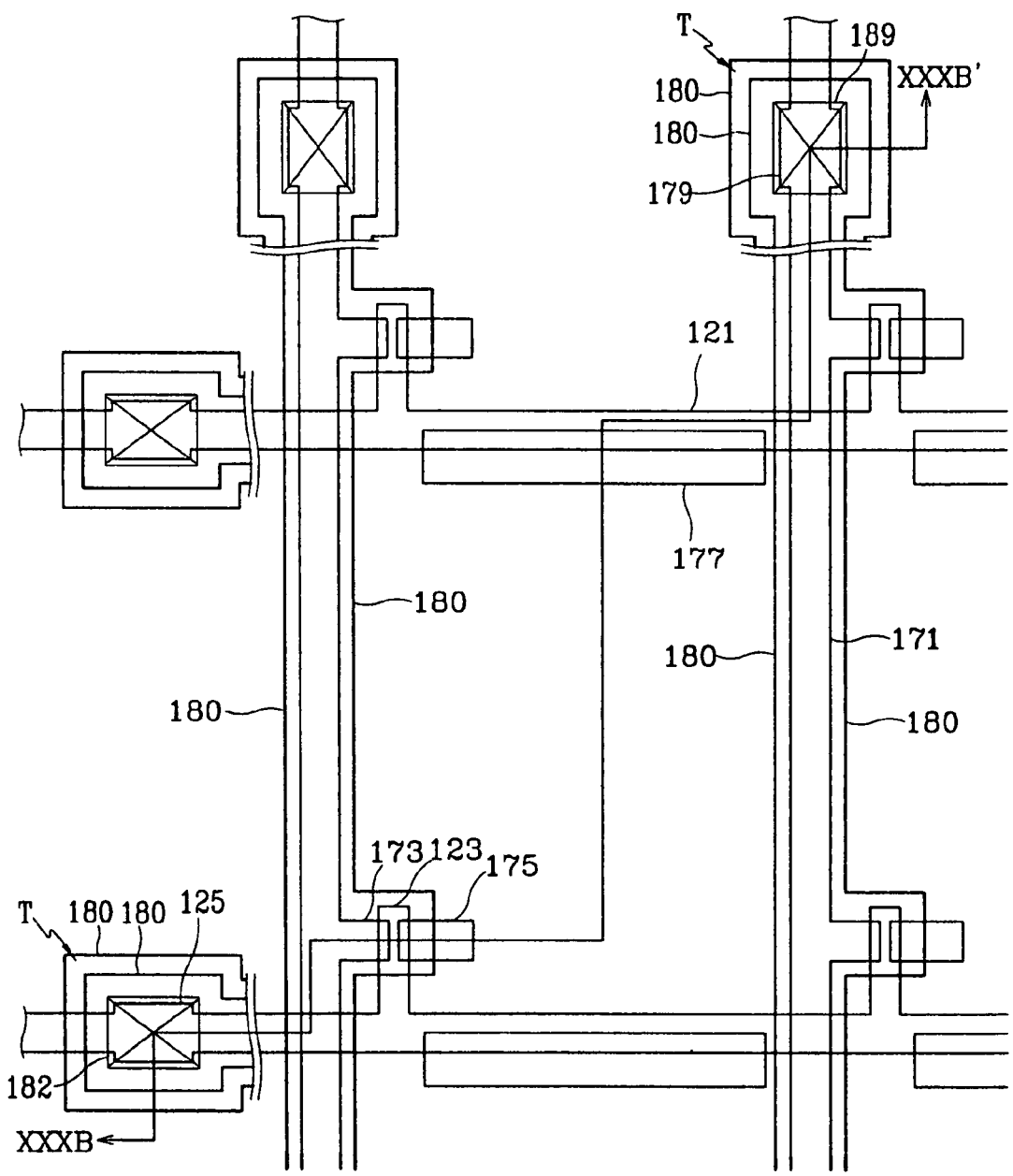
Figure 30B:
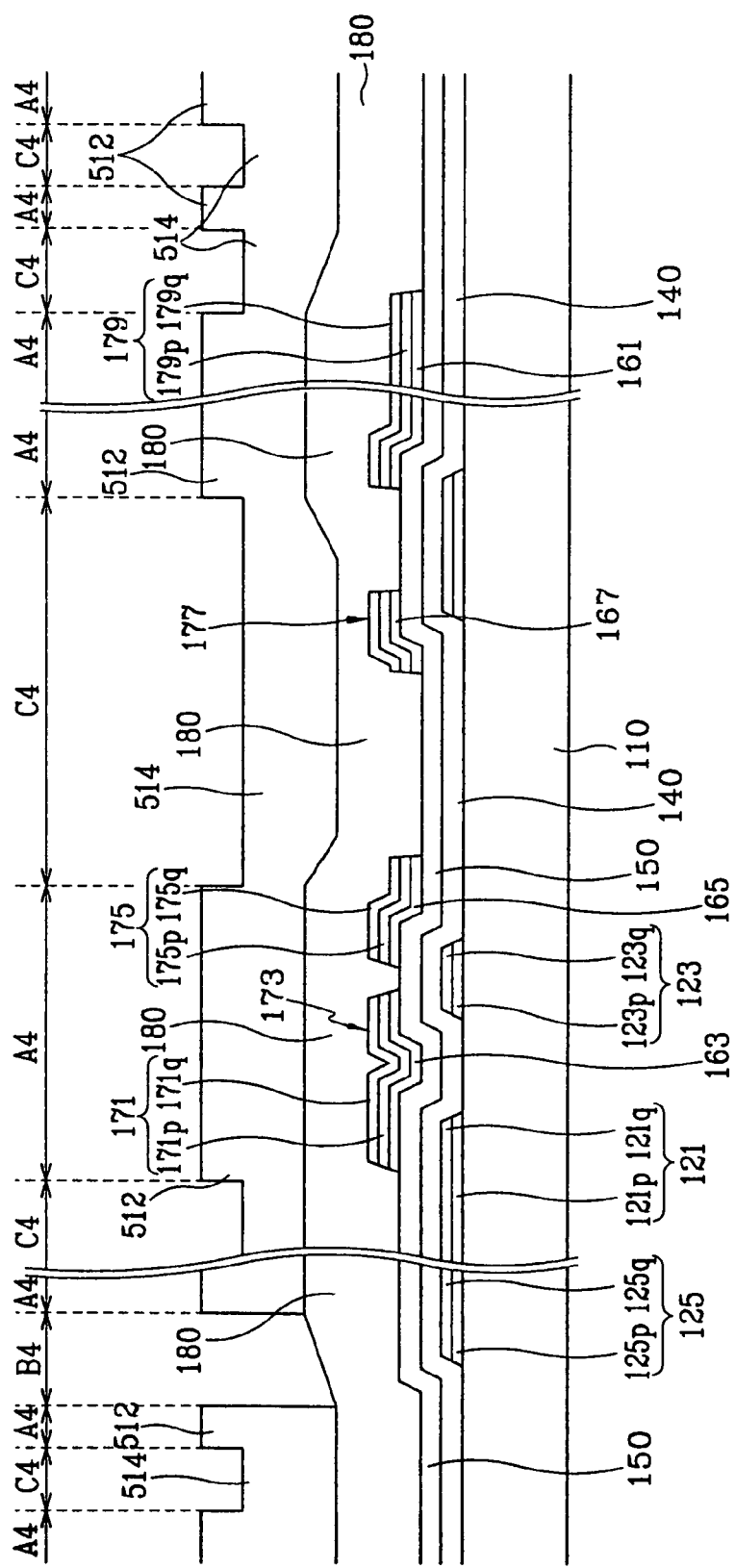
Figure 32:
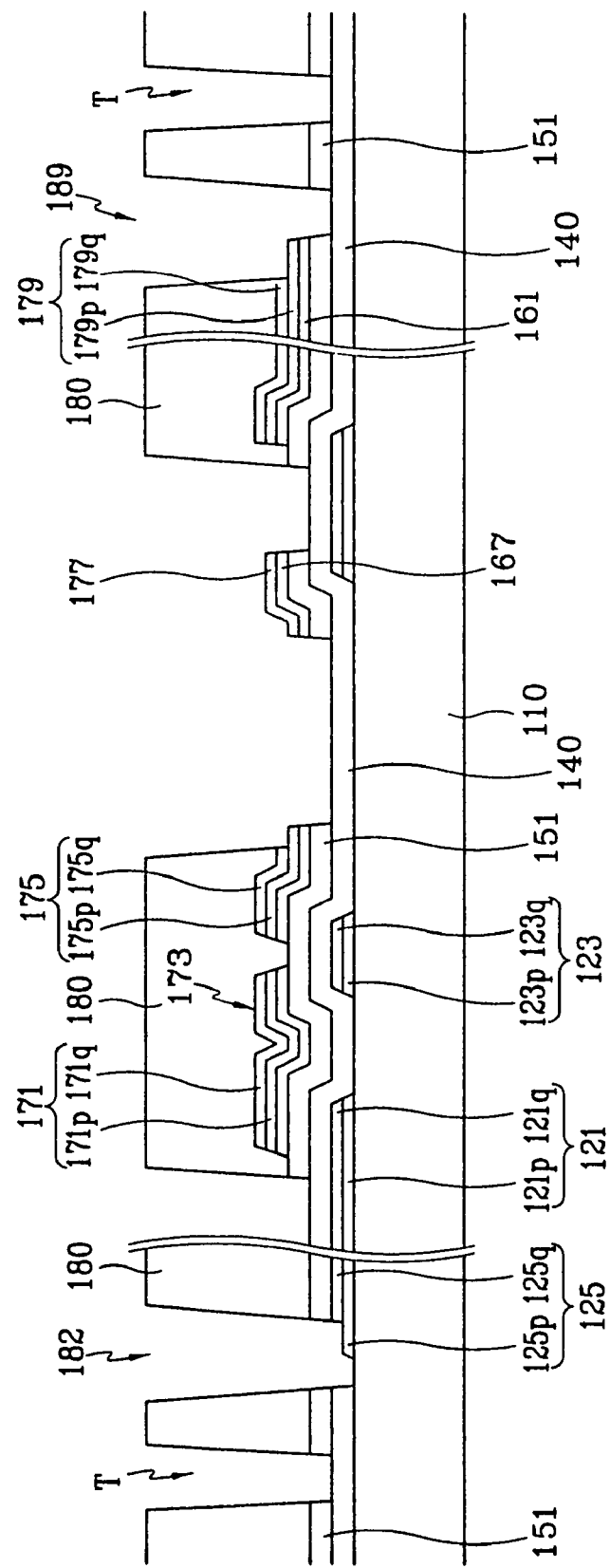

FIGS. 28A, 29A and 30A are layout views of the TFT array panel shown in FIGS. 26 and 27 in intermediate steps of a manufacturing method thereof according to an embodiment of the present invention, and FIGS. 28B, 29B and 30B are sectional views of the TFT array panel shown in FIGS. 28A, 29A and 30A taken along the lines XXVIIIB-XXVIIIB', XXIXB-XXIXB', and XXX-XXX', respectively. FIGS. 31 and 32 are sectional views of the TFT array panel shown in FIG. 30A taken along the line XXXB-XXXB' in the steps of the manufacturing method following the step shown in FIG. 30B.

Referring to FIGS. 28A and 28B, a conductive layer having a thickness of about 1,000-3,000 Å is deposited on a substrate 110 preferably by sputtering and dry or wet etched to form a plurality of gate lines 121 including a plurality of gate electrodes 123 and a gate shorting bar 124.

As shown in FIGS. 29A and 29B, a gate insulating layer 140, an intrinsic a-Si layer 150, and an extrinsic a-Si layer 160 are sequentially deposited by CVD such that the layers 140, 150 and 160 bear thickness of about 1,500-5,000 Å, about 500-1,500 Å and about 300-600 Å, respectively. A conductive layer 170 including a lower film 170p and an upper film 170q having a thickness of about 1,500-3,000 Å is deposited preferably by sputtering and the conductive layer 170 and the extrinsic a-Si layer 160 are patterned to form a plurality of data lines 171 including a plurality of source electrodes 173, a plurality of drain electrodes, a plurality of storage capacitor conductors 177, and a data shorting bar 174 as well as a plurality of ohmic contacts 161, 165 and 167.

As shown in FIGS. 30A and 30B, after depositing a passivation layer 180 having thickness equal to or larger than about 3,000 Å by CVD of silicon nitride or spin-coating of organic insulator, a photoresist film is spin-coated on the passivation layer 180. The photoresist film is exposed to light through an exposure mask (not shown), and developed such that the developed photoresist has a position dependent thickness. The photoresist shown in FIG. 30B includes a plurality of first to third portions with decreased thickness. The first portions in first areas A4 and the second portions in second areas C4 located on the expansions 179 of the data lines 171 and portions of the drain electrodes 175 are indicated by reference numerals 512 and 514, respectively, and no reference numeral is assigned to the third portions in third areas B4 located on the expansions 125 of the gate lines 121 since they have substantially zero thickness to expose underlying portions of the passivation layer 180. The thickness ratio of the second portions 514 to the first portions 512 is adjusted depending upon the process conditions in the subsequent process steps. Portions (not shown) of the photoresist disposed on areas other than the display area and the peripheral area, which are located on portions of the intrinsic s-Si layer 150 to be removed, may have a thickness different from the second portions 514, which can be made by changing width of slits and distance between the slits in an exposure mask.

The different thickness of the photoresist 512 and 514 enables to selectively etch the underlying layers when using suitable process conditions. Therefore, the passivation layer 180 having a plurality of contact holes 182 and 189 and a plurality of trenches T and a plurality of semiconductor stripes and islands 151 and 157 are obtained.

For descriptive purpose, portions on the areas A4 are called first portions, portions of the passivation layer 180, the drain electrodes 175, the data lines 171, the intrinsic a-Si layer 150, and the gate insulating layer 140 on the second areas C4 are called second portions, and portions of the passivation layer 180, the intrinsic a-Si layer 150, the gate insulating layer 140, and the gate lines 121 on the third areas B2 are called third portions.

An exemplary sequence of forming such a structure is as follows:

As shown in FIG. 31, the exposed third portions of the passivation layer 180 and the intrinsic a-Si layer 150 on the third areas B4 are removed by dry etching preferably using a gas mixture of $SF_6$ and $N_2$ or $SF_6$ and HCl and simultaneously, the second portions 514 and the first portions 512 of the photoresist is etched. Although the third portions of the gate insulating layer 140 may be also removed, it is preferable that the second portions of the passivation layer 180 are not exposed by controlling the consuming amount of the photoresist.

The second portions 514 of the photoresist remained on the second areas C4 is removed by ashing preferably using a gas mixture of $N_6$ and $O_2$ or Ar and $O_2$ to completely expose the second portions of the passivation layer 180.

Referring to FIG. 32, the third portions of the gate insulating layer 140 and the second portions of the passivation layer 180 are removed to expose the third portions of the gate lines 121, the storage capacitor conductors 177, the second portions of the drain electrodes 175, the data lines 171, and the intrinsic a-Si layer 150 by etching under the condition that the etching selectivity for the gate insulating layer 140 and the passivation layer 180 with respect to the intrinsic a-Si layer 150 is excellent. Thereafter, the exposed second portions of the intrinsic a-Si layer 150 is removed by etching preferably using a gas mixture of $Cl_2$ and $O_2$ or $SF_6$, HCl, $O_2$ and Ar to complete the semiconductor stripes and islands 171 and 177 and the trenches T.

After removing the photoresist 512 and 514, the third portions of the upper film 125q of the expansions 125 of the gate lines 121 and the second portions of the upper films 175q, 177q and 179q of the drain electrodes 175, the storage capacitor conductors 177, and the expansions 179 of the data lines 171 are removed to expose the underlying lower films 125p, 175p, 177p and 179p.

Finally, as shown in FIGS. 26 and 27, an ITO or IZO layer with a thickness in a range between about 400 Å and about 500 Å is sputtered and photo-etched to form a plurality of pixel electrodes 191, a plurality of contact assistants 192 and 199, and a shorting bar connection 194.

4th Embodiment Structure

A TFT array panel for an LCD according to another embodiment of the present invention will be described in detail with reference to FIGS. 33 and 34.

Figure 33:
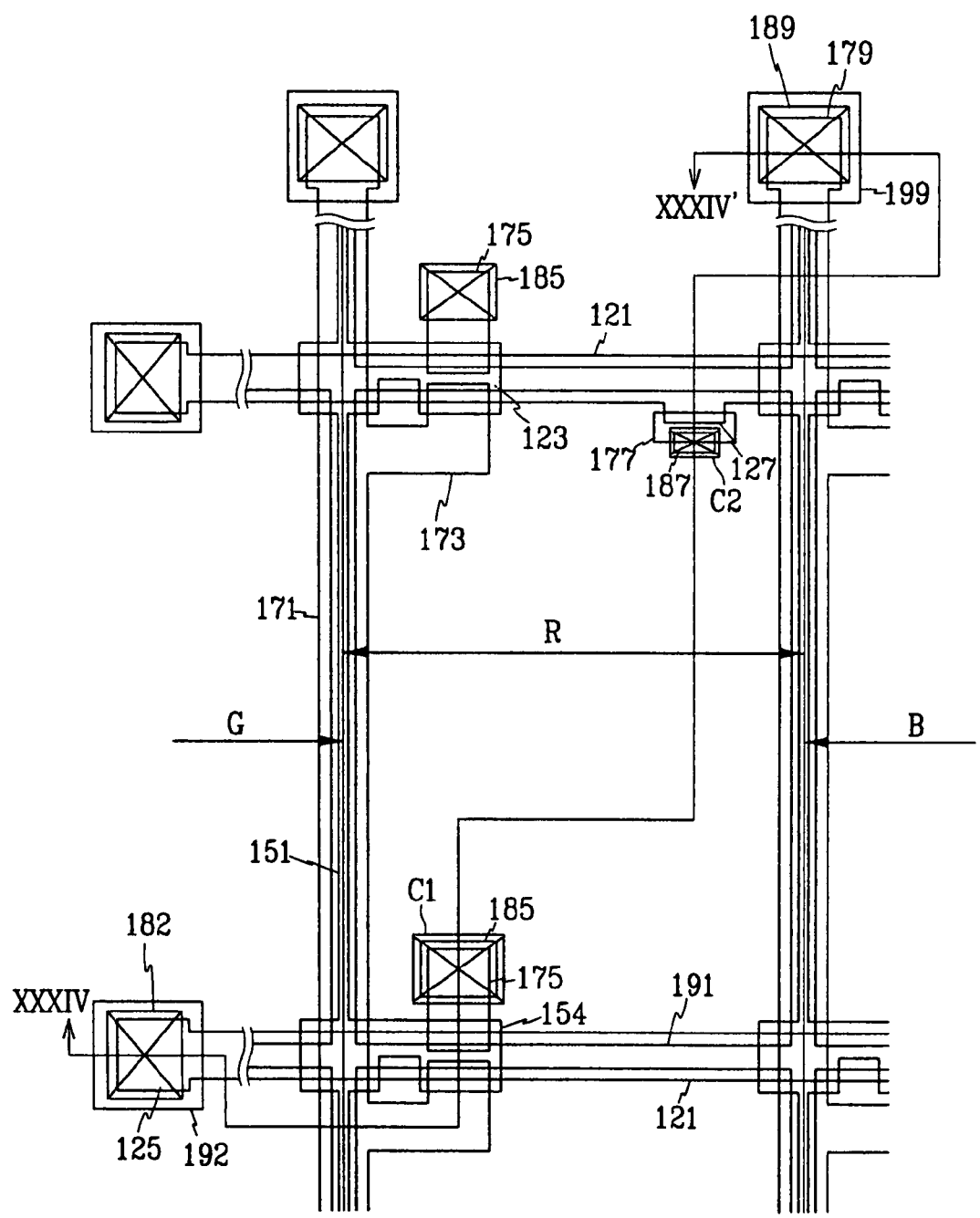
FIG. 33 is a layout view of an exemplary TFT array panel for an LCD according to another embodiment of the present invention.

FIG. 33 is a layout view of an exemplary TFT array panel for an LCD according to another embodiment of the present invention, and FIG. 34 is a sectional view of the TFT array panel shown in FIG. 33 taken along the line XXXIV-XXXIV'.

For simplicity, the extensions 126 and 176 shown in FIG. 3 are omitted.

As shown in FIGS. 33 and 34, a layered structure of a TFT array panel of an LCD according to this embodiment is almost the same as that shown in FIGS. 3 and 4. That is, a plurality of gate lines 121 including a plurality of gate electrodes 123 and a plurality of projections 127 are formed on a substrate 110, and a gate insulating layer 140, a plurality of semiconductor stripes 151 including a plurality of projections 154, and a plurality of ohmic contact stripes 161 including a plurality of projections 163 and a plurality of ohmic contact islands 165 are sequentially formed thereon. A plurality of data lines 171 including a plurality of source electrodes 173, a plurality of drain electrodes 175, and a plurality of storage capacitor conductors 177 are formed on the ohmic contacts 161 and 165 and the gate insulating layer 140, and a passivation layer 180 is formed thereon. A plurality of contact holes 182, 185, 187 and 189 are provided at the passivation layer 180 and/or the gate insulating layer 140, and a plurality of pixel electrodes 191 and a plurality of contact assistants 192 and 199 are formed on the passivation layer 180.

Different from the TFT array panel shown in FIGS. 3 and 4, a plurality of red, green and blue color filters R, G and B are formed under the passivation layer 180. The color filters R, G and B has a plurality of openings C1 and C2 exposing the drain electrodes 175 and the storage capacitor conductors 177. The color filters R, G and B overlap each other to prevent light leakage and the contact holes 185 and 187 are disposed within the openings C1 and C2. Alternatively, the openings C1 and C2 and the contact holes 185 and 187 may have step-wide sidewalls.

Furthermore, the contact holes 182 and 189 exposes portions of expansions 125 and 179 of the gate lines 121 and the data lines 175 instead of exposing all portions of the expansions 125 and 179 such that some portions of a upper film 125q and 179q are remained.

SUMMARY

As described above, the edges of the drain electrodes are exposed with remaining the gate insulating layer under the drain electrodes to prevent the undercut at the signal lines and to smoothing the profiles of the contact portions such that the disconnection of the pixel electrodes is prevented. In addition, the lower film having low contact resistance is exposed to secure the reliability of the contact portions. Furthermore, the upper film having low resistivity is included to improve the quality of the product. Moreover, the manufacturing method is simplified.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A method of manufacturing a thin film transistor array panel, the method comprising:
   forming a gate line on an insulating substrate;
   forming a gate insulating layer;
   forming a semiconductor member;
   forming a data conductive layer including a data line and a drain electrode;
   forming a passivation layer having a contact hole exposing a portion of the drain electrode and a portion of an upper surface of the gate insulating layer near an edge of the drain electrode; and
   forming a pixel electrode connected to the drain electrode through the contact hole,
   wherein the pixel electrode contacts a portion of an upper surface of the drain electrode and a portion of the upper surface of the gate insulating layer near an edge of the drain electrode through the contact hole in the passivation layer.

2. The method of claim 1, wherein at least one of the semiconductor member and the passivation layer is patterned by photolithography using a mask comprising a first area blocking light, a second area for partially transmitting light, and a third area fully transmitting light.

3. The method of claim 2, wherein the photolithography forms a positive photoresist including a first portion on the data line and a first portion of the drain electrode, a second portion on a second portion of the drain electrode, and a third portion on an end portion of the gate line, the second portion of the photoresist is thinner than the first portion of the photoresist, and the third portion of the photoresist is thinner than the second portions of the photoresist.

4. The method of claim 3, wherein the photoresist further comprises a fourth portion on an end portion of the data line and having a thickness smaller than the first portion of the photoresist.

5. The method of claim 4, further comprising:
   performing etching using the photoresist to expose portions of the passivation layer under the second and the fourth portions of the photoresist and a portion of the gate insulating layer under the third portion; and
   removing the exposed portions of the passivation layer and the gate insulating layer to form contact holes exposing the end portions of the gate line and the data line.

6. The method of claim 5, wherein the second area of the mask includes first slits corresponding to the second portion of the photoresist and second slits corresponding to the fourth portion of the photoresist, and the first and the second slits have different width and distance.

7. The method of claim 4, wherein the patterning of at least one of the semiconductor member and the passivation layer by photolithography comprises:
   depositing a semiconductor layer on the gate insulating layer;
   depositing an insulating layer on the data conductive layer;
   forming the photoresist on the insulating layer;
   performing etching using the photoresist to expose portions of the passivation layer under the second and the fourth portions of the photoresist and a portion of the gate insulating layer under the third portion;
   removing the exposed portions of the passivation layer and the gate insulating layer to form contact holes exposing the end portions of the gate line and the data line and to expose portions of the semiconductor layer; and
   removing the exposed portions of the semiconductor layer to form the semiconductor member.

8. The method of claim 7, wherein the semiconductor member comprises a plurality of semiconductor portions separated from each other at positions between adjacent data lines.

9. The method of claim 7, wherein the thin film transistor panel includes a display area where the gate line intersects the data line and a peripheral area where end portions of the gate line and the data line are disposed, the slits include first slits in the display area and in the peripheral area and second slits in a remaining area, and the first and the second slits have different width and distance.

10. The method of claim 1, wherein at least one of the gate line and the data conductive layer comprises a lower film of at least one of Cr, Mo, and Mo alloy and an upper film of at least one of Al and Al alloy.

11. The method of claim 10, wherein the drain electrode comprises the lower film and the upper film and the method further comprises:
    removing the upper film of the at least a portion of the drain electrode before forming the pixel electrode.

12. The method of claim 2, wherein the mask is aligned such that a portion of the second area of the mask overlaps a boundary of the drain electrode.

13. The method of claim 2, wherein the second area of the mask includes one or more slits, and wherein at least one of the slits has a depression.

14. The method of claim 2, wherein the second area of the mask includes one or more slits, and wherein the mask is aligned such that at least two of the slits are disposed out of the drain electrode.

15. The method of claim 2, wherein the second area is provided with one or more slits.

16. The method of claim 15, wherein the one or more slits comprise a plurality of substantially rectilinear slits and a width of each slit and distance between the slits range from about 0.8 to about 2.0 microns.

17. The method of claim 1, wherein at least one of the gate line and the data conductive layer comprises at least one of Cr, Mo, Mo alloy, Al, and Al alloy.

* * * * *